(12) United States Patent
Ooishi et al.

(10) Patent No.: US 6,794,904 B2
(45) Date of Patent: Sep. 21, 2004

(54) SEMICONDUCTOR INTEGRATED CIRCUIT DEVICE INCLUDING LOGIC GATE THAT ATTAINS REDUCTION OF POWER CONSUMPTION AND HIGH-SPEED OPERATION

(75) Inventors: Tsukasa Ooishi, Hyogo (JP); Masatoshi Ishikawa, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 19 days.

(21) Appl. No.: 10/281,951

(22) Filed: Oct. 29, 2002

(65) Prior Publication Data

US 2003/0038653 A1 Feb. 27, 2003

Related U.S. Application Data

(63) Continuation of application No. 09/816,406, filed on Mar. 26, 2001, now Pat. No. 6,483,165, which is a continuation of application No. 09/272,316, filed on Mar. 19, 1999, now Pat. No. 6,292,015.

(30) Foreign Application Priority Data

May 26, 1998 (JP) ............................................ 10-144359
Dec. 8, 1998 (JP) ............................................ 10-348864

(51) Int. Cl.$^7$ .............................................. H01L 25/00
(52) U.S. Cl. ......................... 326/103; 326/101; 326/102
(58) Field of Search ................................ 326/101–103; 257/371, 372

(56) References Cited

U.S. PATENT DOCUMENTS 5,583,457 A    12/1996    Horiguchi et al.
5,659,517 A    8/1997     Arimoto et al.
5,726,946 A    3/1998     Yamagata et al.
5,838,047 A *  11/1998    Yamauchi et al. .......... 257/372
6,218,895 B1 * 4/2001     De et al. ..................... 327/566
6,292,015 B1   9/2001     Ooishi et al.

OTHER PUBLICATIONS

"1–V Power Supply High–Speed Digital Circuit Technology with Multithreshold–Voltage CMOS", by Mutoh et al., Journal of Solid–State Circuits, vol. 30, No. 8 (Aug. 1995), pp. 847–854.

* cited by examiner

Primary Examiner—Anh Q. Tran
(74) Attorney, Agent, or Firm—McDermott Will & Emery LLP

(57) ABSTRACT

A semiconductor integrated circuit device has a hierarchical power supply system for a logic circuit. Inverters are provided with power supply from a main power supply line and a sub-power supply line of a higher potential and a main ground line and a sub-ground line of a lower potential. An internal power supply voltage-down converter is placed to set the voltage of the main power supply line higher than a normal operation voltage of the higher potential. An internal supply voltage boosting circuit is placed to set the voltage of the main ground line lower than a normal operation voltage of the lower potential. When respective power supply lines are short-circuited by a switching transistor, the voltage of each power supply line can be maintained at an operation supply voltage.

13 Claims, 67 Drawing Sheets

CONDITIONS FOR SIMULATION

| Vdd=1.35V(1.5×0.9) ExtVcc=2.25V(2.5×0.9) TEMPERATURE=120°C | |
|---|---|
| SUPPLY LINE | MAIN SUPPLY LINE/MAIN GROUND LINE : ALUMINUM 10 μm<br>SUB-SUPPLY LINE/SUB-GROUND LINE : ALUMINUM 5 μm |
| SWITCHING TRANSISTOR | Vthp/Vthn=-0.59/0.39<br>Lp/Ln=0.25/0.25<br>Wp/Wn=1000/500 |
| INVERTER | Vthp/Vthn=-0.17/0.20<br>Lp/Ln=0.25/0.25<br>Wp/Wn=20/10 |

US 6,794,904 B2

SEMICONDUCTOR INTEGRATED CIRCUIT DEVICE INCLUDING LOGIC GATE THAT ATTAINS REDUCTION OF POWER CONSUMPTION AND HIGH-SPEED OPERATION

This application is a continuation of U.S. patent application Ser. No. 09/816,406, filed Mar. 26, 2001 now U.S. Pat. No. 6,483,165, which is a continuation of U.S. patent application Ser. No. 09/272,316, filed Mar. 19, 1999, now U.S. Pat. No. 6,292,015.

BACKGROUND OF THE INVENTION

1. Field of the Invention

The present invention relates to semiconductor integrated circuit devices, and more particularly to a configuration for achieving reduction of current consumption as well as high-speed operation of a semiconductor integrated circuit device including a logic gate constituted of a CMOS transistor.

2. Description of the Background Art

In the field of semiconductors, enhancement of integration and reduction of supply voltage are being promoted nowadays.

Since MOS transistors constituting an internal circuit have threshold voltage, the threshold voltage should be made smaller in order to secure a high-speed operation. However, a problem of a dramatic increase in the leakage current arises if the threshold voltage is decreased.

One scheme for solving this problem is a hierarchical power supply system. The hierarchical power supply system employed in a conventional semiconductor integrated circuit device will be described using FIG. 67.

In FIG. 67, a plurality of stages of CMOS inverters X1, X2, X3 . . . connected in cascade are shown as forming one example of an internal circuit.

CMOS inverters X1, X2 and X3 each include a PMOS transistor and an NMOS transistor. A main supply line L1, a sub-supply line L2, a main ground line L3 and a sub-ground line L4 for applying an operation supply voltage are arranged for inverters X1–X3.

A switching transistor T1 is placed between main supply line L1 and sub-supply line L2. Between main ground line L3 and sub-ground line L4, a switching transistor T2 is arranged.

Switching transistor T1 is brought to a conducting state in response to a hierarchical power supply control signal /φc to electrically connect main supply line L1 and sub-supply line L2.

Switching transistor T2 is brought to the conducting state in response to a hierarchical power supply control signal φc to electrically connect main ground line L3 and sub-ground line L4.

One operation supply node (a node receiving a higher potential) of inverters at the odd number stages X1, . . . each is connected to sub-supply line L2, and the other operation supply node (a node receiving a lower potential) is connected to main ground line L3.

One operation supply node (a node receiving a higher potential) of inverters at the even number stages X2, . . . each is connected to main supply line L1, and the other operation supply node (a node receiving a lower potential) is connected to sub-supply line L4.

Supply potential is applied to main supply line L1. Ground potential is applied to main ground line L3. Voltage of main supply line L1 is referred to as voltage Vcc, voltage of sub-supply line L2 is referred to as voltage SubVcc, voltage of main ground line L3 is referred to as voltage Vss, and voltage of sub-ground line L4 is referred to as voltage SubVss.

Referring to FIGS. 68 and 69, an operation of the conventional hierarchical power supply system shown in FIG. 67 is hereinafter described.

FIG. 68 illustrates a timing chart showing variation of supply potential in the conventional hierarchical power supply system shown in FIG. 67, and FIG. 69 is provided for describing voltage conditions of respective inverters X1, . . . in a standby cycle.

As shown in FIG. 69, inverters X1, . . . each include a PMOS transistor P1 and an NMOS transistor N1.

An input signal IN which is brought to an H level and an L level respectively in the standby cycle and an activate cycle is input to the internal circuit illustrated in FIG. 69. In the standby cycle, control signal φc is set at the L level. Accordingly, switching transistors T1 and T2 are in OFF state in the standby cycle. In the active cycle, control signal φc is set at the H level.

Upon transition from the active cycle to the standby cycle (at time t0 and t2 of FIG. 68), voltage SubVcc of sub-supply line L2 gradually decreases from the voltage Vcc level of main supply line L1 due to the load capacitor. On the other hand, voltage SubVss of sub-ground line L4 gradually changes to a higher level from voltage (ground supply voltage) Vss of main ground line L3 due to the load capacitor.

Upon transition from the standby cycle to the active cycle (at time t1 of FIG. 68), control signal φc attains the H level. Accordingly, switching transistors T1 and T2 are brought to ON state. Voltage SubVcc of sub-supply line L2 is charged to the voltage Vcc level of main supply line L1. Voltage SubVss of sub-ground line L4 approaches to the voltage Vss level of main ground line L3.

Referring to FIG. 69, in the standby cycle, inverter X2 receives a signal of ground supply voltage Vss which is an inverted one of input signal IN. Accordingly, in inverter X2, PMOS transistor P1 attains ON state, and a connection node between PMOS transistor P1 and NMOS transistor N1 is set at voltage Vcc level of main supply line L1. Since NMOS transistor N1 receives voltage SubVcc of sub-ground line L4 higher than ground supply voltage Vss, the gate voltage becomes smaller than the source voltage. The leakage current in inverter X2 is thus restricted.

Inverter X3 receives a signal of voltage Vcc of main supply line L1. Accordingly, NMOS transistor N1 is brought to ON state, and a connection node between PMOS transistor P1 and NMOS transistor N1 is set at voltage Vss of main ground line L3. Since PMOS transistor P1 receives voltage SubVcc of sub-supply line L2 lower than voltage Vcc of main supply line L1, the gate voltage becomes higher than the source voltage. Accordingly, the leakage current in inverter X3 is restricted.

However, in the conventional hierarchical power supply system, as shown in FIG. 68, at the instant of transition from the standby cycle to the active cycle, switching transistors T1 and T2 are brought into ON state to cause a sudden voltage change of sub-supply line L2 and sub-ground line L4 (referred to as voltage drop).

Further, when switching transistor T1 and T2 attain ON state, the junction capacitance thereof causes voltage SubVcc of sub-supply line L2 to become a level slightly lower than voltage Vcc of main supply line L1 and causes voltage SubVss of sub-ground line L4 to keep a level slightly higher than voltage Vss of main ground line L3.

If the internal circuit operates in this state, a problem arises that an operation feature satisfying a desired condition cannot be obtained and it takes time to define an output from the internal circuit.

In addition, current consumption of a semiconductor integrated circuit device should be effectively decreased according to an operation timing.

SUMMARY OF THE INVENTION

The present invention provides a semiconductor integrated circuit device that can operate with low current consumption and at a high-speed.

The invention further provides a semiconductor integrated circuit device that can operate with low current consumption and at a high-speed according to an operation mode.

The present invention further provides a semiconductor integrated circuit device that can monitor the leakage current to adjust current consumption using the result of the monitoring.

A semiconductor integrated circuit device according to one aspect of the present invention includes a main supply line, a sub-supply line, a coupling circuit for electrically coupling the main supply line and the sub-supply line in an active cycle and for electrically uncoupling the main supply line and the sub-supply line in a standby cycle, a logic circuit having a first logic gate operating with voltage on the main supply line as an operation supply voltage, applying a prescribed logical processing based on a supplied input and outputting a resultant one, and having a second logic gate operating with voltage on the sub-supply line as an operation supply voltage, applying a prescribed logical processing based on a supplied input and outputting a resultant one, and a voltage control circuit for controlling voltage on the main supply line to apply to the logic circuit a prescribed operation supply voltage required for ensuring the operation of the logic circuit in the active cycle.

It is therefore a principal advantage in the above aspect of the present invention to be able to reduce the leakage current in the standby cycle by employing the hierarchical power supply system to control supply voltage applied to the logic circuit. An operation speed of the logic in the active cycle can be prevented from being decreased by securing an operation supply voltage in the active cycle. Further, generation of the voltage drop can be restricted by controlling voltage on each supply line.

In particular, the leakage current in the standby cycle can be reduced and an operation supply voltage in the active cycle can be secured by adjusting voltage on a supply line that applies a higher operation supply potential.

In particular, the leakage current in the standby cycle can be decreased and an operation supply voltage in the active cycle can be secured by adjusting voltage on a supply line that applies a lower operation supply potential.

In particular, the leakage current in the standby cycle can be reduced and an operation supply voltage in the active cycle can be secured by adjusting voltage on supply lines that apply a higher operation supply potential and a lower operation supply potential respectively.

In particular, current consumption of the entire circuit can be reduced by independently controlling voltage on a supply line in the standby cycle and that in the active cycle.

In particular, at least one switching transistor is provided for short-circuiting supply lines. Resistance of the supply lines can thus be decreased.

In particular, at least one circuit for setting voltage of the sub-supply line at voltage of the main supply line in the active cycle is provided as a coupling circuit for short-circuiting the supply lines. Accordingly, the voltage drop generated when the supply lines are short-circuited can be prevented. In addition, the processing speed of the logic circuit can be improved.

In particular, diode-connected transistors are placed between supply lines. Then the potential difference between the main supply line and the sub-supply line can be restricted below a fixed value.

In particular, control timing of the voltage of the supply line in the hierarchical power supply system is changed according to an operation mode. Accordingly, current consumption of an internal circuit which operates immediately after activation of the chip and an internal circuit which thereafter operates can be decreased independently.

In particular, the voltage of the supply line in the hierarchical power supply system can be controlled according to an operation mode. The potential of the main supply line and the sub-supply line can thus be controlled according to an operation mode.

In particular, the leakage current in the hierarchical power supply system can be monitored according to a test mode.

The leakage current flowing through the switching transistor of the hierarchical power supply system in the standby cycle can be reduced by applying negative bias to the gate electrode of the switching transistor in the standby cycle. Further, bias control with at least three values prevents raise of substrate voltage occurring with charging/discharging of the gate electrode of the switching transistor, resulting in increase in operable range of the memory cell.

A semiconductor integrated circuit device according to another aspect of the present invention includes a main supply line, a sub-supply line, a coupling circuit for electrically coupling the main supply line and the sub-supply line in an active cycle and electrically uncoupling the main supply line and the sub-supply line in a standby cycle, a logic circuit having a first logic gate operating with voltage on the main supply line as an operation supply voltage, applying a prescribed logical processing based on a supplied input and outputting a resultant one, and having a second logic gate operating with voltage on the sub-supply line as an operation supply voltage, applying a prescribed logical processing based on a supplied input and outputting a resultant one, and a monitor circuit for monitoring the leakage current in the logic circuit.

A principal advantage of the above aspect of the present invention is accordingly that the leakage current in the hierarchical power supply system can be externally monitored.

A semiconductor integrated circuit device according to still another aspect of the present invention includes a semiconductor substrate having a main surface, a main supply line and a sub-supply line extending separately on the main surface of the semiconductor substrate, a coupling circuit electrically coupling the main supply line and the sub-supply line in an active cycle and electrically uncoupling the main supply line and the sub-supply line in a standby cycle, a logic circuit having a first logic gate operating with voltage of the main supply line as an operation supply voltage and applying a prescribed logical processing based on a supplied input to output a resultant one, and having a second logic gate operating with voltage of the sub-supply line as an operation supply voltage and applying a prescribed logical processing based on a supplied input to output a resultant one, a first impurity region formed in the semiconductor substrate to be electrically connected to a portion of at least one of the main supply line and the sub-supply line extending between the coupling circuit and the logic circuit, and a second impurity region formed in the semiconductor substrate to form pn junction between the first impurity region and itself.

A principal advantage in the above aspect of the invention is that a junction capacitance can be produced by the pn junction formed by the first and second impurity regions. The potential of at least one of the main and sub-supply lines can thus be fixed to reduce drop in the power supply occurring with the circuit operation. The drop in the power supply can further be reduced by arranging a number of such junction capacitances at different places. An active region of the logic gate portion is surely formed by arranging the first impurity region next to the region where the first and second logic gates are formed.

The first and second impurity regions are constructed to form the junction capacitance. Accordingly, potential of at least one of the main and sub-supply lines can be fixed, resulting in reduction in the drop of the power supply occurring with the circuit operation.

The junction capacitance refers to the one between potentials of the same value and with different phases. The potential can be fixed more effectively by fixing both ends of the junction capacitance with the same potentials having different noise phases.

The junction capacitance refers to the one between the impurity region electrically connected to the main supply line and the impurity region electrically connected to the sub-supply line. The potential can be fixed more effectively since the potentials of the main and sub-supply lines can be fixed by the junction capacitance.

The junction capacitance refers to the one between an impurity region receiving Vcc potential and an impurity region receiving Vss potential. The Vcc potential and the Vss potential can be fixed by the junction capacitance and the potential can be more effectively fixed accordingly.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS (First Embodiment)

A semiconductor integrated circuit device according to the first embodiment of the present invention will be described below. The first embodiment of the invention provides a semiconductor integrated circuit device that accomplishes low current consumption and a high-speed operation. A synchronous semiconductor memory device as an example of the semiconductor integrated circuit device is described referring to FIG. 1.

Figure 1:
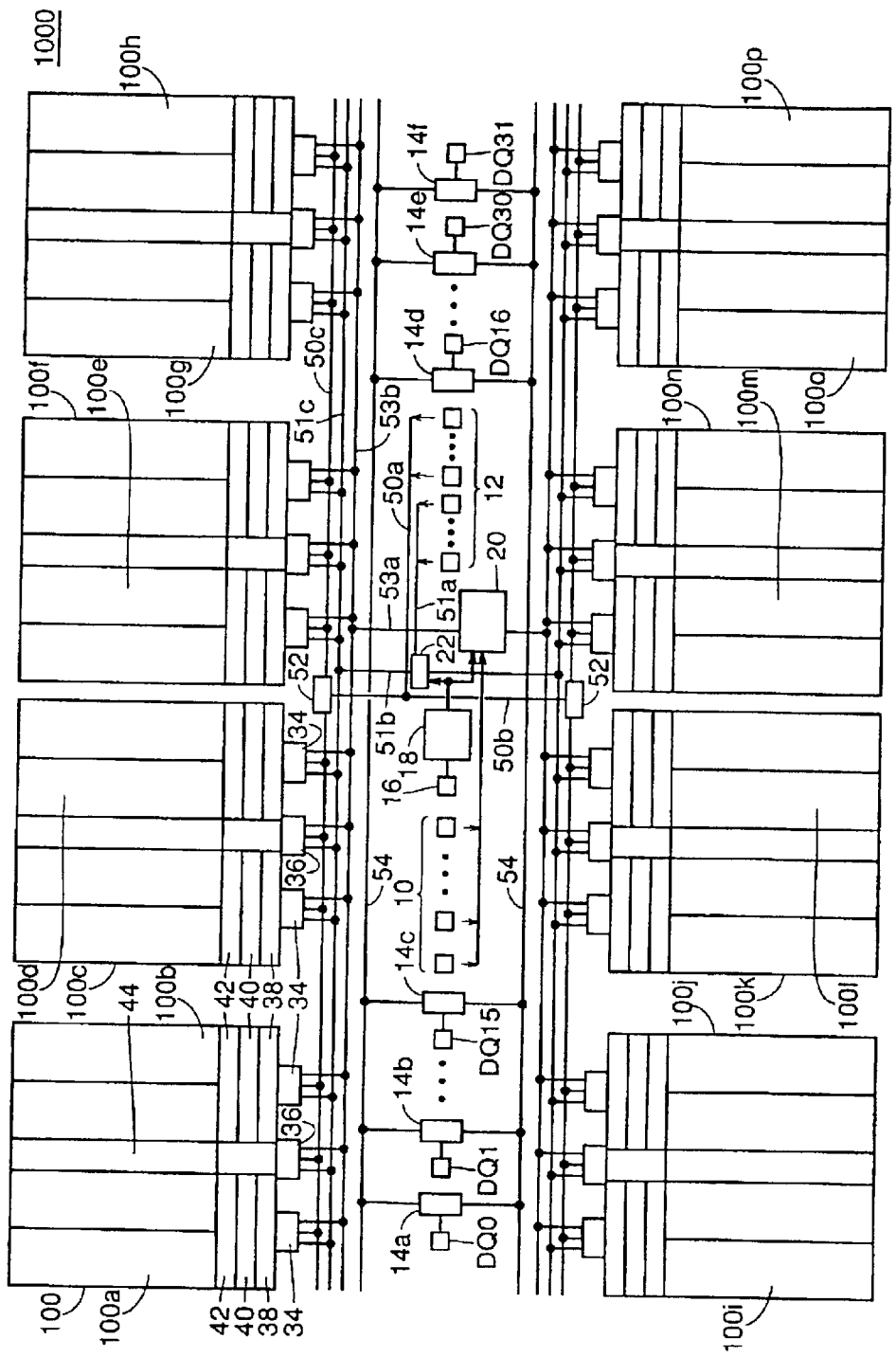
FIG. 1 is a schematic block diagram showing a configuration of a semiconductor memory device 1000 of the first embodiment of the present invention.

With reference to FIG. 1, a synchronous semiconductor memory device 1000 includes a control circuit 20 which receives external control signals /RAS, /CAS, /W, /CS and the like externally supplied via a group of external control signal input terminals 10, decodes those signals and generates internal control signals, command data buses 53a and 53b which transmit the internal control signals supplied from control circuit 20, and a memory cell array 100 in which memory cells are arranged in rows and columns.

Memory cell array 100 is divided into total 16 memory cell blocks 100a–100p placed as shown in FIG. 1. For example, if the storage capacity of synchronous semiconductor memory device 1000 is 1 G bits, each memory cell block has a capacity of 64 M bits. Each block has a structure which enables it to operate independently as a bank.

Synchronous Semiconductor memory device 1000 further includes an internal synchronous signal generation circuit 18 which receives an external clock signal CLK supplied to a clock signal input terminal 16, starts a synchronous operation under control by control circuit 20, and outputs an internal clock signal int.CLK.

Internal synchronous signal generation circuit 18 generates internal clock signal int.CLK which is synchronized with external clock signal CLK by a delayed locked loop circuit (hereinafter referred to as DLL circuit) or the like.

External address signals A0–Ai (i is a natural number) supplied via a group of address signal input terminals 12 are taken into synchronous semiconductor memory device 1000 in synchronization with internal clock signal int.CLK under control by control circuit 20.

Data of a prescribed number of bits of external address signals A0–Ai are supplied to a bank decoder 22 via an address bus 51a. Decoded bank addresses B0–B7 are transmitted to respective banks from bank decoder 22 via address buses 51b and 51c.

Other external address signals supplied to group of address signal input terminals 12 are transmitted to an address driver 52 via address buses 50a and 50b. The address signals are further transmitted from address driver 52 to each bank (memory cell block) via an address bus 50c.

Synchronous semiconductor memory device 1000 further includes a row predecoder 36 provided to each pair of memory cell blocks which latches a row address transmitted by address bus 50c and predecodes it under control by control circuit 20, a row decoder 44 which selects a corresponding row (word line) of a memory cell block selected according to an output from row predecoder 36, a column predecoder 34 provided to each memory cell block, latching a column address transmitted by address bus 50c and predecoding it under control by control circuit 20, a column predecoder line 40 which transmits an output from predecoder 34, and a column decoder 42 which selects a corresponding column (bit line pair) of a memory cell block selected according to an output from column predecoder line 40.

Synchronous semiconductor memory device 1000 still further includes data input terminals DQ0–DQ15 and DQ16–DQ31 placed respectively on the outside of a region along the longitudinal direction of a central section of the chip where group of external control signal input terminals 10 and group of address signal input terminals 12 are placed, input/output buffer circuits 14a–14f provided respectively to data input/output terminals DQ0–DQ31, a data bus 54 which transmits data between the input/output buffer circuits and a corresponding memory block, and a read/write amplifiers 38 provided to corresponding one of memory cell blocks 100a–100p which communicates data between data bus 54 and a selected memory cell column.

Signal /RAS supplied to group of external control signal input terminals 10 is a row address strobe signal which starts an internal operation of synchronous semiconductor memory device 1000 and determines an active period of the internal operation. In response to activation of signal /RAS, a circuit related to an operation of selecting a row of memory cell array 100 such as row decoder 44 is set into an active state.

Signal /CAS supplied to group of external control signal input terminals 10 is a column address strobe signal that sets a circuit selecting a column in memory cell array 100 into the active state.

Signal /CS supplied to group of external control signal input terminals 10 is a chip select signal showing that synchronous semiconductor memory device 1000 is to be selected, and signal /W is a signal which instructs a writing operation of synchronous semiconductor memory device 1000.

An operation of taking signals /CS, /RAS, /CAS and /W is executed in synchronization with internal clock signal int.CLK.

In synchronization with internal dock signal int.CLK, address signals supplied to address signal input terminal group 12 are taken, and data is communicated via data input/output terminals DQ0–DQ31.

A configuration will be described using FIG. 2 for distributing internal clock signal int.CLK to input terminals of group of external control signal input terminals 10 and to the data input terminals DQ0–DQ15 respectively in synchronous semiconductor memory device 1000 shown in FIG. 1.

Figure 2:
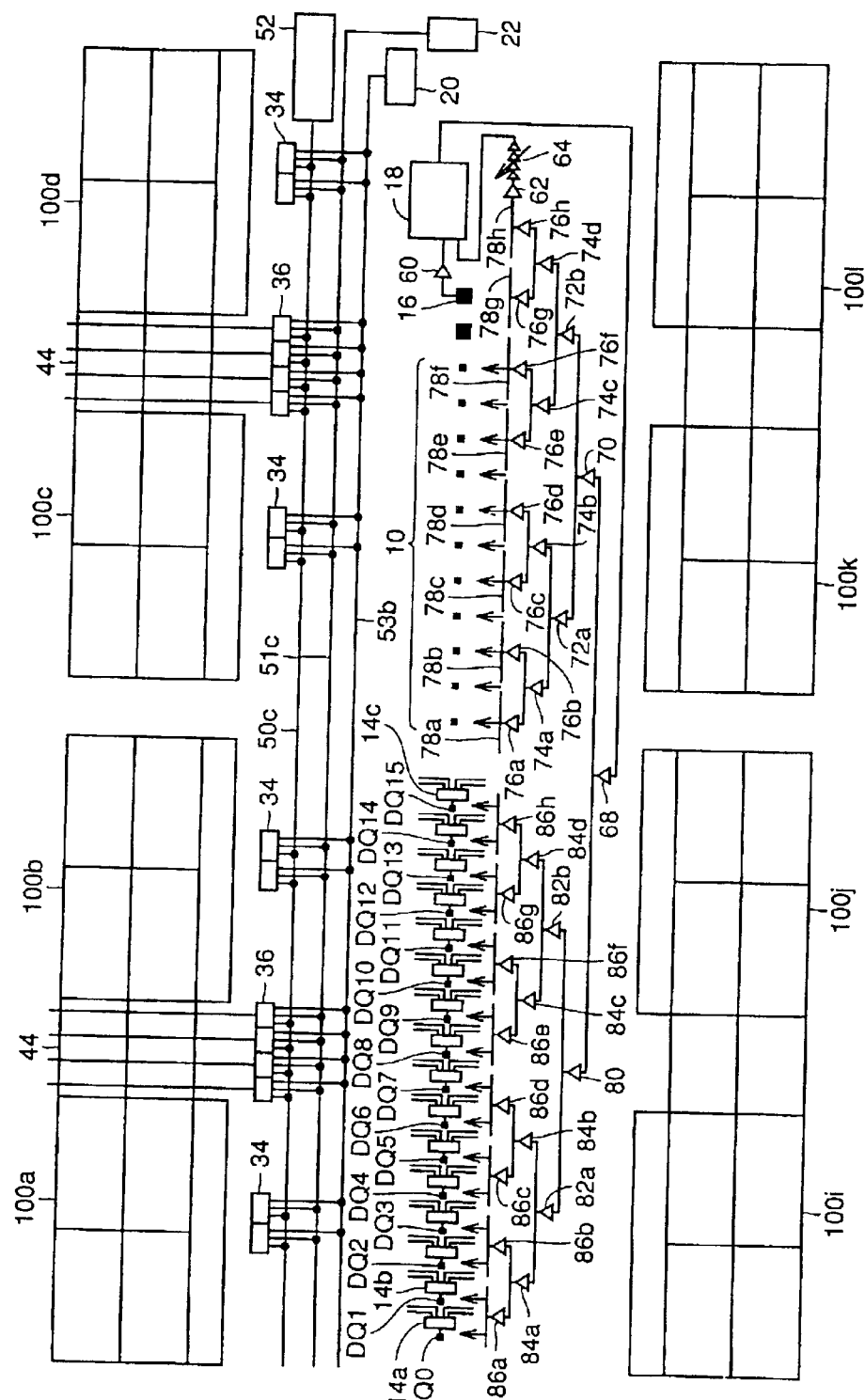
FIG. 2 shows a concept of a configuration for distributing an internal clock signal int.CLK in semiconductor memory device 1000.

Referring to FIG. 2, external clock signal CLK supplied to clock signal input terminal 16 is supplied to internal synchronous signal generation circuit 18 via a buffer circuit 60.

Internal clock signal int.CLK output from internal synchronous signal generation circuit 18 is first supplied to a buffer circuit 68. An output from buffer circuit 68 is divided into two, one is supplied to a buffer circuit 70 and the other to a buffer circuit 80 respectively.

An output from buffer circuit 70 is further divided into two to be supplied to buffer circuits 72a and 72b respectively.

An output from buffer circuit 72a is further divided into two to be supplied to buffer circuits 74a and 74b respectively.

An output from buffer circuit 72b is also divided into two to be supplied to buffer circuits 74c and 74d respectively.

Outputs from buffer circuits 74a, 74b, 74c and 74d are further divided into two respectively to be supplied spread to buffer circuits 76a and 76b, buffer circuits 76c and 76d, buffer circuits 76e and 76f and buffer circuits 76g and 76h.

In other words, an output from buffer circuit 70 is divided into two successively into 8 clock signals in the end. The 8 clock signals are respectively supplied to interconnection lines 78a–78h. In synchronization with clock signals supplied from respective ends of interconnections 78a–78h, external control signals are taken from group of external control signal input terminals 10.

A clock signal from an end of interconnection line 78h is supplied to internal synchronous signal generation circuit 18 via a replica buffer circuit 62 and a delay adjustment circuit 64. Internal synchronous signal generation circuit 18 synchronizes phases of an output from delay adjustment circuit 64 and of external clock signal CLK supplied from buffer circuit 60, and generates internal clock signal int.CLK.

If there is no delay adjustment circuit 64, the phase of external clock signal CLK supplied to buffer circuit 60 and that of the clock signal on interconnection line 78h supplied to replica buffer circuit 62 are adjusted to be the same since buffer circuit 60 and replica buffer circuit 62 have a similar structure. The clock signal on interconnection line 78h and those clock signals on other interconnection lines 78a–78g also have the same phase.

Consequently, external control signals are taken in synchronization with external clock signal CLK.

The reason why delay adjustment circuit 64 is provided is that the amplitude level as well as the ratio of the active duration of external clock signal CLK to its period (duty ratio) are different from a those of internal clock signal int.CLK, and therefore adjustment is necessary.

Although the configuration for distributing internal clock signal int.CLK to group of external control signal input terminals 10 is described above, a similar configuration is provided to group of data input/output terminals DQ0–DQ15 as shown in FIG. 2.

Specifically, the other one of the outputs from buffer circuit 68 is supplied to buffer circuit 80 to be divided into two, and the divided ones are successively divided into two and ultimately divided into those outputs of buffer circuits 86a–86h. In synchronization with internal clock signals output from buffer circuits 86a–86h, data is externally supplied to or from group of data input/output terminals DQ0–DQ15.

Similarly, although the configuration for distributing internal clock signal int.CLK to group of external control signal input terminals 10 and group of data input/output terminals DQ0–DQ15 is described above in relation to FIG. 2, a similar configuration is provided to group of address signal input terminals 12 and group of data input/output terminals DQ16–DQ31. Those configurations enable address signals to be taken or enable data signals to be supplied or received in synchronization with external clock signal CLK.

Figure 3:
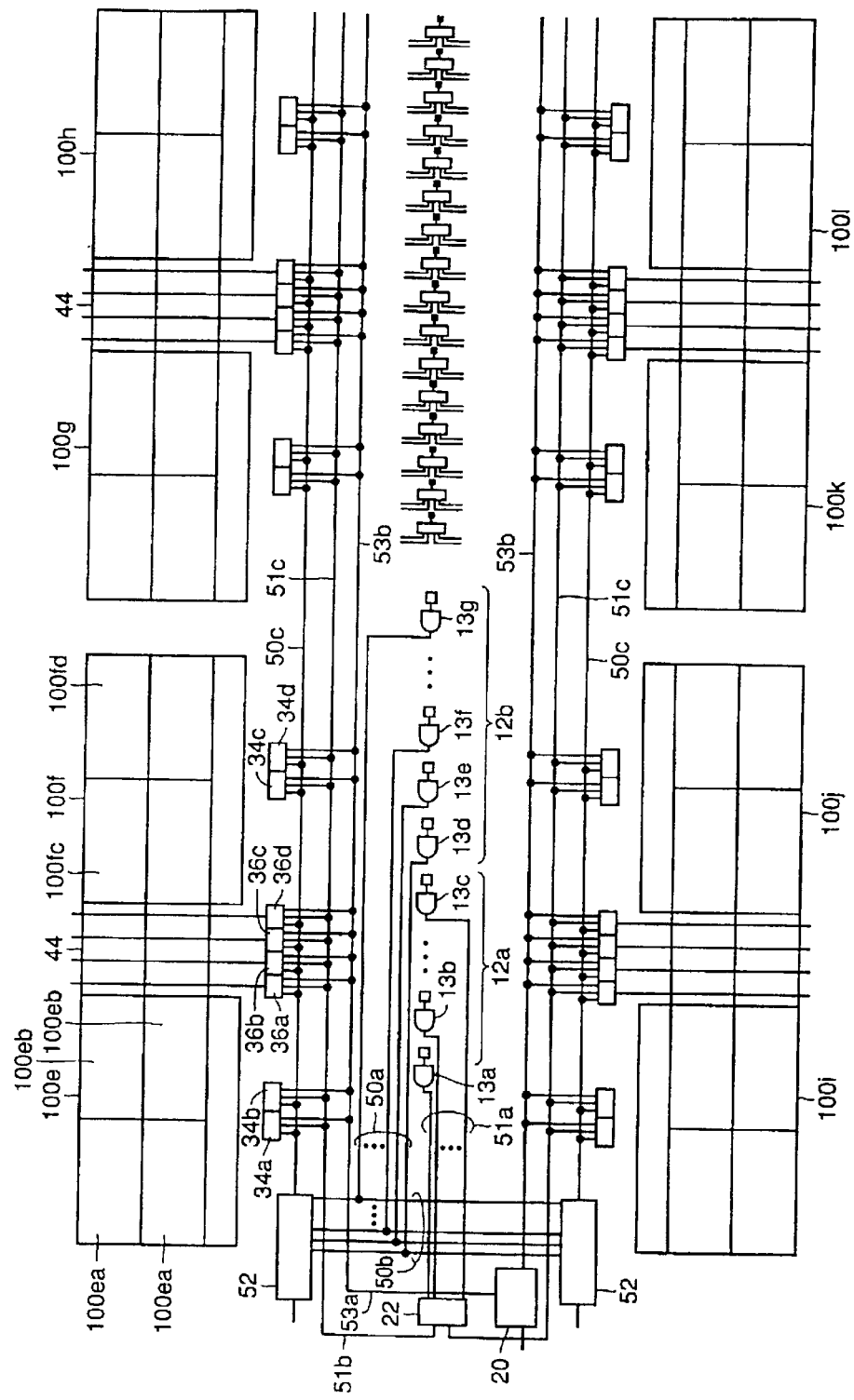
FIG. 3 is a schematic block diagram showing a configuration of an address bus and a command data bus in semiconductor memory device 1000.

Using FIG. 3, the structure of group of address signal input terminals 12, address buses 50a, 50b, 50c, 51a, 51b and 51c, and command data buses 53a and 53b in the structure of synchronous semiconductor memory device 1000 shown in FIG. 1 is described hereinafter.

Data of the higher order bits of address signals supplied to a group of address signal input terminals 12a in group of address signal input terminals 12 are output to bank address bus 51a respectively by input buffers 13a–13c which operate in synchronization with internal clock signal int.CLK Receiving data from bank address bus 51a, bank decoder 22 transmits decoded signals to respective memory cell blocks (banks) via bank address buses 51b and 51c.

Data of the lower order bits of address signals supplied to a group of address signal input terminals 12b in group of address signal input terminals 12 are supplied to address driver 52 respectively by input buffers 13*d*–13*g* which operate in synchronization with internal clock signal int.CLK via address data buses 50*a* and 50*b*. Address driver 52 transmits address signals to respective banks (memory cell blocks) via address data bus 50*c*.

Control circuit 20 receives command data supplied to group of control signal input terminals 10, decodes them, and transmits the decoded command data to respective memory cell blocks (banks) via command data buses 53*a* and 53*b*.

One of those banks, for example memory cell block 100*e* is further divided into memory cell sub-blocks 100*ea* and 100*eb*.

Among row predecoders 36, a row predecoder 36*a* corresponds to memory cell sub-blocks 100*ea* and a row predecoder 36*b* corresponds to memory cell sub-blocks 100*eb*. Row predecoder 36*a* detects that bank 100*e* is selected according to a bank address transmitted by bank address bus 51*c*, is activated when it detects that a row-related operation is instructed by command data bus 53*b* to take address data from address data bus 50*c* and take command data from command data bus 53*b* respectively. Accordingly, row predecoder 36*a* outputs a predecoded address signal to row decoder 44. Row predecoders 36*b*–36*d* operate similarly.

Among column predecoders 34, a column predecoder 34*a* corresponding to memory cell sub-block 100*ea* takes corresponding address data from address data bus 50*c* when it detects that memory cell block 100*e* is selected according to a bank address transmitted by bank address bus 51*c* and a column-related operation is activated by command data bus 53*b*.

Column predecoder 34*a* predecodes the received column address data, and outputs a predecoded column address signal for corresponding column predecoder line 40.

The hierarchical power supply system according to the first embodiment of the invention will be described using FIG. 4. The hierarchical power supply system according to the first embodiment of the invention is used for a column-related circuit, a row-related circuit and the like.

Figure 4:
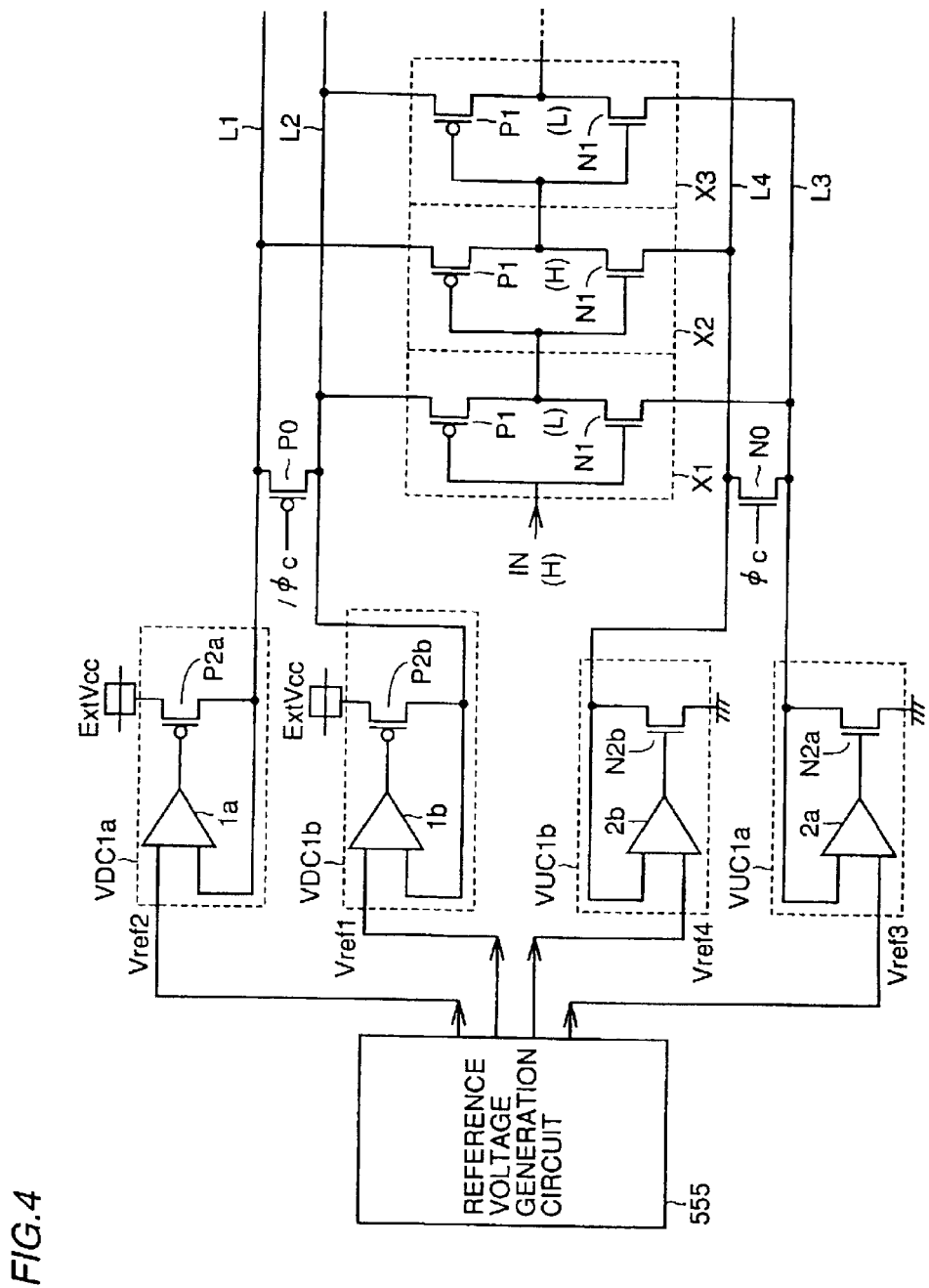
FIG. 4 shows a hierarchical power supply system of a semiconductor integrated circuit device according to the first embodiment of the invention.

FIG. 4 illustrates inverters X1, X2 and X3 representatively as forming a structure of an internal circuit. Inverters X1, X2 and X3 each have a PMOS transistor P1 and an NMOS transistor N1 and has a structure of a CMOS inverter. The threshold values of PMOS transistor P1 and NMOS transistor N1 are low.

In order to apply an operation supply voltage to inverters X1–X3, a main supply line L1, a sub-supply line L2, a main ground line L3 and a sub-ground line L4 are provided.

Inverters X1 and X3 are connected between sub-supply line L2 and main ground line L3. Inverter X2 is connected between main supply line L1 and sub-ground line L4.

Between main supply line L1 and sub-supply line L2, a switching transistor P0 which electrically connects main supply line L1 and sub-supply line L2 in response to a hierarchical power supply control signal /φc is provided. Further, between main ground line L3 and sub-ground line L4, a switching transistor N0 which electrically connects main ground line L3 and sub-ground line L4 in response to a hierarchical power supply control signal φc is provided. Hierarchical power supply control signals φc and /φc are in the reverse phase relation to each other, and control signal φc is in an active state at an H level in an active cycle.

For main supply line L1, an internal supply voltage-down converter VDC1*a* which generates a potential down-converted from the level of external supply voltage ExtVcc to a fixed potential is placed For sub-supply line L2, an internal supply voltage-down converter VDC1*b* which generates a potential down-converted from the level of external supply voltage ExtVcc level to a fixed potential is provided.

For main ground line L3, an internal supply voltage boosting circuit VUC1*a* which generates a potential raised from the level of external ground potential ExtVss to a fixed potential is placed. For sub-ground line L4, an internal supply voltage boosting circuit VUC1*b* which generates the potential raised placed from the level of external ground potential ExtVss to a fixed potential is placed.

Internal supply voltage-down converters VDC1*a* and VDC1*b* will be described below. Internal voltage-down converter VDC1*a* includes a differential amplifier 1*a* and a PMOS transistor P2*a*. PMOS transistor P2*a* has one conduction terminal connected to external supply voltage ExtVcc and has the other conduction terminal connected to main supply line L1. The gate electrode of PMOS transistor P2*a* receives an output from differential amplifier 1*a*. Differential amplifier 1*a* receives at its input reference voltage Vref2 and voltage Vcc of main supply line L1.

Internal supply voltage-down converter VDC1*b* includes a differential amplifier 1*b* and a PMOS transistor P2*b*. One conduction terminal of PMOS transistor P2*b* is connected to external supply voltage ExtVcc, and the other conduction terminal is connected to sub-supply line L2. The gate electrode of PMOS transistor P2*b* receives an output from differential amplifier 1*b*. Differential amplifier 1*b* receives at its input reference voltage Vref1 and voltage SubVcc of sub-supply line L2.

Internal supply voltage boosting circuits VUC1*a* and VUC1*b* will be described hereinafter. Internal supply voltage boosting circuit VUC1*a* includes a differential amplifier 2*a* and an NMOS transistor N2*a*. One conduction terminal of NMOS transistor N2*a* is connected to ground potential (ExtVss), and the other conduction terminal is connected to main ground line L3. The gate electrode of NMOS transistor N2*a* receives an output from differential amplifier 2*a*. Differential amplifier 2*a* receives at its input reference voltage Vref3 and voltage Vss of main ground line L3.

Internal supply voltage boosting circuit VUC1*b* includes a differential amplifier 2*b* and an NMOS transistor N2*b*. NMOS transistor N2*b* has one conduction terminal connected to ground potential (ExtVss) and has the other conduction terminal connected to sub-ground line L4. The gate electrode of NMOS transistor N2*b* receives an output from differential amplifier 2*b*. Differential amplifier 2*b* receives at its input reference voltage Vref4 and voltage SubVss of sub-ground line L4.

Reference voltage Vref1, Vref2, Vref3 and Vref4 is adjusted in a reference voltage generation circuit 555 which is an internal circuit.

Figure 5:
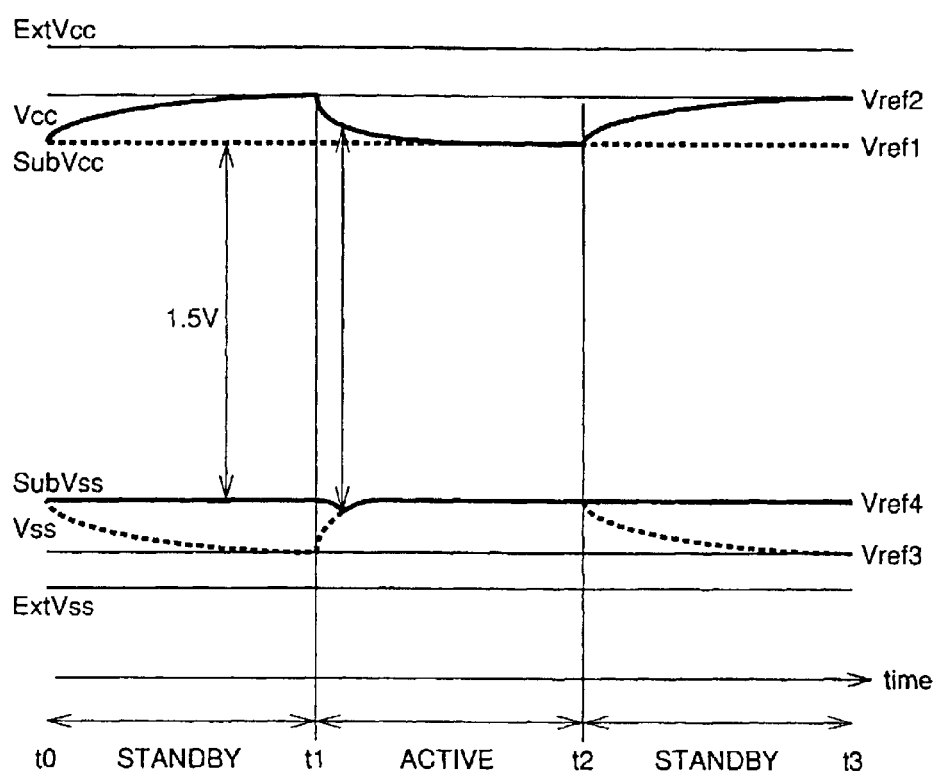
FIG. 5 is a timing chart provided for describing an operation of the hierarchical power supply system illustrated in FIG. 4.

Using the timing chart of FIG. 5, an operation of the hierarchical power supply system shown in FIG. 4 is described.

In the standby cycle (time t0–t1 and t2–t3), hierarchical power supply control signal φc is set at an L level. In this state, switching transistors P0 and N0 are in OFF state. Main supply line L1 and sub-supply line L2 are in a cutoff state. Main ground line L3 and sub-ground line L4 are also in the cutoff state. An input signal IN to inverter X1 is at an H level.

When an internal operation voltage is assumed to be 1.5V relative to external supply voltage ExtVcc of 2.5 V, voltage Vcc of main supply line L1 is higher than 1.5V, and voltage SubVcc of sub-supply line L2 is set at approximately 1.5V. (Reference voltage Vref1 and reference voltage Vref2 is adjusted.)

As a result, the gate voltage (voltage Vcc) of PMOS transistor P1 (inverter X3) connected to sub-supply line L2 is higher than the source voltage (voltage SubVcc) thereof. The relatively negative bias is applied to the gate electrode to decrease the leakage current. Adjustment of reference voltage Vref1 and Vref2 determines the leakage current in the standby cycle.

Similarly, when the internal operation voltage is assumed to be 0.5V relative to external ground potential ExtVss of 0 V, voltage Vss of main ground line L3 is lower than 0.5V and potential SubVss of sub-ground line L4 is set at 0.5V.

In NMOS transistor N1 (inverter X2) connected to sub-ground line L4, the source voltage (SubVss) is higher than the gate voltage (main ground voltage Vss). Consequently, the relatively negative bias is applied to the gate electrode to decrease the leakage current. The leakage current is determined by adjusting reference voltage Vref3 and Vref4.

In the transition from the standby cycle to the active cycle (time t1), hierarchical power supply control signal φc is set at the H level. Switching transistors P0 and N0 attain ON state. Main supply line L1 and sub-supply line L2 are short-circuited. The voltage levels of main supply line L1 and sub-supply line L2 are respectively controlled by corresponding internal supply voltage-down converters VDC1a and VDC1b, so that generation of the voltage drop can be restricted.

Main ground line L3 and sub-ground line L4 are similarly short-circuited. However, the voltage levels thereof are respectively controlled by corresponding internal supply voltage boosting circuits VUC1a and VUC1b so that generation of the voltage drop can be restricted.

The voltage level of each supply line is higher than a prescribed set value determined by the internal supply voltage (assumed to be 1.5V in the first embodiment), which leads to prevention of decrease of an operation speed of the logic in the active cycle.

(Second Embodiment)

A semiconductor integrated circuit device according to the second embodiment of the invention is hereinafter described.

The semiconductor integrated circuit device according to the second embodiment of the invention controls an operation supply voltage according to an operation timing for internal circuits respectively that are different in the operation timing.

A structure of a semiconductor integrated circuit device 2000 of the second embodiment of the invention is hereinafter described using FIG. 6.

The components similar to those of semiconductor integrated circuit device 1000 shown in FIG. 1 have the same reference characters and description thereof is not repeated here.

Figure 6:
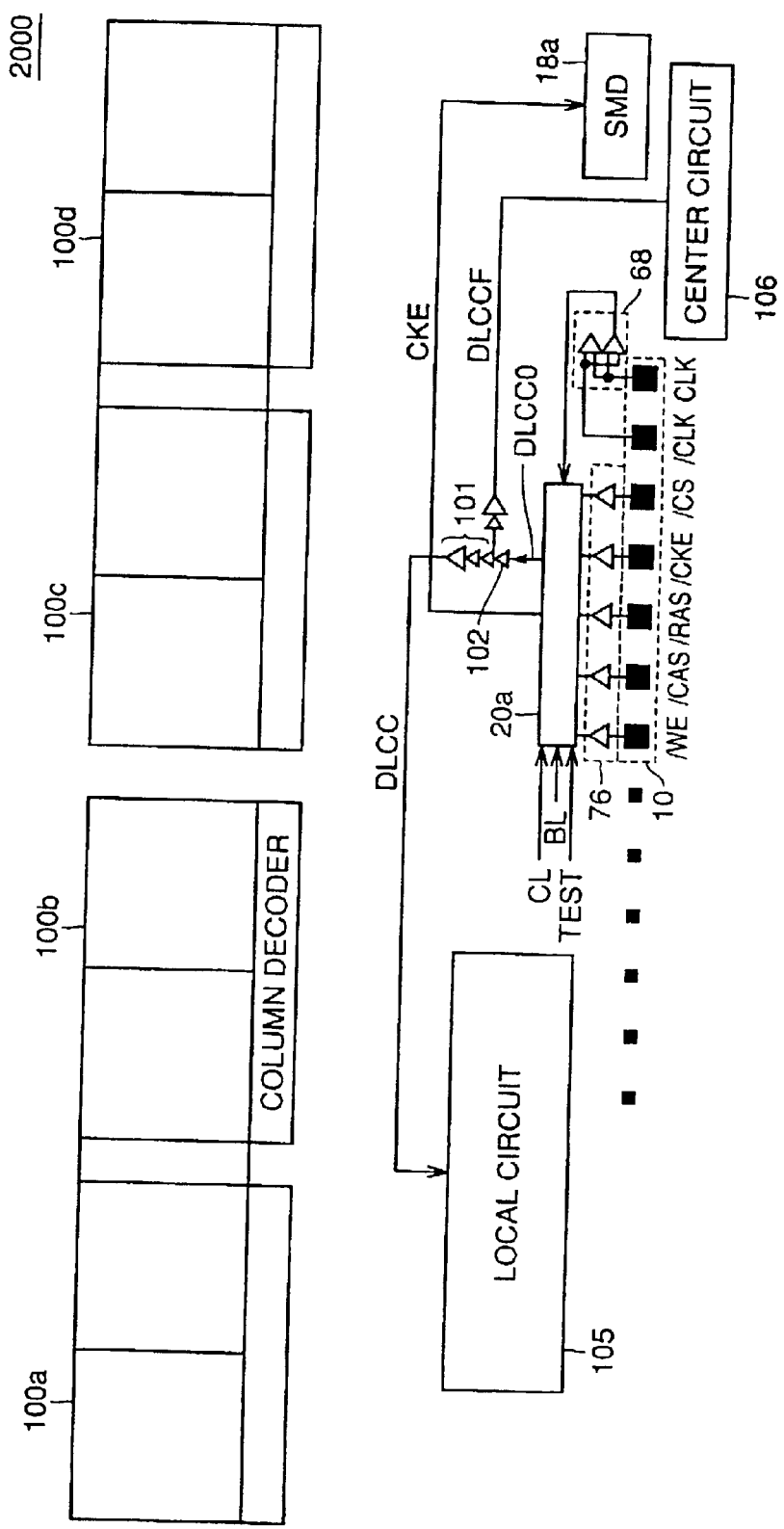
FIG. 6 shows a structure of a main portion of a semiconductor integrated circuit device 2000 according to the second embodiment of the invention.

Semiconductor integrated circuit device 2000 shown in FIG. 6 includes a control circuit 20a, buffers 101 and 102, an SMD circuit 18a (synchronous mirror delay), and memory cell blocks 100a–100d.

Control circuit 20a receives external control signals (/WE, /CAS, /RAS, /CS, external clock enable signal /CKE and the like) from a group of external control signal input terminals 10 via a buffer 76. Control circuit 20a further receives from a mode setting circuit (not shown) a burst length BL, a CAS latency CL, or a test mode signal TEST designating a specific test. In response to these signals, control circuit 20a generates a control signal for controlling an internal operation. According to the second embodiment, hierarchical power supply control signals DLCCO and /DLCCO for maintaining a constant level during a fixed period are output in response to chip select signal /CS as described below.

Buffer 102 takes hierarchical power supply control signal DLCCO and outputs a hierarchical power supply control signal DLCCF. Buffer 101 takes hierarchical power supply control signal DLCCF (delayed) and outputs a hierarchical power supply control signal DLCC.

A buffer 68 takes external clock signals /CLK and CLK to be output to control circuit 20a. An internal clock enable signal CKE supplied from control circuit 20a is transmitted to SMD circuit 18a. SMD circuit 18a generates clock for controlling the internal operation (an output operation or the like).

Semiconductor integrated circuit device 2000 further includes a local circuit 105, and a center circuit 106. Center circuit 106 is the first to start an operation when a command designating an operation of the chip is input. Local circuit 105 starts its operation delayed relative to the operation of center circuit 106.

Hierarchical power supply control signal DLCCF is used for controlling the potential of the power supply line in center circuit 106. Hierarchical power supply control signal DLCC is used for controlling the potential of the power supply line in local circuit 105.

Figure 7:
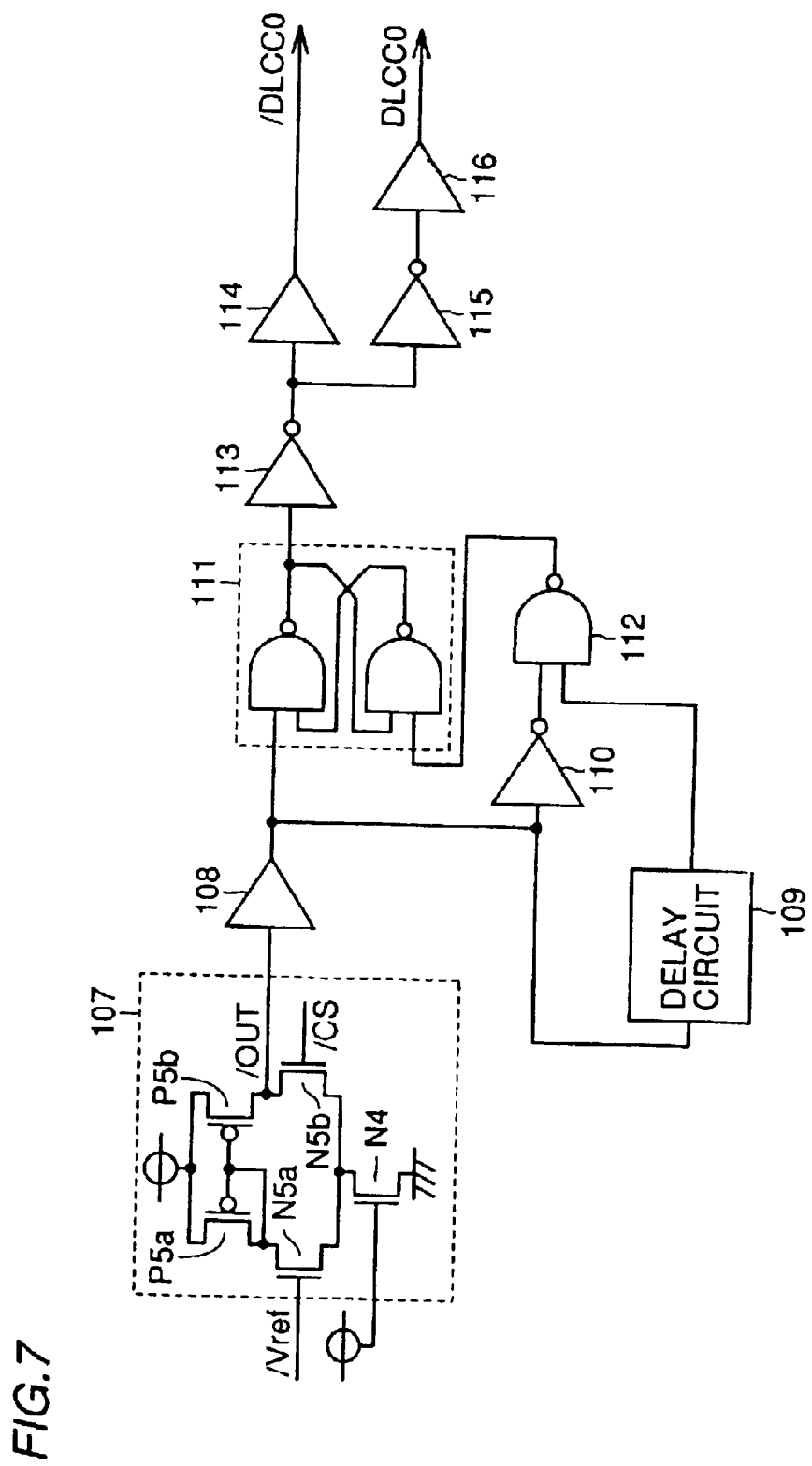
FIG. 7 shows a structure of a circuit which generates a control signal DLCCO according to the second embodiment of the invention.

The structure of a circuit for generating hierarchical power supply control signal DLCCO according to the second embodiment of the invention will be described using FIG. 7. A DLCCO generation circuit shown in FIG. 7 includes a differential amplifier 107, buffers 108, 114 and 116, a delay circuit 109, inverters 110, 113 and 115, and a flip-flop 111.

Differential amplifier 107 includes PMOS transistors P5a and P5b, and NMOS transistors N5a, N5b and N4. Differential amplifier 107 amplifies the difference between chip select signal /CS and reference potential /Vref and outputs a signal /OUT. Buffer 108 receives signal /OUT and outputs it to inverter 110 and delay circuit 109.

Delay circuit 109 delays an output signal from buffer 108 and outputs it to an NAND circuit 112. Inverter 110 inverts the output signal from buffer 108 to output it to NAND circuit 112. Flip-flop 111 is formed of an NAND circuit. Flip-flop 111 receives outputs from buffer 108 and NAND circuit 112. Inverter 113 inverts an outputs from flip-flop 111. Buffer 114 receives an output from inverter 113 and outputs control signal /DLCCO. Inverter 115 inverts the output from inverter 113. Buffer 116 takes an output from inverter 115 and outputs control signal DLCCO.

Control signal DLCCO rises to the H level when chip select signal /CS is set to the L level, and keeps the H level for a fixed period.

Using FIGS. 8 and 9, a structure of the hierarchical power supply system according to the second embodiment of the invention will be described.

Figure 8:
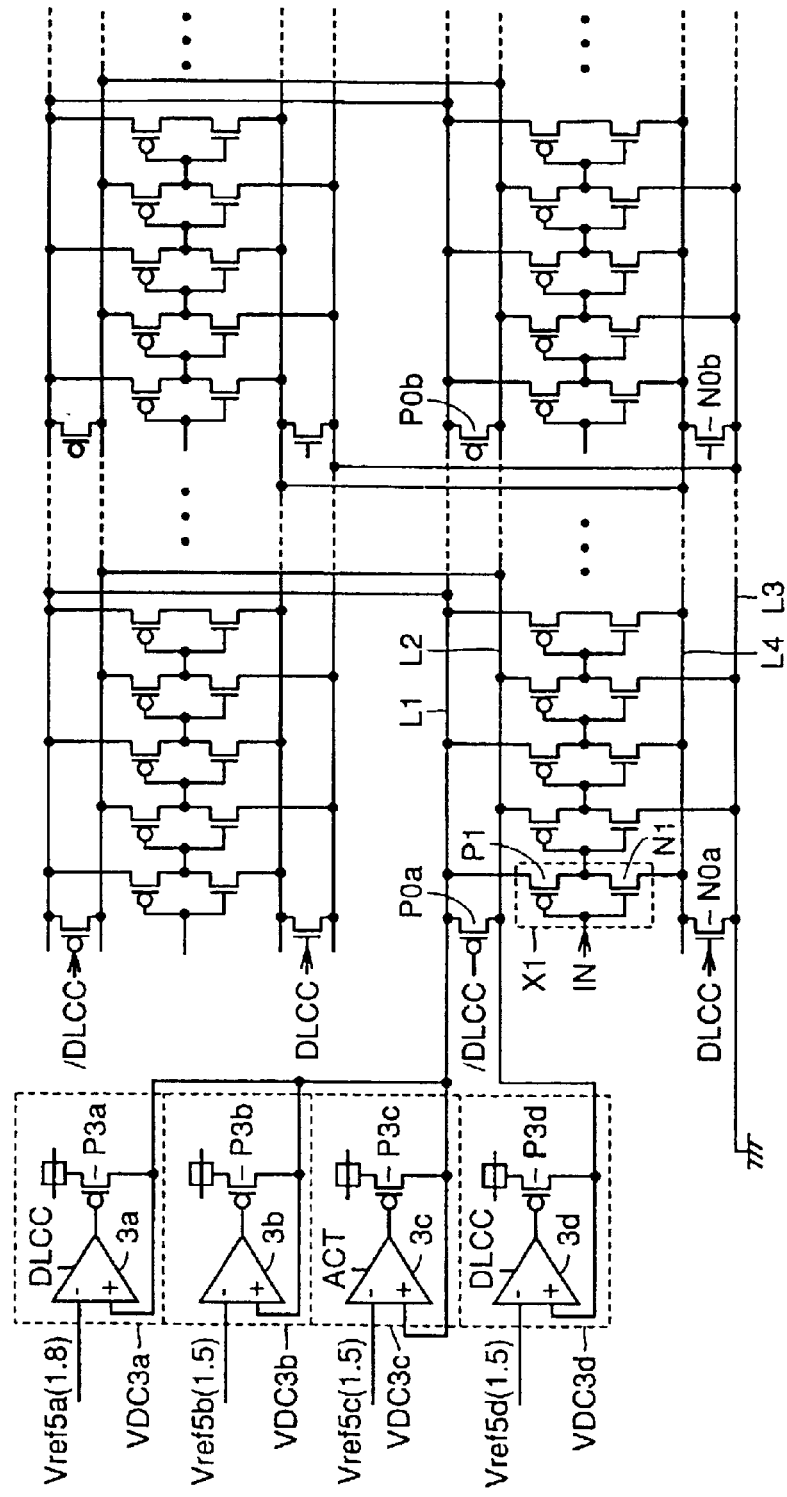
FIG. 8 shows a configuration of a hierarchical power supply system according to the second embodiment of the invention.
Figure 9:
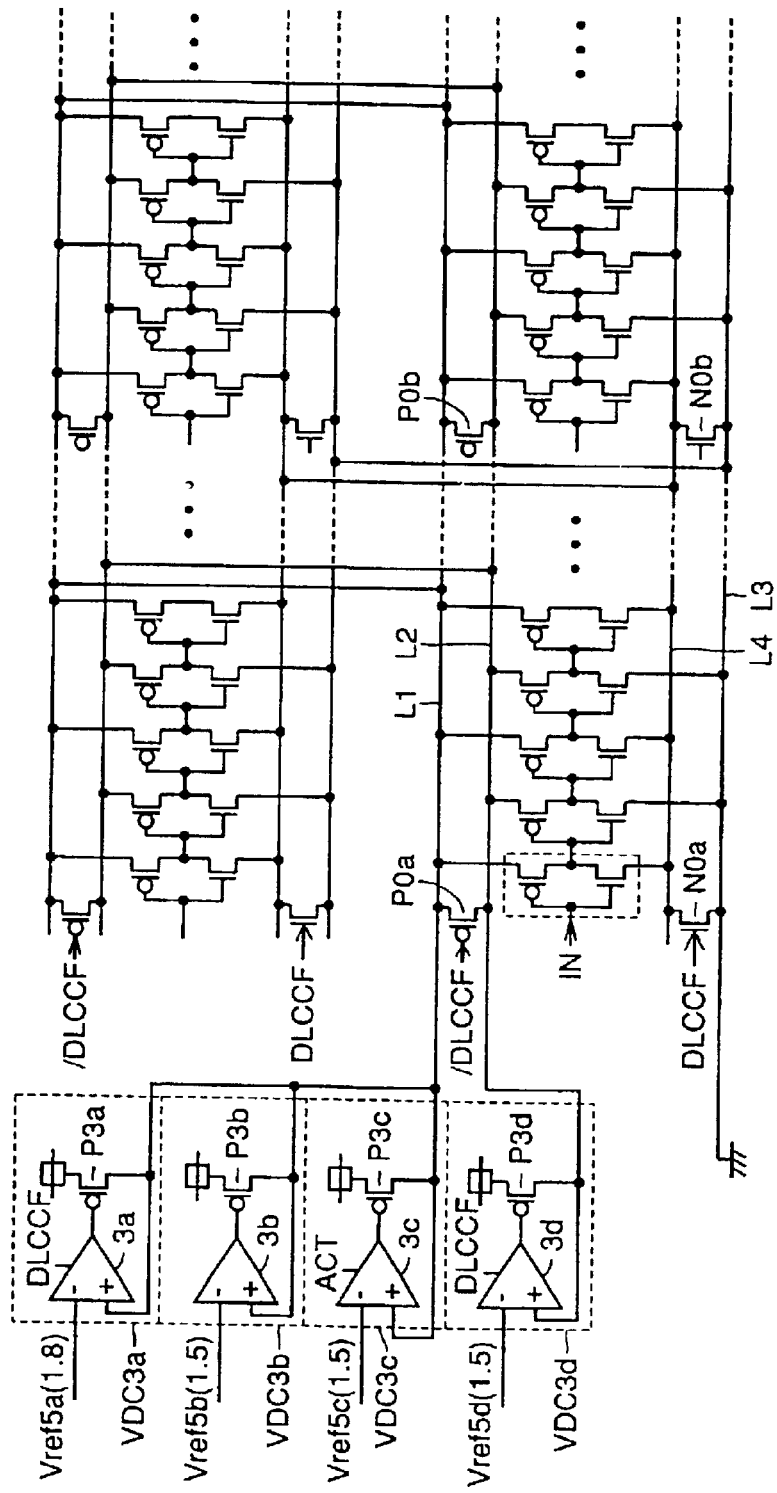
FIG. 9 shows a configuration of the hierarchical power supply system according to the second embodiment of the invention.

FIGS. 8 and 9 respectively correspond to local circuit 105 and center circuit 106.

Referring to FIGS. 8 and 9, inverters X1, . . . are representatively shown as forming a structure of an internal circuit. Inverters X1 . . . each include a PMOS transistor P1 and an NMOS transistor N1 and has a structure of a CMOS inverter. Transistors constituting inverters X1 . . . have a low threshold value.

Switching transistors P0a, P0b . . . that electrically connect a main supply line L1 and a sub-supply line L2 in response to control signal /DLCC (or /DLCCF) are placed at prescribed intervals between main supply line L1 and sub-supply line L2.

Between a main ground line L3 and a sub-ground line L4, switching transistors N0a, N0b . . . that electrically connect main ground line L3 and sub-ground line L4 in response to control signal DLCC (or DLCCF) are placed at prescribed intervals.

For main supply line L1, internal supply voltage-down converters VDC3a, VDC3b and VDC3c that generate potential falling from the level of external supply voltage ExtVcc to a fixed potential are placed. For sub-supply line L2, internal supply voltage-down converter VDC3d which generates potential falling from the level of external supply voltage ExtVcc to a fixed potential is placed.

Internal supply voltage-down converter VDC3a includes a differential amplifier 3a and a PMOS transistor P3a. PMOS transistor P3a has one conduction terminal connected to external supply voltage ExtVcc and has the other conduction terminal connected to main supply line L1. The gate electrode of PMOS transistor P3a receives an output from differential amplifier 3a. Differential amplifier 3a receives at its input a high reference voltage Vref5a (1.8 V) and voltage Vcc of main supply line L1. Differential amplifier 3a operates in response to signal DLCC (or DLCCF).

Internal supply voltage-down converter VDC3b includes a differential amplifier 3b and a PMOS transistor P3b. PMOS transistor P3b has one conduction terminal connected to external supply voltage ExtVcc and the other conduction terminal connected to main supply line L1. The gate electrode of PMOS transistor P3b receives an output from differential amplifier 3b. Differential amplifier 3b receives at its input reference voltage Vref5b (1.5V) and voltage Vcc of main supply line L1.

Internal supply voltage-down converter VDC3c includes a differential amplifier 3c and a PMOS transistor P3c. PMOS transistor P3c has one conduction terminal connected to external supply voltage ExtVcc and the other conduction terminal connected to main supply line L1. The gate electrode of PMOS transistor P3c receives an output from differential amplifier 3c. Differential amplifier 3c receives at its input reference voltage Vref5c (1.5V) and voltage Vcc of main supply line L1. Differential amplifier 3c operates in response to an act signal ACT.

Internal supply voltage-down converter VDC3d includes a differential amplifier 3d and a PMOS transistor P3d. One conduction terminal of PMOS transistor P3d is connected to external supply voltage ExtVcc and the other conduction terminal thereof is connected to sub-supply line L2. The gate electrode of PMOS transistor P3d receives an output from differential amplifier 3d. Differential amplifier 3d receives at its input reference voltage Vref5d (1.5V) and voltage SubVcc of sub-supply line L2. Differential amplifier 3c operates in response to control signal DLCC (or DLCCF).

Internal supply voltage-down converter VDC3a is used for decreasing the leakage current in the internal circuit. When internal supply voltage-down converter VDC3a is activated, voltage Vcc of main supply line L1 is set at 1.8 volt. In this case, voltage Vcc of main supply line L1 is set higher than voltage SubVcc of sub-supply line L2 by 0.3 V. Accordingly, the leakage current decreases.

Internal supply voltage-down converter VDC3b is used for setting voltage Vcc of the main supply line at 1.5V in the standby cycle. Any intermittent operation of internal supply voltage-down converter VDC3b is unnecessary.

Internal supply voltage-down converter VDC3c is activated when the chip is set into the active state. The circuit supplies a relatively large current required for an operation of the chip.

In response to activation of internal supply voltage-down converter VDC3a, internal supply voltage-down converter VDC3d sets voltage SubVcc of sub-supply line L2 at 1.5V. Internal supply voltage-down converter VDC3d may be eliminated in the structure. If internal supply voltage-down converter VDC3d is not used here, voltage SubVcc of sub-supply line L2 is set at an arbitrary potential determined by the leakage current relative to voltage Vcc of main supply line L1 determined by internal supply voltage-down converter VDC3a.

Figure 10:
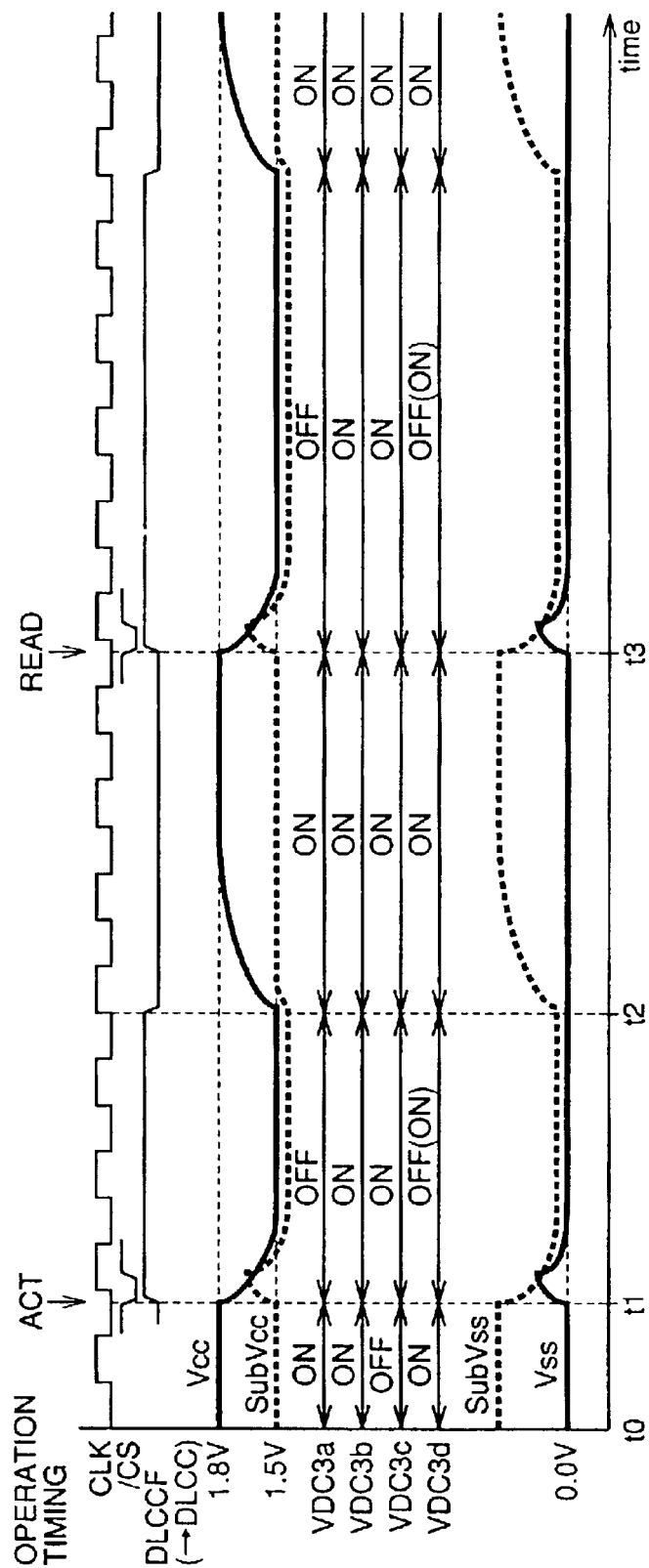
FIG. 10 shows a timing chart illustrating an operation of the hierarchical power supply system in semiconductor integrated circuit device 2000 according to the second embodiment of the invention.

Next, an operation of the hierarchical power supply system according to the second embodiment will be described using FIG. 10.

In the standby cycle (time t0–t1), hierarchical power supply control signals DLCC and DLCCF are at the L level. Internal supply voltage-down converters VDC3a, VDC3b and VDC3d are in ON state. Internal supply voltage-down converter VDC3c is in OFF state.

Voltage Vcc of main supply line L1 is set at 1.8 V, voltage SubVcc of sub-supply line L2 is set at 1.5V, voltage Vss of main ground line L3 is set at 0 V, and voltage SubVss of sub-ground line L4 is set at a voltage level determined by the leakage current (higher than 0 V).

In this case, voltage Vcc of main supply line L1 is higher than voltage SubVcc of sub-supply line L2 in both of local circuit 105 and center circuit 106. Accordingly, the leakage current can be restricted to a lower level.

At the rising edge of clock signal CLK at time t1, chip select signal /CS is input. In response to the falling edge of the L level of chip select signal /CS, hierarchical power supply control signal DLCCF rises to the H level. Subsequently, hierarchical power supply control signal DLCC rises to the H level. Act signal ACT is input.

Internal power supply voltage-down converters VDC3a and VDC3d are set to OFF state. (VDC3d may be in ON state.) Internal supply voltage-down converter VDC3c is set into ON state.

Main supply line L1 and sub-supply line L2 are short-circuited. Voltage Vcc of main supply line L1 is discharged to approach voltage SubVcc of sub-supply line L2. Sub-supply voltage SubVcc is charged to approach voltage Vcc of main supply line L1.

Main ground line L3 and sub-ground line L4 are short-circuited. Voltage SubVss of sub-ground line L4 is discharged to approach voltage Vss of main ground line L3. Voltage Vss of main ground line L3 is charged to approach voltage SubVss of sub-ground line L4. According to consumption current in the circuit, each voltage level is discharged to approach the ground potential level. These operations are first done in center circuit 106 and next in local circuit 105.

Act signal ACT is supplied to set the chip into the active state. During the period from time (t1) when the act signal ACT is input to time (t2) corresponding to three cycles, a row-related access is made. The operation of the memory array is started to set the word lines into the active state. Charges are read out from the memory cells and signals stored in the memory cells are amplified by a sense amplifier. After completion of successive operations, a column-related access is made possible.

After the row-related access operation is completed, during the period corresponding to next four clocks (until time t3), the state of the row-related access is maintained. Circuits other than the circuit for retaining signals at the sense amplifier are in the state where reset is possible.

Accordingly, after time t2, hierarchical power supply control signals DLCCF and DLCC are set at the L level. Internal supply voltage-down converters VDC3a, VDC3b, VDC3c and VDC3d are in ON state.

Main supply line L1 and sub-supply line L2 as well as main ground line L3 and sub-ground line L4 are in the cutoff state. Voltage Vcc of main supply line L1 is charged to 1.8V, and voltage SubVcc of sub-supply line L2 is charged to 1.5V. Voltage Vss of main ground line L3 is discharged to 0V, and voltage SubVss of sub-ground line L4 is discharged to a potential determined by the leakage current.

Similar operations are executed for the column-related access, for example, when a READ cycle is started (time t3). At the same time that execution of successive READ cycles is completed, the voltage of main supply line L1 is set higher than voltage SubVss of the sub-supply line L2 in order to reduce the leakage current.

As described above, the leakage current is efficiently decreased according to an operation timing of each circuit by generating the hierarchical power supply control signals according to the operation timing.

In the cycle (from time t1 to t2 corresponding to three cycles) where the internal circuit is operating, a difference is generated between voltage SubVcc of sub-supply line L2 and voltage Vcc of main supply line L1. The difference generated is due to ON resistance in switching transistors N0 and P0. The potential difference can be decreased by lowering the impedance of the switching transistors.

(Third Embodiment)

A semiconductor integrated circuit device according to the third embodiment of the present invention will be described below. The semiconductor integrated circuit device according to the third embodiment controls the operation supply voltage of internal circuits different in the operation timing independently of each other.

A structure of a semiconductor integrated circuit device 3000 according to the third embodiment will be described using FIG. 11. The components similar to those of semiconductor integrated circuit device 2000 have the same reference characters and description thereof is omitted.

Figure 11:
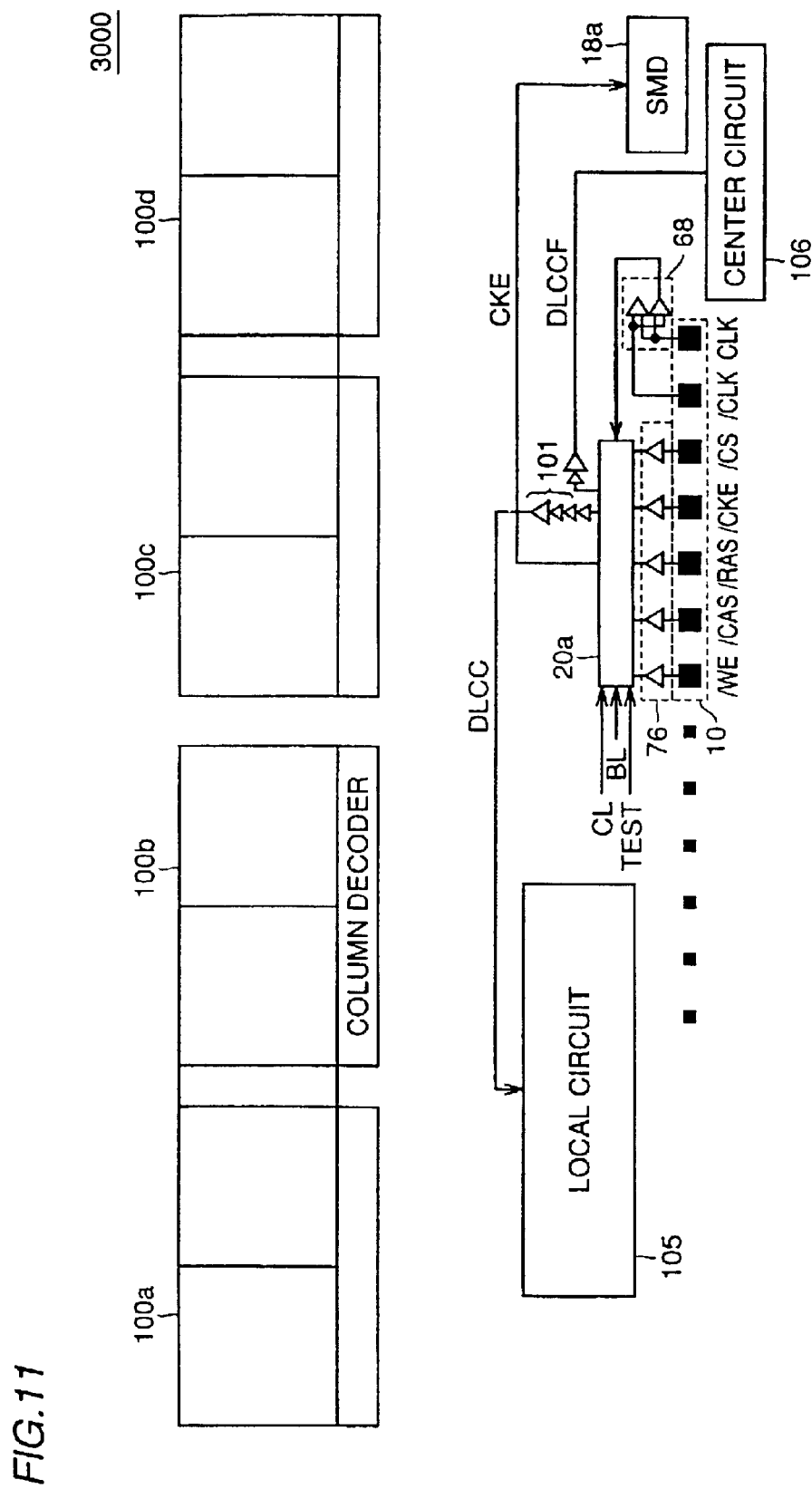
FIG. 11 shows a structure of a main portion of a semiconductor integrated circuit device 3000 according to the third embodiment of the invention.

In semiconductor integrated circuit device 3000 shown in FIG. 11, a hierarchical power supply control signal DLCCF which controls a center circuit 106 is generated based on an external clock enable signal /CKE. Input of an external control signal is made acceptable at the chip by input of external clock enable signal /CKE.

A hierarchical power supply control signal DLCC used for controlling a local circuit 105 corresponds to a delayed hierarchical power supply control signal DLCCO output from a control circuit 20a as in the second embodiment. In other words, hierarchical power supply control signals DLCCF and DLCC are generated independently of each other.

Adjustment of the voltage level in local circuit 105 and center circuit 106 is accomplished, for example, by the structures shown in FIGS. 8 and 9.

An operation of the hierarchical power supply system of the semiconductor integrated circuit device according to the third embodiment will be described using the timing chart of FIG. 12.

Figure 12:
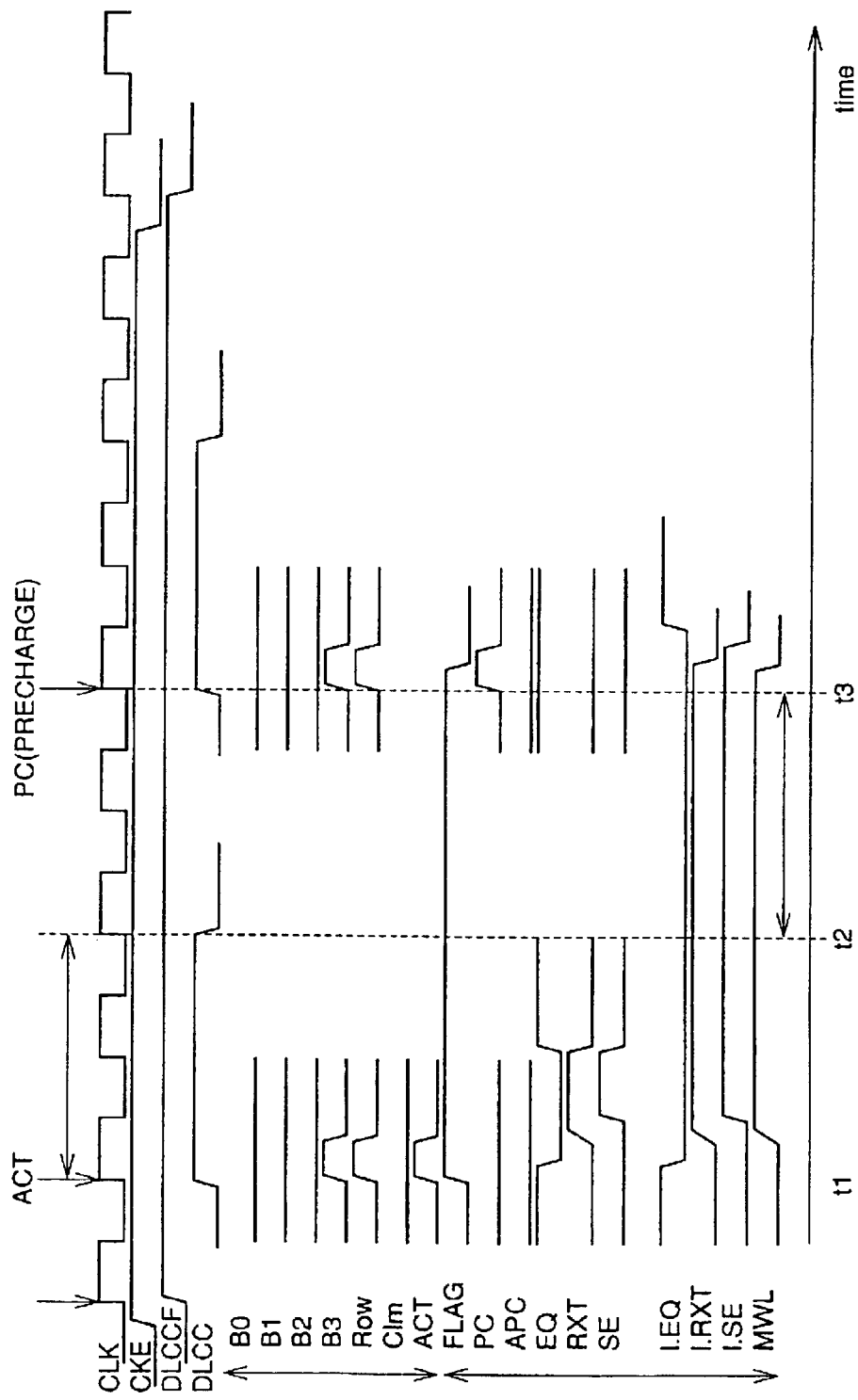
FIG. 12 is a timing chart showing an operation of a hierarchical power supply system in semiconductor integrated circuit device 3000 according to the third embodiment of the invention.

Referring to FIG. 12, signals B0–B3 are those indicative of bank addresses, a signal Row is a row-related access identify signal instructing activation of a row-related circuit operation, a signal Clm is a column-related access identify signal instructing activation of a column-related circuit operation, and a signal ACT is a bank activation signal transmitted from control circuit 20a.

A flag signal is a signal which is held in response to that a bank is accessed (bank is hit), a signal PC is a precharge signal transmitted from control circuit 20a to instruct a precharge operation of a selected bank, and a signal APC is an all bank precharge signal transmitted from control circuit 20a to instruct the precharge operation of all banks.

A signal EQ is a local bit line equalize signal, a signal RXT is a local word line activation signal, and a signal SE is a local sense amplifier activation signal.

A signal l.EQ is a local bit line equalize signal adapted for the bank, signal l.RXT is a local word line activation signal adapted for the bank, a signal l.SE is a local sense amplifier activation signal adapted for the bank, and potential MWL is a potential level of a main word line in a memory cell block (bank).

Description of the operation will be given below. External clock enable signal /CKE is input. Hierarchical supply control signal DLCCF rises to the H level. Main supply line L1 and sub-supply line L2 as well as main ground line L3 and sub-ground line L4 of center circuit 106 are short-circuited. Local circuit 105 is in the standby state.

At the rising edge of clock signal CLK at time T1, decoded bank address B3 attains the active state. A corresponding bank is selected. Signal Row is in the active state.

The level of activated act signal ACT is held as a flag signal. At this time, hierarchical supply control signal DLCC rises to the H level. Main supply line L1 and sub-supply line L2 as well as main ground line L3 and sub-ground line L4 in local circuit 105 are short-circuited. Local circuit 105 enters the active cycle.

The level of signal l.EQ falls to the L level. Signal l.RXT attains the active state and the potential level of a main word line in a selected row changes to the active state ("H" level). Signal l.SE attains the H level.

At time t2, hierarchical power supply control signal DLCC falls to the L level. The period from time t1 to t2 is the one which is necessary for a row-related control of one bank. Local circuit 105 enters the standby cycle.

From time t2 to t3, the circuit is reset in order to cut the leakage current. Control signals such as signal l.EQ, l.RXT, l.SE are latched.

At time t3, precharge signal PC is supplied. Hierarchical power supply control signal DLCC rises to the H level at this time. The power supply lines (L1 and L2, L3 and L4) are short-circuited in local circuit 105.

At the rising edge of clock signal CLK at time t3, decoded bank address B3 attains the active state. A corresponding bank is selected. Signal Row is in the active state. Precharge signal PC rises to the H level.

This structure allows internal circuits which are different in the operation timing to be controlled independently of each other. In particular, the timing of short-circuit of main supply line L1 and sub-supply line L2 in center circuit 106 is accelerated according to the input start timing of signals externally supplied. As a result, the leakage current can be efficiently reduced.

(Fourth Embodiment)

A semiconductor integrated circuit device according to the fourth embodiment of the invention is to be described below. The semiconductor integrated circuit device according to the fourth embodiment controls the operation supply voltage for row-related circuits and column-related circuits independently of each other.

As operations of the semiconductor integrated circuit device, there are an operation of the row-related circuit which selects memory cells to obtain data and an operation of the column-related circuit which selectively selects specific data from a plurality of selected row-related data and communicates the data with any external section of the chip.

During the row-related operation is executed, the column-related operation is unnecessary. Therefore, main supply line L1 and sub-supply line L2 are short-circuited and main ground line L3 and sub-ground line L4 are short-circuited in the row-related circuit when a row-related command is input. The column related circuit maintains the standby state to reduce the leakage current.

During the column-related operation is executed, the row-related operation is unnecessary. Therefore, the main supply line L1 and sub-supply line L2 are short-circuited and the main ground line L3 and sub-ground line L4 are short-circuited in the column-related circuit. The row-related circuit maintains the standby state to reduce the leakage current.

The row-related circuit is further classified into a section related to row-related address selection, a section related to word selection, a section related to activation of a sense amplifier, and the like. These sections operate successively with different timing after input of a row address. Accordingly, for each section, main supply line L1 and sub-supply line L2 are short-circuited and main ground line L3 and sub-ground line L4 are short-circuited according to the operation timing.

The column-related circuit is further classified into a section related to column-related address selection, a section related to activation of a selected line, a section related to a reading operation, a section related to a writing operation and the like. These sections are successively operated with different timing. Therefore, for each section, main supply line L1 and sub-supply line L2 are short-circuited, and main ground line L3 and sub-ground line L4 are short-circuited according to the operation timing.

Specific examples are provided for description. The entire structure is the same as that of semiconductor integrated circuit device 1000 of the first embodiment shown in FIG. 1 and description thereof is omitted. Any of systems according to the first and the second embodiments may be employed as a hierarchical power supply system.

Figure 13:
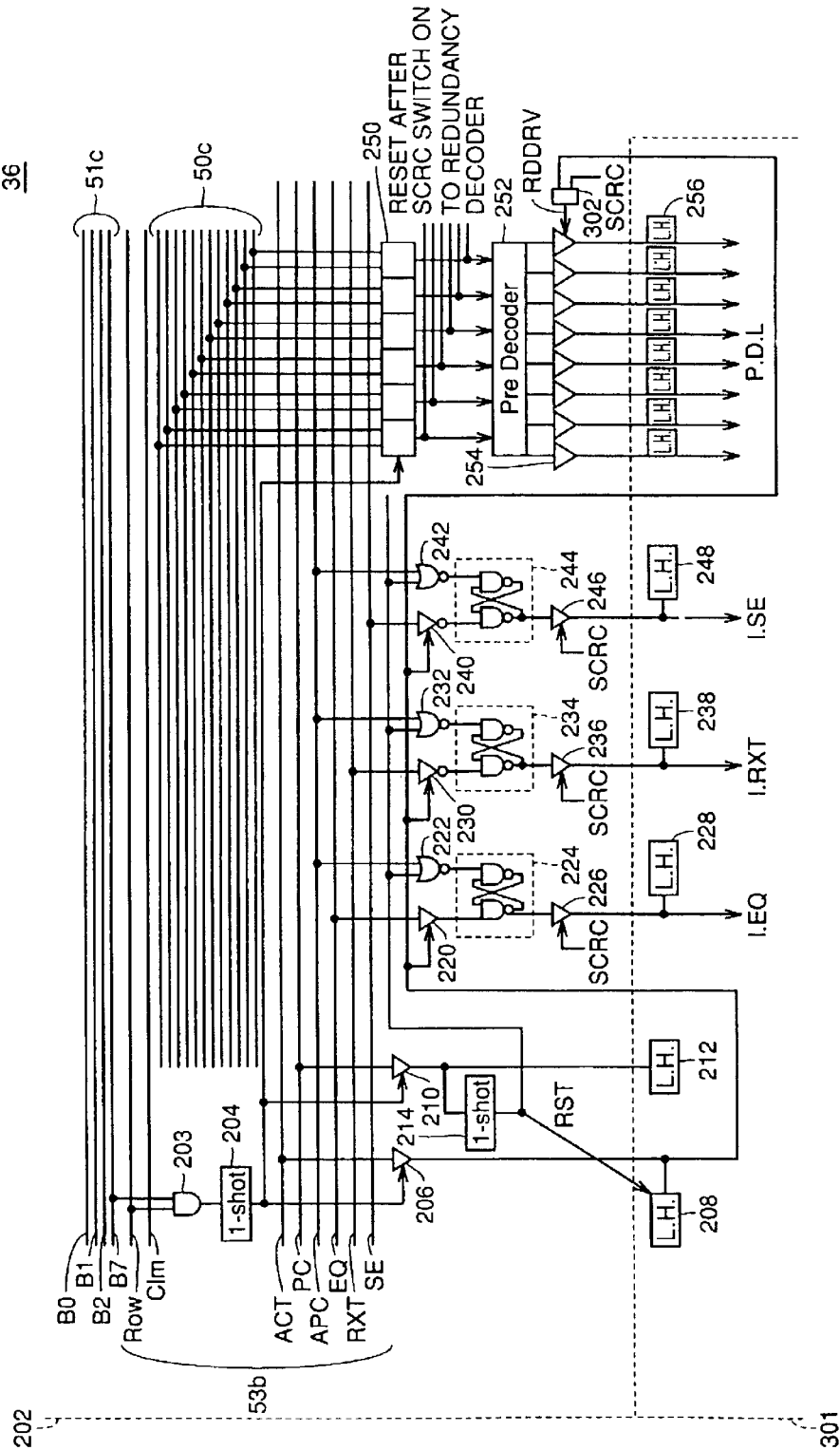
FIG. 13 is a schematic block diagram showing a structure of a row predecoder 36 according to the fourth embodiment of the invention.

Referring to FIG. 13, a structure of a row predecoder 36 of the fourth embodiment will be described.

A command data bus 53*b* transmits signal Row instructing to activate a row-related circuit operation, signal Clm instructing to activate a column-related circuit operation, signal ACT instructing to activate a circuit operation of the internal circuit, signal PC instructing reset (precharge) of the bank, signal APC instructing precharge of all banks, signal EQ instructing to cancel equalization of bit lines and to disconnect an unused bit line by a sense amplifier, signal RXT instructing to activate a word line, signal SE instructing to activate the sense amplifier and the like.

A bank address bus 51*c* transmits bank address signals B0–B7 decoded by a bank decoder 22. An address bus 50*c* transmits address signals supplied from an address driver 52.

When one of the bank address signals, for example, bit data B7 attains the active state and signal Row attains the active state, a signal in the active state is output from an AND circuit 203, and accordingly an active one-shot pulse is output from a one-shot pulse generation circuit 204.

In response, a driver circuit 206 is activated, the level of signal ACT is taken to be kept by a level hold circuit 208.

Similarly, in response to the signal supplied from one-shot pulse generation circuit 204, a driver circuit 210 is activated. Receiving the level of signal PC, a level hold circuit 212 keeps the level. Receiving an output from driver circuit 210, a one-shot pulse generation circuit 214 outputs a reset signal to level hold circuit 208. In response to an output signal from level hold circuit 208, a driver circuit 220 is activated, receives signal EQ and outputs it. An NOR circuit 222, receiving signal APC and a signal from one-shot pulse generation circuit 214, outputs a result of NOR operation. A flip-flop circuit 224 is set according to an output from driver circuit 220 and reset according to an output from NOR circuit 222. A driver circuit 226 is activated by a hierarchical supply control signal SCRC described below, receives an output from flip-flop circuit 224 and outputs it. The output level of driver circuit 226 is kept by a level hold circuit 228. The output level of level hold circuit 228 is supplied to a corresponding memory cell block as signal l.EQ.

Similarly, a flip-flop circuit 234 is set by an output from an inverter 230 activated according to a signal from level hold circuit 208 and receiving the level of signal RXT transmitted via a command data bus 53*b* as an input, and reset by an output from an NOR circuit 232 receiving an output from one-shot pulse generation circuit 214 and the level of signal APC transmitted via command data bus 53*b*.

The structures of flip-flop circuit 224, driver circuit 226 and level keep circuit 228 shown in FIG. 13 are hereinafter described using FIG. 14.

Figure 14:
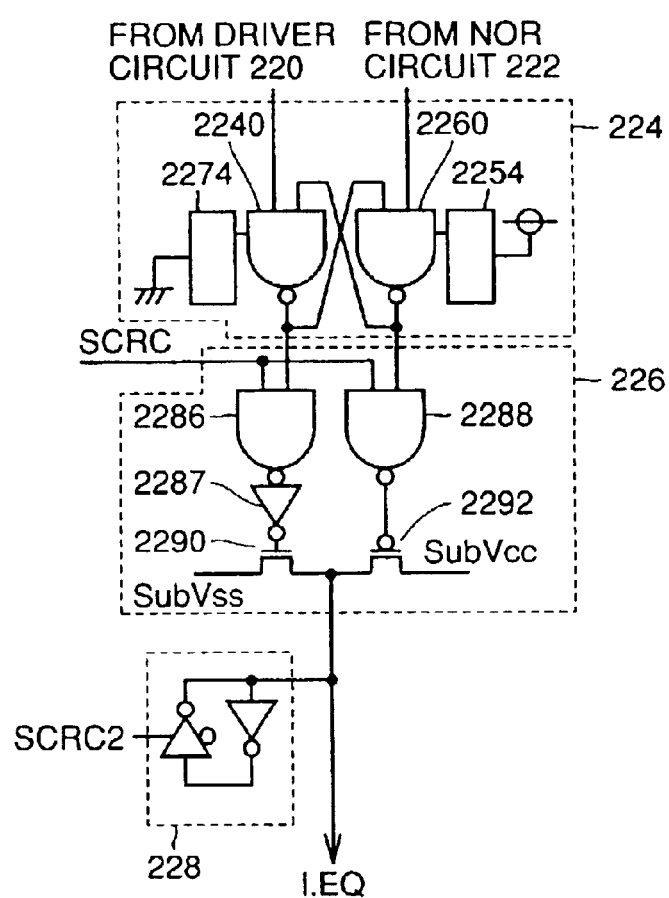
FIG. 14 is a schematic block diagram illustrating a structure of a flip-flop circuit 224, a driver circuit 226 and a level keep circuit 228 illustrated in FIG. 13.

Referring to FIG. 14, flip-flop circuit 224 includes cross-connected NAND circuits 2240 and 2260, a switch circuit 2274 switching the state of supplying ground potential to the cross-connected NAND circuits 2240 and 2260, and a switch circuit 2254 switching the state of supplying supply potential Vcc to NAND circuits 2240 and 2260. Switch circuits 2254 and 2274 constitute a hierarchical power supply.

Figure 71:
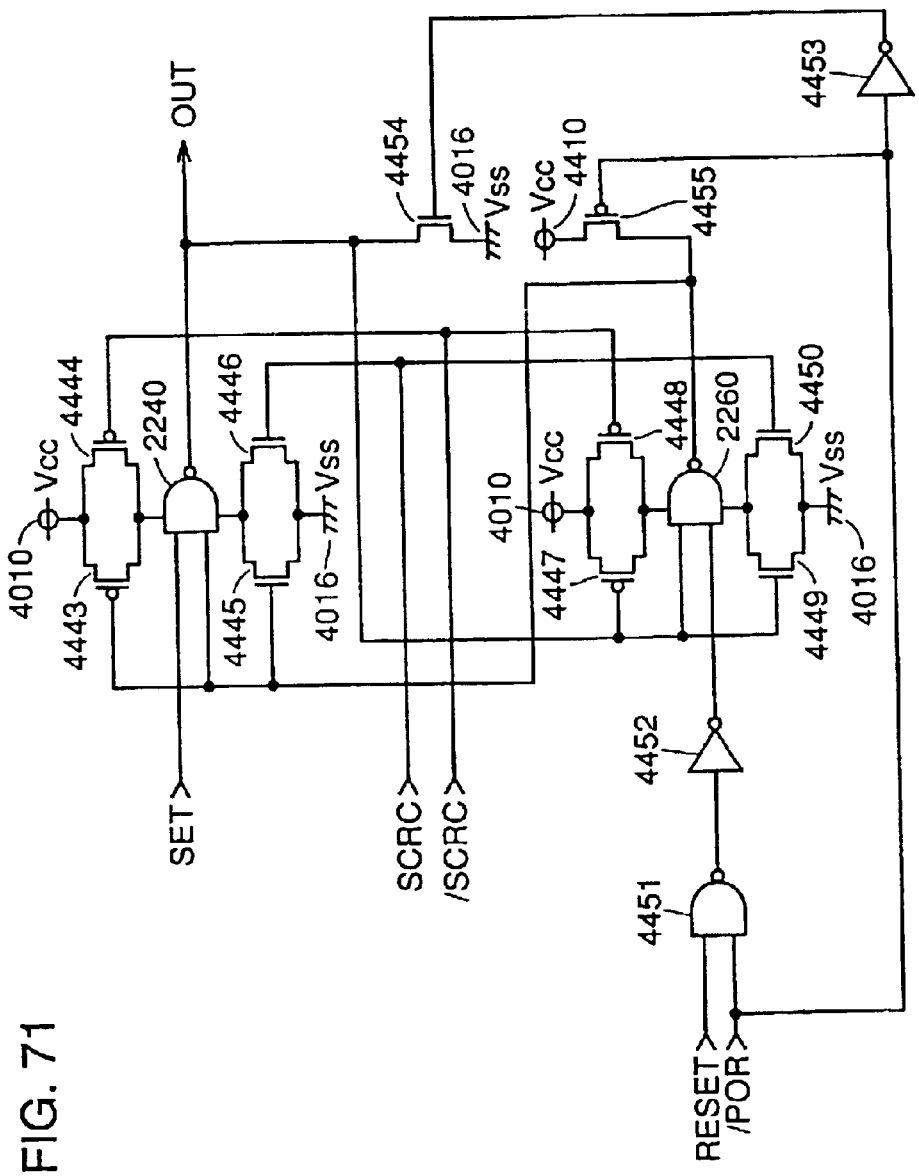
FIG. 71 is a circuit diagram illustrating a structure of a flip-flop circuit 224.

Referring to FIG. 71, one example of the structure of flip-flop circuit 224 is specifically described. FIG. 71 is a circuit diagram illustrating the structure of flip-flop circuit 224. Referring to FIG. 71, flip-flop circuit 224 includes NAND circuits 2240 and 2260 connected for forming an RS flip-flop, PMOS transistors 4443 and 4444 connected in parallel with each other on the power supply side of NAND circuit 2240, NMOS transistors 4445 and 4446 connected in parallel with each other on the ground side of NAND circuit 2240, PMOS transistors 4447 and 4448 connected in parallel with each other on the power supply side of NAND circuit 2260, NMOS transistors 4449 and 4450 connected in parallel with each other on the ground side of NAND circuit 2260, an NAND circuit 4451, inverters 4452 and 4453, an NMOS transistor 4454 connected between an output node of NAND circuit 2240 and a main ground line (4016), and a PMOS transistor 4455 connected between a main power supply line (4010) and an output node of NAND circuit 2260.

Preferably, the threshold of transistors 4443–4450 is set at a value higher than the threshold of other transistors (transistors in NAND circuits 2240 and 2260, for example).

NAND circuit 4451 receives a reset signal RESET and a power on reset signal /POR. A signal from NAND circuit 4451 is supplied to NAND circuit 2260 via inverter 4452.

Power on reset signal /POR is directly supplied to the gate of transistor 4455 and supplied to the gate of transistor 4454 via inverter 4453. Power on reset signal /POR is at a logical low (L) level only for a prescribed time from the time at which the power supply is turned on, and accordingly transistors 4454 and 4455 are both turned on. NAND circuit 2240 outputs a signal of L level and NAND circuit 2260 outputs a signal of logical high (H) level. Flip-flop circuit 224 is thus reset when the power supply is turned on.

In the operation mode, a control signal SCRC is at H level and a control signal /SCRC is at L level, so that transistors 4444, 4446, 4448 and 4450 are all turned on. NAND circuits 2240 and 2260 are respectively provided with power supply voltage Vcc and ground voltage Vss, and accordingly flip-flop circuit 224 normally operates.

In the standby mode, control signal SCRC is at L level and control signal /SCRC is at H level, so that transistors 4444, 4446, 4448 and 4450 are all turned off. When flip-flop 224 outputs a signal of H level, that is, NAND circuit 2240 outputs a signal of H level and NAND circuit 2260 outputs a signal of a L level, transistors 4443 and 4449 are turned on and transistors 4445 and 4447 are turned off. As a result, although power supply voltage Vcc is output from NAND circuit 2240 as an output of H level, subthreshold leakage current flowing through NAND circuit 2240 is reduced. Although ground voltage Vss is output from NAND circuit 2260 as an output of L level, subthreshold leakage current flowing through NAND circuit 2260 is reduced.

When flip-flop circuit 224 outputs a signal of L level, that is, NAND circuit 2240 outputs a signal of L level and NAND circuit 2260 outputs a signal of H level, transistors 4445 and 4447 are turned on and transistors 4443 and 4449 are turned off. As a result, although ground voltage Vss is supplied from NAND circuit 2240 as an output signal of L level, subthreshold leakage current flowing through NAND circuit 2240 is decreased. Further, although power supply voltage Vcc is output from NAND circuit 2260 as an output signal of H level, the subthreshold leakage current flowing through NAND circuit 2260 is reduced.

Driver circuit 226 includes an NAND circuit 2286 having one input node receiving signal SCRC and the other receiving one output signal from flip-flop circuit 224, an NAND circuit 2288 having one input node receiving signal SCRC and the other input node receiving the other output from flip-flop circuit 224, an NMOS transistor 2290 having its gate potential controlled by an output from NAND circuit 2286 and receiving at its source hierarchical power supply potential SubVss, and a PMOS transistor 2292 receiving an output from NAND circuit 2288 at its gate and receiving hierarchical supply potential SubVcc at its source. The drain of NMOS transistor 2290 and the drain of PMOS transistor 2292 are connected, and the potential level of this connection node is an output potential from driver circuit 226.

Level hold circuit 228 is a latch circuit activated by signal SCRC2. When signal SCRC is in the active state, NAND circuits 2240 and 2260 receive supply potential to operate. NAND circuits 2240 and 2260 are structured to generate self bias to reduce the leakage current during the period in which signal SCRC is inactivated (hierarchical power supply system).

Referring to FIG. 13, driver circuit 236 receives an output from flip-flop circuit 234 to be activated by signal SCRC.

The output level of driver circuit 236 is kept by level hold circuit 238, and the output level of level hold circuit 238 is output to a corresponding memory cell block as signal l.RXT.

Flip-flop circuit 244 is set by an output from inverter 240 which receives signal SE transmitted via command data bus 53b and is activated according to an output level of level hold circuit 208, and is reset according to an output from NOR circuit 242 which receives an output signal from one-shot pulse generation circuit 214 and the level of signal APC transmitted via command data bus 53b. Driver circuit 246 receives an output from flip-flop circuit 244 and is activated by signal SCRC2. The output level of driver circuit 246 is kept by level hold circuit 248, and the output level of level hold circuit 248 is supplied as signal l.SE to a corresponding memory cell block.

A latch circuit 250 is reset in response to activation of signal SCRC, activated in response to activation of one-shot pulse generation circuit 204, and keeps an address signal transmitted via address bus 50c. An output from latch circuit 250 is transmitted to a redundancy address decoder (not shown) and to a predecoder 252. The result of predecoding is supplied to a driver circuit 254.

An output from driver circuit 254 is kept by a level hold circuit 256 and level hold circuit 256 outputs it to a corresponding row predecoder line.

Driver circuit 254 is activated by a driver control circuit 302 which is controlled by a value of the flag kept by level hold circuit 208 as well as signal SCRC.

Driver control circuit 302 is a circuit for maintaining, when inactivated after activated once, driver circuit 254 in the inactive state during an active period of act signal ACT, even if signal SCRC again attains the active state.

By controlling driver circuit 254 by driver control circuit 302, a predecoder address signal kept by level hold circuit 256 is prevented from being reset due to the active state of driver circuit 254 when a row address is once taken into level hold circuit 256 and thereafter signal SCRC is again activated.

If driver circuit 254 is inactivated after it attains the active state, latch circuit 250 which is a circuit taking an address signal and predecoder 252 are reset.

In the structure of row predecoder 36 shown in FIG. 13, a region 301 including level hold circuits 208, 212, 228, 238 and 248, level hold circuit 256, and corresponding memory cell blocks corresponds to a region which is not controlled by the hierarchical power supply control signal. The region 301 operates with power supply potential Vcc and ground potential Vss as power supply potential in both of the standby state and the active state.

A region other than region 301 (a region 202) in row predecoder 36 corresponds to a region which is controlled by hierarchical power supply control signal SCRC. The region operates by receiving supply potential Vcc and ground potential Vss in the period in which hierarchical power supply control signal SCRC is in the active state The region operates with the potential lower than supply potential Vcc and the potential higher than ground potential Vss respectively as supply potential during the period in which hierarchical power supply control signal SCRC is in the inactive state ("L" level).

During a period in which level hold circuit 208 maintains its hold level after signal RDDRV is activated once, signal RDDRV is never set into the active state even if signal SCRC attains the active state after inactivated to be reset, owing to driver control circuit 302.

Figure 15:
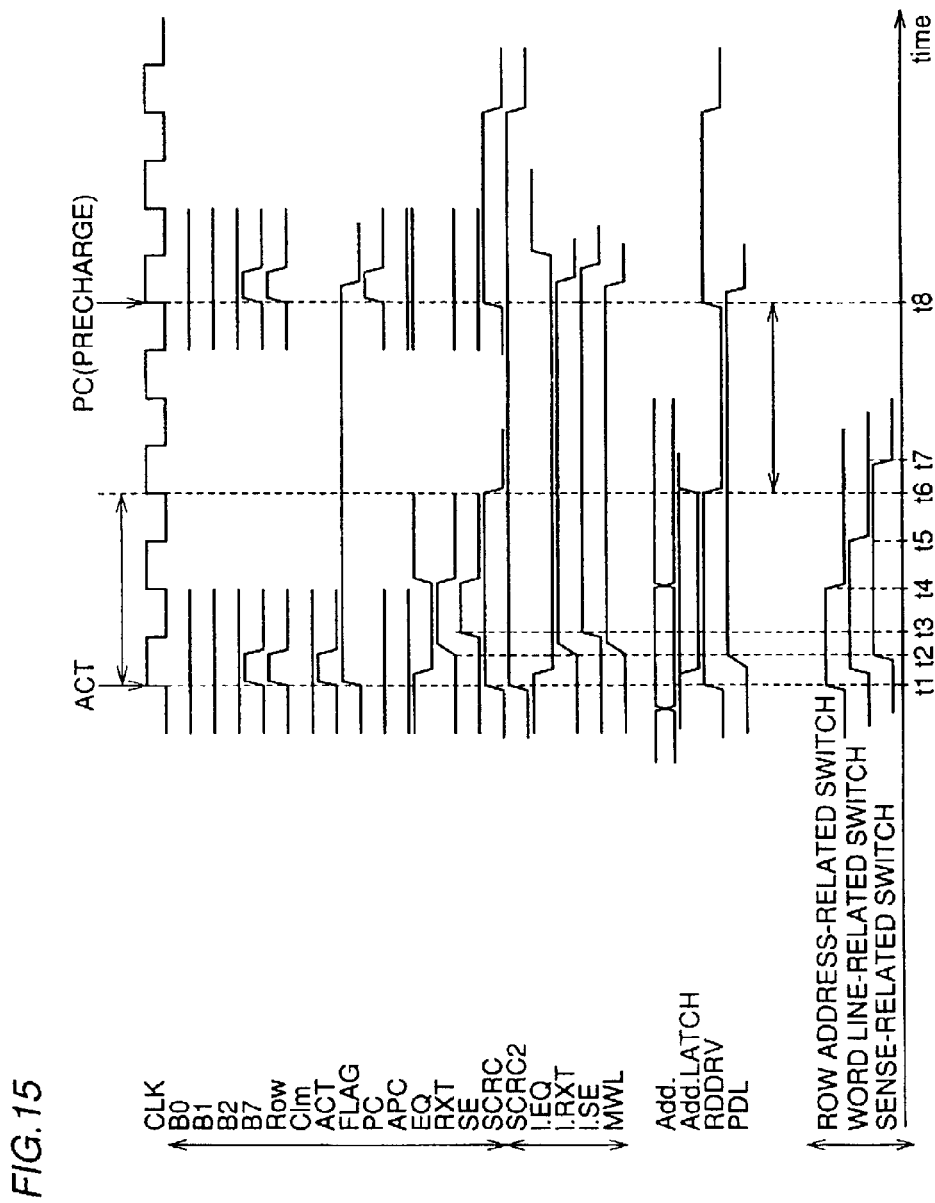
FIG. 15 is a timing chart provided for describing an operation of a row predecoder 36 illustrated in FIG. 13.

An operation of row predecoder 36 shown in FIG. 13 is next described using the timing chart of FIG. 15.

Referring to FIG. 15, signal SCRC2 is a signal generated by a control circuit 20 for reset of level hold circuits 228, 238, 248 and the like. Signal RDDRV is a signal for controlling an operation of driver circuit 254.

Signals B0–B7 are signals indicative of bank addresses, signal Row is a row-related access identify signal instructing to activate a row-related circuit operation, signal Clm is a column-related access identify signal instructing to activate a column-related circuit operation, and signal ACT is a bank activation signal transmitted from control circuit 20.

The flag signal is a signal kept by level hold circuit 208 in response to that a bank is accessed (bank is hit), signal PC is a precharge signal transmitted from control circuit 20 and instructing a precharge operation of a selected bank, and signal APC is an all bank precharge signal transmitted from control circuit 20 and instructing a precharge operation of all banks.

Signal l.EQ is a local bit line equalize signal kept by level hold circuit 228, signal l.RXT is a local word line activation signal kept by level hold circuit 238, signal l.SE is a local sense amplifier activation signal kept by level hold circuit 248, and potential MWL corresponds to a potential level of a main word line in a memory cell block (bank). Signal Add.latch is an address signal kept by level hold circuit 256.

Next, the operation is described. At the rising edge of clock signal CLK at time t1, bit B7 of a decoded bank address is in the active state to allow a corresponding bank to be selected. At this time, signal Row is also in the active state and an active one-shot pulse is output from one-shot pulse generation circuit 204. Accordingly, signal ACT in the active state transmitted by command data bus 53b is driven by driver circuit 206, and the level of the active act signal ACT is kept by level hold circuit 208 as a flag signal.

Accordingly, driver control signal RDDRV supplied from driver control circuit 302 attains the active state ("H" level).

Hierarchical power supply control signal SCRC and signal SCRC2 attain the active state. The circuits in region 202 all operate by receiving supply potential Vcc and ground potential Vss. A row address-related switch (switch transistor for short-circuit) is set to ON state to short-circuit power supply lines in the row address-related circuit.

In response to activation of the flag signal, the level of signal EQ transmitted by command data bus 53b is kept by flip-flop circuit 224. The level of signal EQ taken by flip-flop circuit 224 is driven by driver circuit 226 to be kept by level keep circuit 228 as local bitline equalize signal l.EQ.

At time t2, signal RXT transmitted by command data bus 53b attains the active state and the level thereof is taken by flip-flop circuit 234. Accordingly, level hold circuit 238 maintains the level of local word line activation signal l.RXT in the active state.

In the period from time t1 to t2, a word line-related switch is set into ON state to short-circuit power supply lines in the circuit for selecting word lines.

A sense-related switch is set into ON state to short-circuit power supply lines in the peripheral circuitry of the sense amplifier.

At time t3, the level of signal SE transmitted by command data bus 53b attains the active state and the level thereof is taken by flip-flop circuit 244.

Accordingly, level hold circuit 248 maintains the level of local sense amplifier activation signal l.SE in the active state.

In response to activation of local word line activation signal l.RXT, the potential level of a main word line in a selected row changes to the active state ("H" level).

At the second clock (time t4), the row address-related switch is set into OFF state. After that (time t5), the word line-related switch is set into OFF state. In each circuit, power supply lines are set into the cutoff state.

An address signal transmitted via address bus 50c is latched by latch circuit 250 and predecoded by predecoder 252. The output of predecoder 252 is driven by driver circuit 254 and the level of row predecoder line PDL is driven to a corresponding level. The level of row predecoder line PDL allows signal SCRC to be in the inactive state ("L" level) at time t6. Similarly, RDDRV is set into the inactive state.

The period from time t1 to time 6 is a period necessary for the operation of the row-related circuit for one bank.

The inactive state of signal SCRC changes the operation mode of circuits included in region 202 to the one in which the leakage current decreases.

Local bitline equalize signal l.EQ, local word line activation signal l.RXT and local sense amplifier activation signal l.SE output respectively from level keep circuits 228, 238 and 248 keep respective levels.

At time t7, the sense-related switch is set to OFF state and power supply lines are set into the cutoff state.

At the rising edge of clock signal CLK at time t8, bank signal B7 and signal Row attain the active state and precharge signal PC also attains the active state. Consequently, NOR circuits 222, 232 and 242 is driven by a signal output from one-shot pulse generation circuit 214 receiving the level of signal PC input via driver circuit 210, and the levels of flip-flop circuits 224, 234 and 244 are reset.

Signals l.EQ, l.RXT and l.SE are reset according to the active state of signal SCRC at time t8. The level kept by latch circuit 250 is also reset according to activation of signal SCRC, and accordingly the level of row predecode line PDL is reset.

In the period from time t6 to time t8, the circuits included in region 202 are reset in order to reduce the leakage current. However, the levels of signal l.EQ, signal l.RXT, signal l.SE and row predecoder line PDL are all kept at their levels respectively.

After a fixed period (period from time t1 to time t6) for taking a command signal and an address signal for an activated bank, leakage current can be restricted by the hierarchical power supply structure concerning the circuits included in region 202. Therefore, reduction of the leakage current in the standby state as well as reduction of the leakage current in the period in which the bank is in the active state are possible. Further, it is possible to control the voltage level of the power supply lines for each row-related circuit independently.

Figure 16:
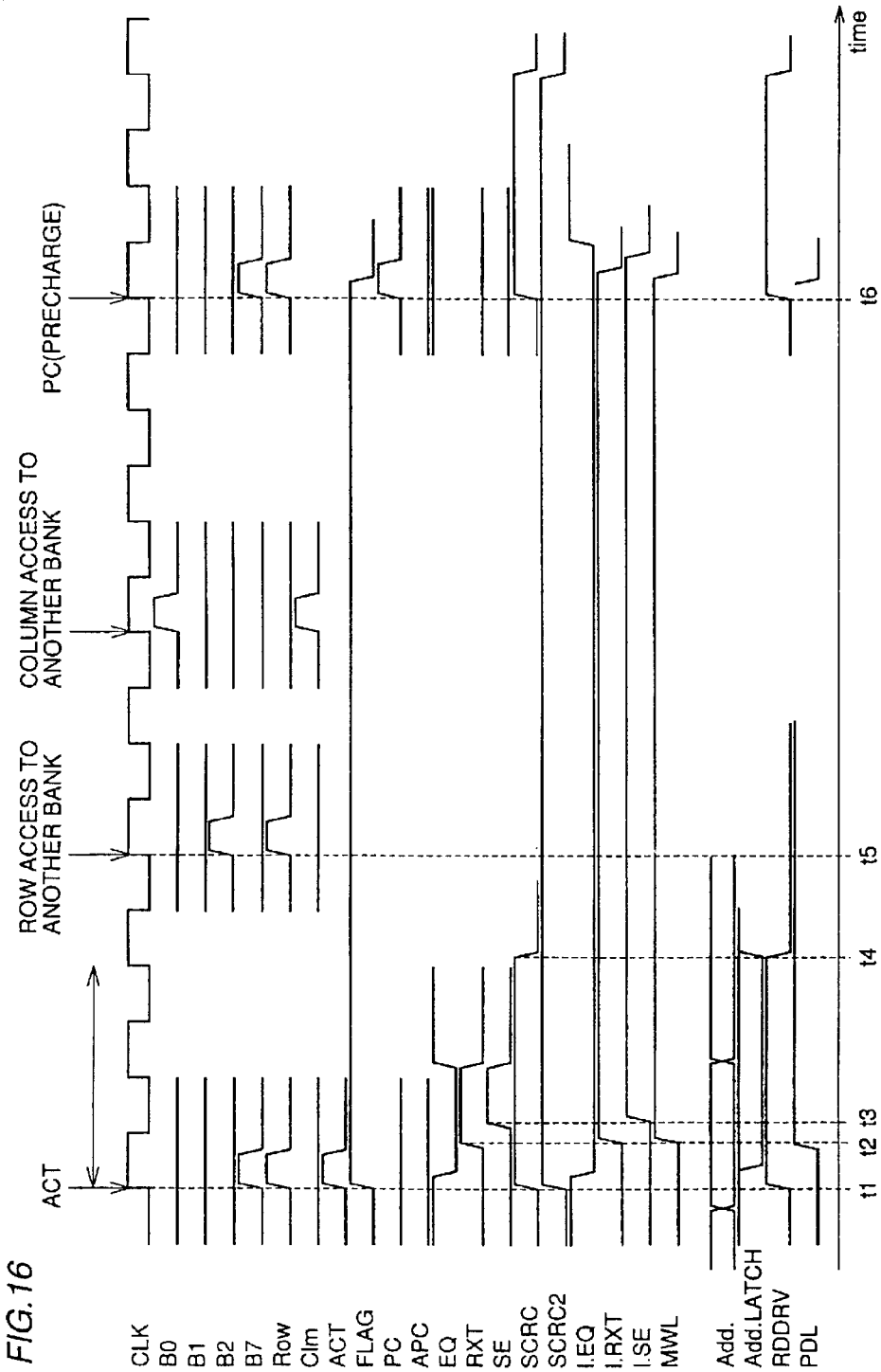
FIG. 16 is a timing chart provided for describing an operation in the case in which a plurality of different banks are successively accessed in the structure of row predecoder 36 shown in FIG. 13.

An operation which is executed when accesses are successively made to a plurality of different banks in the structure of row predecoder 36 shown in FIG. 13 will be described using the timing chart of FIG. 16.

At time t1, in response to the active state of bank address B7 and the active state of signal Row, the level of signal ACT in the active state is taken from command data bus 53b into level hold circuit 208 similarly to the operation shown in FIG. 15. Accordingly, the level of the flag output from level hold circuit 208 changes to "H" level.

An operation of a bank corresponding to bank address B7 is thereafter performed as shown in FIG. 15.

Next at time t5, bank address B2 and signal Row are set into the active state and a row access is made to a bank different from the one selected at time t1. At this time, signal RDDRV is not activated even if an access to another bank is set when the signal has been inactivated after it was activated once. Therefore, the level of a row predecoder line for a bank which is selected at time t1 maintains its original level.

In this process, the row address-related switch, the word line-related switch, and the sense-related switch are turned on/off at the timing shown in FIG. 15.

Reduction of power consumption in the standby cycle and the active cycle is possible by controlling, for example, the timing of short-circuit respectively at those sections related to the row address, the word line selection, and the sense as described above.

Regarding column-related circuits, a column decoder will be described as one example using FIG. 17.

Figure 17:
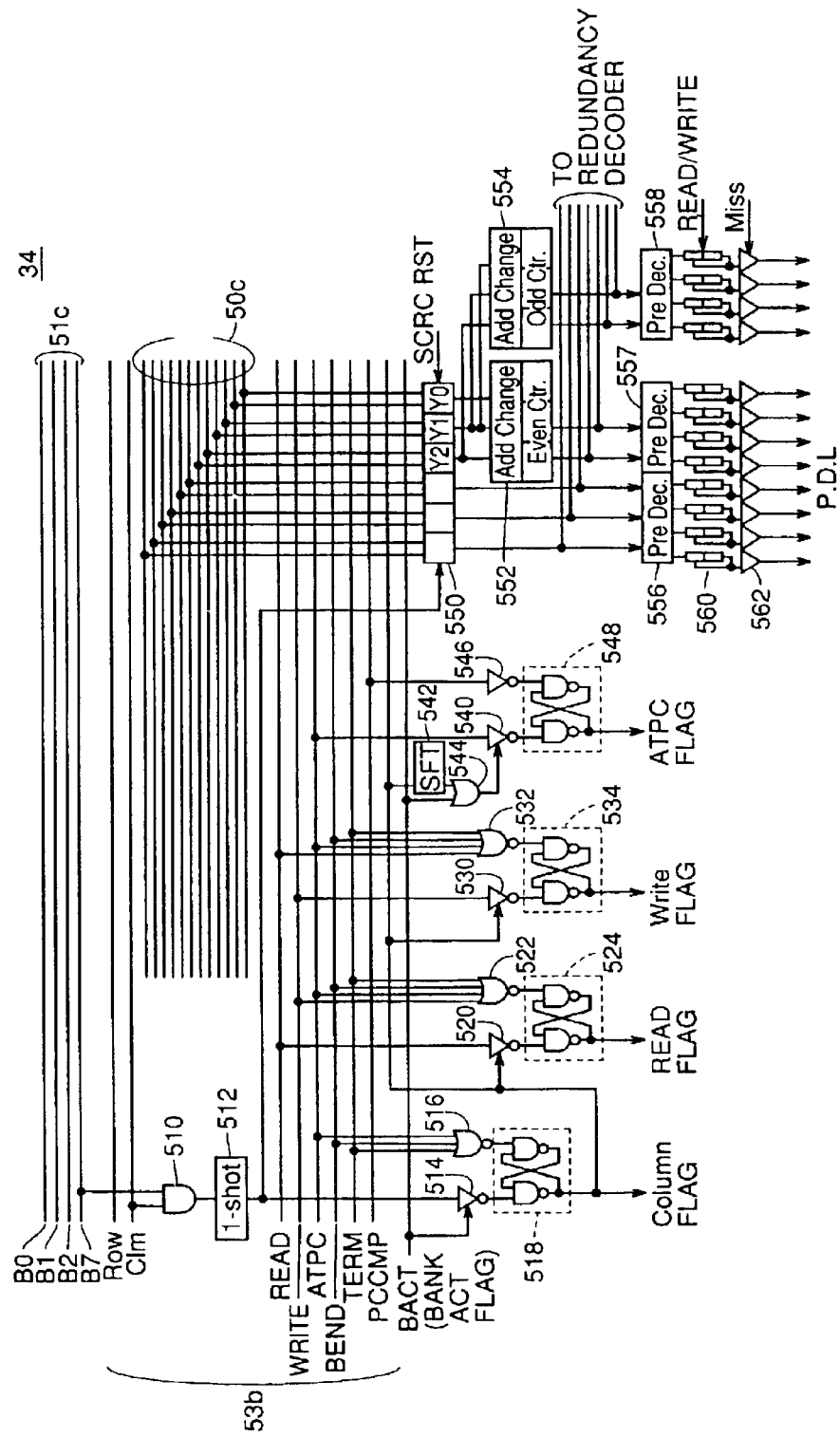
FIG. 17 is a schematic block diagram showing a structure of a column predecoder 34 according to the fourth embodiment of the present invention.

Referring to FIG. 17, from control circuit 20, a read-related access identify signal READ for instructing a reading operation, a write-related access identify signal WRITE for instructing a writing operation, an auto precharge identify signal ATPC for instructing an auto precharge operation, a burst ending identify signal BEND for instructing termination of a burst operation for each bank, a termination identify signal TERM for instructing to force termination of a column select operation when another bank is selected during the column select operation, and a precharge operation identify signal PCCMP for instructing termination of the precharge operation are transmitted via command data bus 53b.

A signal BACT is a flag signal which is kept by level keep circuit 208 as a bank is selected.

Column predecoder 34 includes an AND circuit 510 receiving signal Clm transmitted by command data bus 53b and bank address signal B7, a one-shot pulse generation circuit 512 outputting a one-shot pulse signal in response to activation of an output from AND circuit 510, an inverter circuit 514 activated in response to activation of flag signal BACT to drive an output from one-shot pulse generation circuit 512, an NOR circuit 516 receiving signals ATPC, BEND and TERM, and a flip-flop Circuit 518 set by an output from inverter circuit 514, reset by an output from NOR circuit 516 and indicates that a column-related operation is activated.

Column predecoder 34 further includes an inverter circuit 520 activated in response to activation of column flag signal ColumnFLAG to drive signal READ transmitted by command data bus 53b, an NOR circuit 522 receiving signals WRITE, ATPC, BEND and TERM, and a flip-flop circuit 524 set by an output from inverter circuit 520, reset by an output from NOR circuit 522, and outputs read flag signal READFLAG indicating that reading operation is activated.

Column predecoder 34 further includes an inverter circuit 530 activated in response to activation of column flag signal ColumnFLAG to drive signal WRITE transmitted by command data bus 53b, an NOR circuit 532 receiving signals READ, ATPC, BEND and TERM, and a flip-flop circuit 534 set by an output from inverter circuit 530, reset by an output from NOR circuit 532, and outputs write flag signal Write-FLAG indicating that writing operation is activated.

Column predecoder 34 further includes a shift circuit 542 receiving column flag signal ColumnFLAG to delay it by a prescribed clock period, an OR circuit 544 receiving flag signal BACT and an output from shift circuit 542, an inverter circuit 540 activated in response to activation of the output from OR circuit 544 to drive signal ATPC transmitted by command data bus 53b, an inverter circuit 546 receiving signal PCCMP transmitted by command data bus 53b, and a flip-flop circuit 548 set by an output from inverter circuit 540, reset by an output from inverter circuit 546 and outputs auto precharge flag signal ATPCFLAG indicating that auto precharge operation is activated.

Column predecoder 34 further includes a latch circuit 550 activated according to an output signal from one-shot pulse generation circuit 512 to take a column address signal transmitted by address bus 50c. Latch circuit 550 is reset in response to activation of signal SCRC.

Column predecoder 34 further includes an even number bit adjustment circuit 552 and an odd number bit adjustment circuit 554 adjusting the lower order bits of address signals corresponding to a column selection line (not shown) to be activated according to the lower order bits of column addresses kept by latch circuit 550, a predecoder 556 predecoding data of the higher order bits from latch circuit 550, a predecoder 557 predecoding data of the lower order bits from even number bit adjustment circuit 552, a predecoder 558 predecoding data of the lower order bits from odd number bit adjustment circuit 554, a shift circuit 560 activated by signal READ or signal WRITE to delay predecode signals from predecoders 556, 557 and 558 by a prescribed number of clocks (e.g. 2 clocks) to output them, and a drive circuit 562 activated by signal Miss indicating that an address from a redundancy decoder (not shown) does not correspond to a defective address, and drives, receiving an output from shift circuit 560, the level of a column predecode line according to an output signal from shift circuit 560.

The reading operation of column predecoder 34 shown in FIG. 17 and the states of the row-related circuits will be described using the timing charts of FIG. 18 and FIG. 19.

Figure 18:
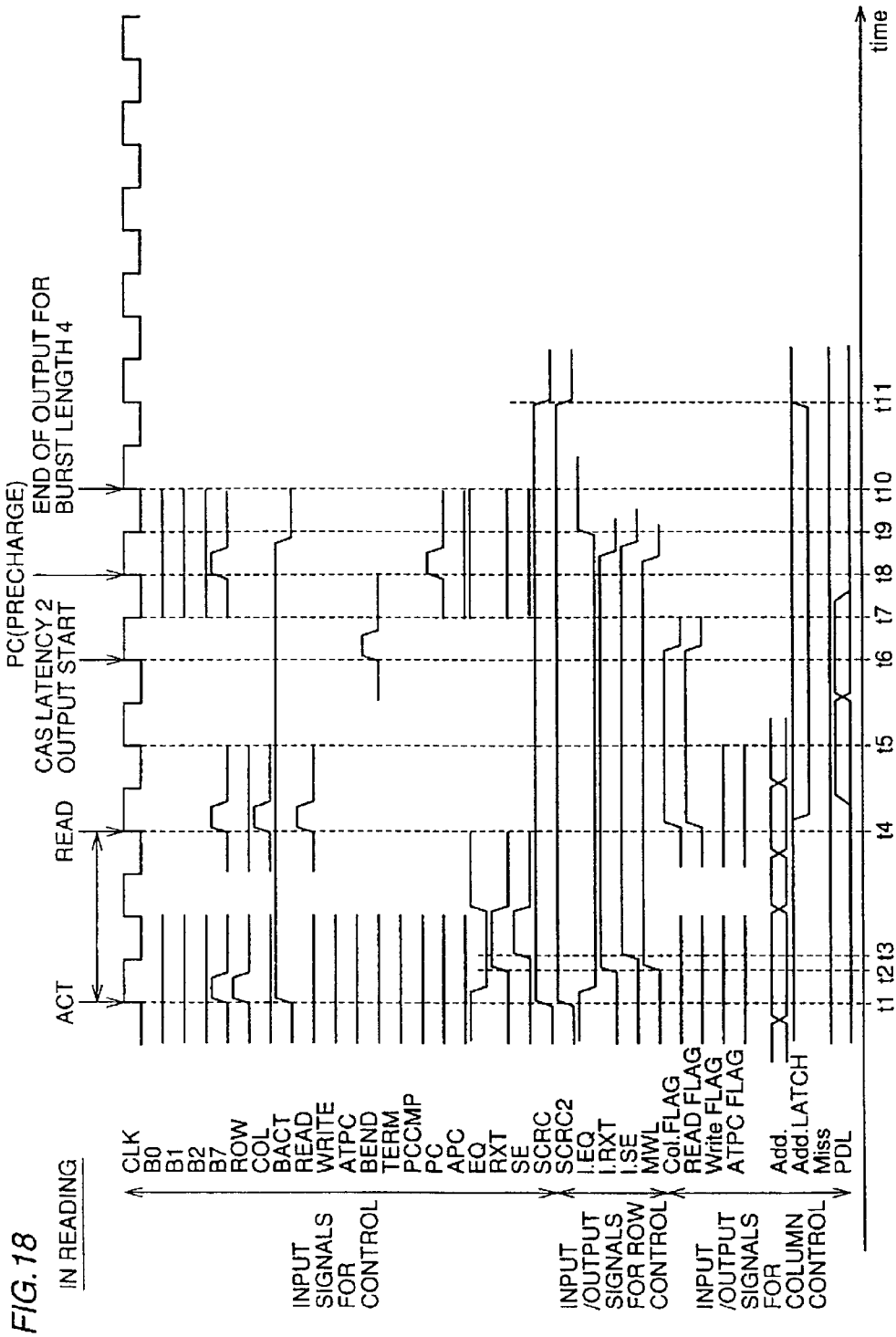
FIG. 18 is a timing chart provided for describing a reading operation of column predecoder 34 shown in FIG. 17.
Figure 19:
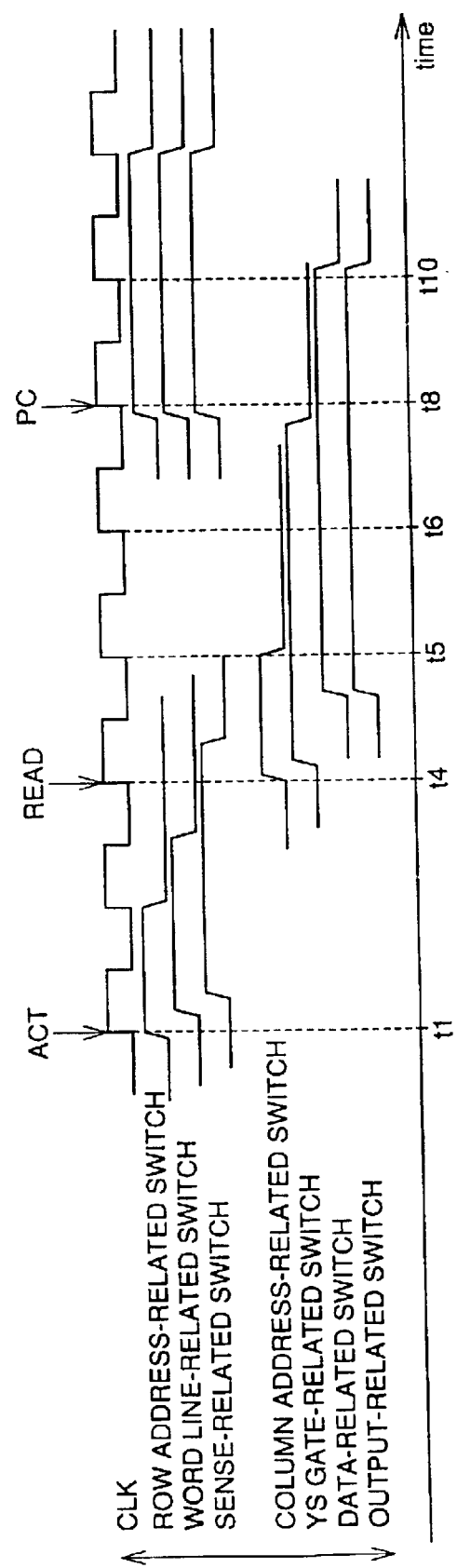
FIG. 19 is a timing chart provided for describing a reading operation of column predecoder 34 shown in FIG. 17.

Referring to FIGS. 18 and 19, at time t1, a selected bank is activated, local equalize signal l.EQ is inactivated in response to inactivation of equalize signal EQ, so that the equalized state of a bit line pair or the like in the selected bank is canceled. Signals SCRC and SCRC2 attain the active state.

From time t1, a row address-related switch, a word line-related switch, and a sense-related switch are set into ON state successively to set power supply lines into the short-circuit state. At a prescribed timing, those switches are set into OFF state to set the power supply lines into the cutoff state.

At time t2, word line activation signal RXT is activated, an operation of selecting any word line according to a row address signal is performed. At time t3, local sense amplifier activation signal l.SE is activated in response to activation of sense amplifier activation signal SE, and data of a plurality of selected memory cells are amplified as a corresponding bit line potential.

At time t4, flag signals ColumnFLAG and READFLAG are activated when signal READ is activated to designate the reading operation. On the other hand, a column address signal is taken by the selected bank, data in the selected memory cells are read out from the bank to be kept at time t5 and t6. At time t6, signal BEND is activated in response to termination of reading trigger of data corresponding to a burst length of 4.

The period from time t1 to t4 corresponds to a period which is necessary for the operation of a row-related circuit for one bank.

From time t4, a column address-related switch, a YS gate-related switch, a data-related switch and an output-related switch are successively set into ON state to set power supply lines into the short-circuit state. At a prescribed timing, each of the switches is set into OFF state to set power supply lines into the cutoff state.

According to the rise and fall of clock signal CLK at time t6 and t7, data read from the bank to be kept at time t5 is parallel-serial converted to be output.

According to the rise and fall of clock signal CLK at time t8 and t9, data read and kept by the bank at the time t6 is parallel-serial converted to be output.

At time t8, the selected bank is precharged in response to activation of signal PC.

At time t10, output of data corresponding to the burst length of 4 is completed.

At time t11, signal SCRC enters the inactive state and the operation mode changes to the one operating by the hierarchical power supply to allow a small leakage current.

As heretofore described, reduction of power consumption in the standby cycle and the active cycle is possible by controlling the timing of short-circuit of, for example, the column address-related, YS gate-related, data-related, output-related circuits.

(Fifth Embodiment)

A hierarchical power supply system in a semiconductor integrated circuit device according to the fifth embodiment of the present invention will be described using FIG. 20.

Figure 20:
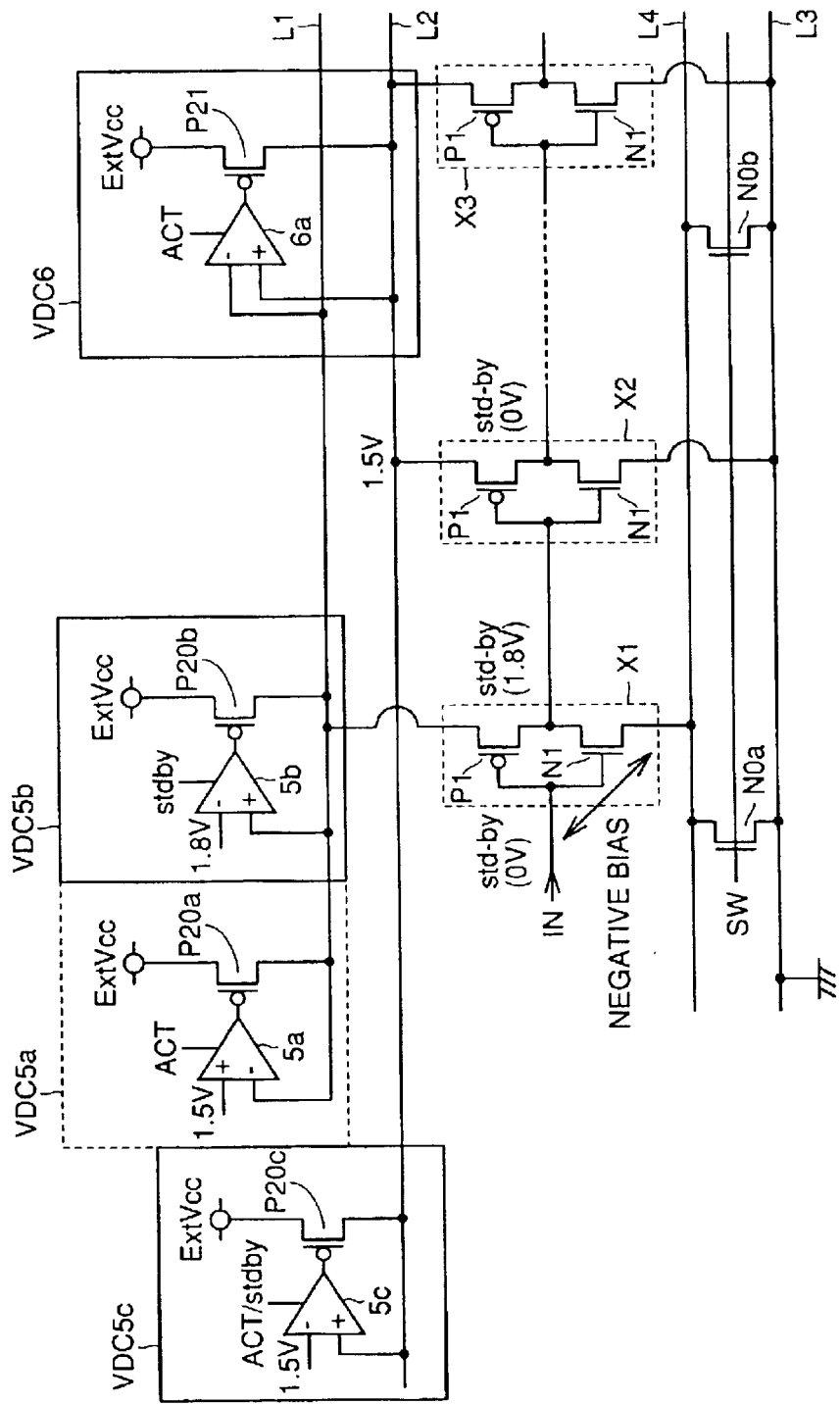
FIG. 20 shows a structure of a hierarchical power supply system according to the fifth embodiment of the invention.

Inverters X1, X2 and X3 are representatively shown in FIG. 20 as forming a structure of an internal circuit. Inverters X1, X2 and X3 each include a PMOS transistor P1 and an NMOS transistor N1 and have a structure of a CMOS inverter.

For a main power supply line L1, internal supply voltage-down converters VDC5a and VDC5b generating a fixed potential decreased from the level of external supply voltage ExtVcc are arranged. For a sub-supply line L2, an internal supply voltage-down converter VDC5c generating a fixed potential reduced from the level of external power supply voltage ExtVcc is arranged.

Internal supply voltage-down converter VDC5a includes a differential amplifier 5a and a PMOS transistor P20a. PMOS transistor P20a has one conduction terminal connected to external supply voltage ExtVcc and the other conduction terminal connected to main supply line L1. The gate electrode of PMOS transistor P20a receives an output from differential amplifier 5a. Differential amplifier 5a receives at its input reference voltage (1.5V) and voltage Vcc of main supply line L1. Differential amplifier 5a operates in response to signal ACT (active cycle).

Internal supply voltage-down converter VDC5b includes a differential amplifier 5b and a PMOS transistor P20b. PMOS transistor P20b has one conduction terminal connected to external supply voltage ExtVcc and the other conduction terminal connected to main supply line L1. The gate electrode of PMOS transistor P20b receives an output from differential amplifier 5b. Differential amplifier 5b receives a higher reference voltage (1.8V) and voltage Vcc of main supply line L1 at its input. Differential amplifier 5b operates in the standby cycle (in response to signal stdby).

Internal supply voltage-down converter VDC5c includes a differential amplifier 5c and a PMOS transistor P20c. One conduction terminal of PMOS transistor P20c is connected to external supply voltage ExtVcc, and the other conduction terminal is connected to sub-supply line L2. The gate electrode of PMOS transistor P20c receives an output from differential amplifier 5c. Differential amplifier 5c receives reference voltage (1.5V) and voltage SubVcc of sub-supply line L2 at its input. Differential amplifier 5c operates in both of the standby cycle (signal stdby) and the active cycle (signal ACT).

Further, instead of the switching transistors, a plurality of internal supply voltage-down converters VDC6 are arranged between main supply line L1 and sub-supply line L2 at prescribed intervals (hereinafter referred to as dispersed voltage-down converters VDC6).

Dispersed voltage-down converters VDC6 each include a differential amplifier 6a and a PMOS transistor P21. One conduction terminal of PMOS transistor P21 is connected to external supply voltage ExtVcc and the other conduction terminal thereof is connected to sub-supply line L2. The gate electrode of PMOS transistor P21 receives an output from differential amplifier 6a. Differential amplifier 6a receives at its input voltage Vcc of main supply line L1 and voltage SubVcc of sub-supply line L2. Differential amplifier 6a operates in response to signal ACT.

In the conventional hierarchical power supply system, voltage SubVcc of sub-supply line L2 is reduced in the standby cycle. Therefore, recovery time of voltage is necessary when the cycle transits from the standby cycle to the active cycle.

According to the fifth embodiment, in the standby cycle, voltage Vcc of main supply line L1 is boosted to increase the gate voltage in order to restrict the leakage current. Accordingly, the effective voltage immediately after transition to the active cycle is ensured.

Dispersed voltage-down converter VDC6 is used to restrict decrease of voltage of sub-supply line L2 in the active cycle (due to the switching transistor). Dispersed voltage-down converter VDC6 uses voltage Vcc of main supply line L1 as a reference voltage. Therefore, any power supply interconnection used for reference is unnecessary and the degree of freedom of arrangement of dispersed voltage down converters enhanced.

Between a main ground line L3 and a sub-ground line L4, switching transistors N0a, N0b . . . electrically connecting main ground line L3 and sub-ground line L4 in response to hierarchical supply control signal SW are dispersed at prescribed intervals. As a result, the impedance due to power supply and ground potential is reduced. The hierarchical power supply system according to the fifth embodiment of the present invention is hereinafter referred to as DLCC system.

Figure 21:
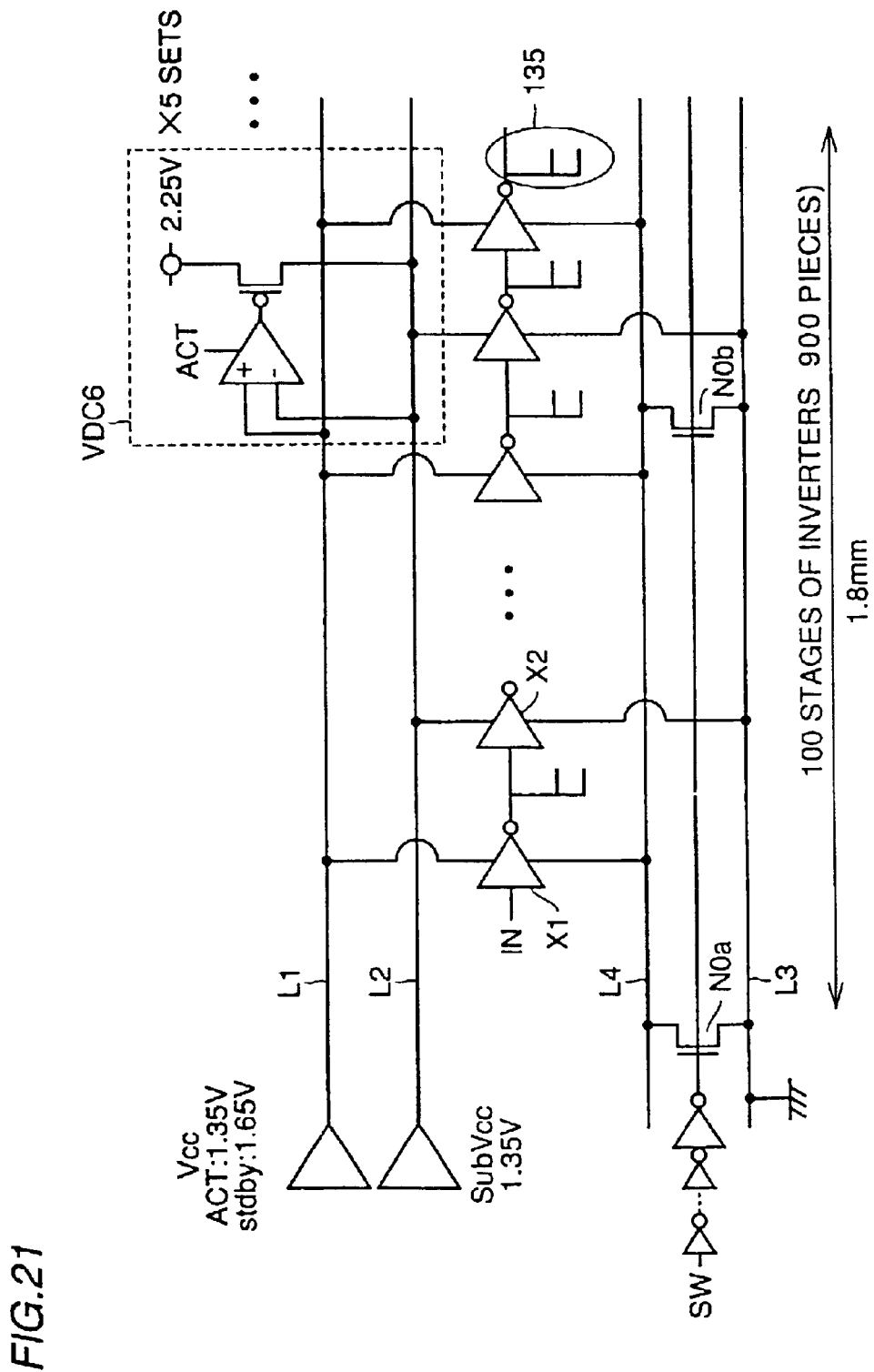
FIG. 21 shows a structure of a simulation applied for making sure of an operation of a DLCC system according to the fifth embodiment of the invention.
Figures 22, 23:
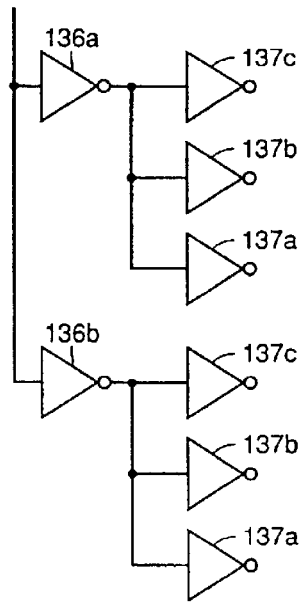
FIG. 22 shows a structure of a load inverter 135 connected to an inverter chain shown in FIG. 21.
FIG. 23 shows specific conditions of the simulation illustrated in FIG. 21.

Using FIGS. 21–23, the simulation executed for confirming the operation of DLCC system shown in FIG. 20 is described.

FIG. 21 illustrates a structure for the simulation for making sure of the operation of DLCC system in the fifth embodiment.

Referring to FIG. 21, the inverter chain is formed of 100 stages (X1, X2, . . . ). Between inverters, load inverters 135 shown in FIG. 22 are connected. Load inverters 135 each include a plurality of inverters 136a and 136b as illustrated in FIG. 22. To each of inverters 136a and 136b, a plurality of inverters 137a, 137b and 137c are connected.

Total five dispersed voltage-down converters VDC6 are arranged at prescribed intervals. Total five switching transistors N0a, N0b, . . . are arranged at prescribed intervals. Switching transistors N0a . . . that are NMOS transistors are turned on/off by hierarchical power supply control signal SW.

FIG. 23 shows specific conditions for the simulation shown in FIG. 21.

Referring to FIG. 23, suppose that main supply line L1 and main ground line L3 are aluminum interconnections having a width of 10 $\mu$m, and sub-supply line L2 and sub-ground line L4 are aluminum interconnections having a width of 5 $\mu$m. The length of each line is 1.8 mm.

External supply voltage ExtVcc is set at 2.25V (90% of 2.5V) and internal supply voltage Vdd is set at 1.35V (90% of 1.5V). The threshold values (Vthp, Vthn), length (Lb, Ln), width (Wp, Wn) of the switching transistor, the threshold values (Vthp, Vthn), length (Lp, Ln), width (Wp, Wn) and the like of the inverter are shown in FIG. 23.

Voltage Vcc of main supply line L1 is set at 1.35V in the active cycle and driven to 1.65V in the standby cycle. To the well of the PMOS transistor, voltage variation similar to that applied to voltage Vcc of main supply line L1 is applied. Voltage SubVcc of sub-supply line L2 is set at 1.35V.

The results of the simulation for the conventional hierarchical power supply system and for the DLCC system are compared with each other to be examined using FIGS. 24–28.

Figure 24:
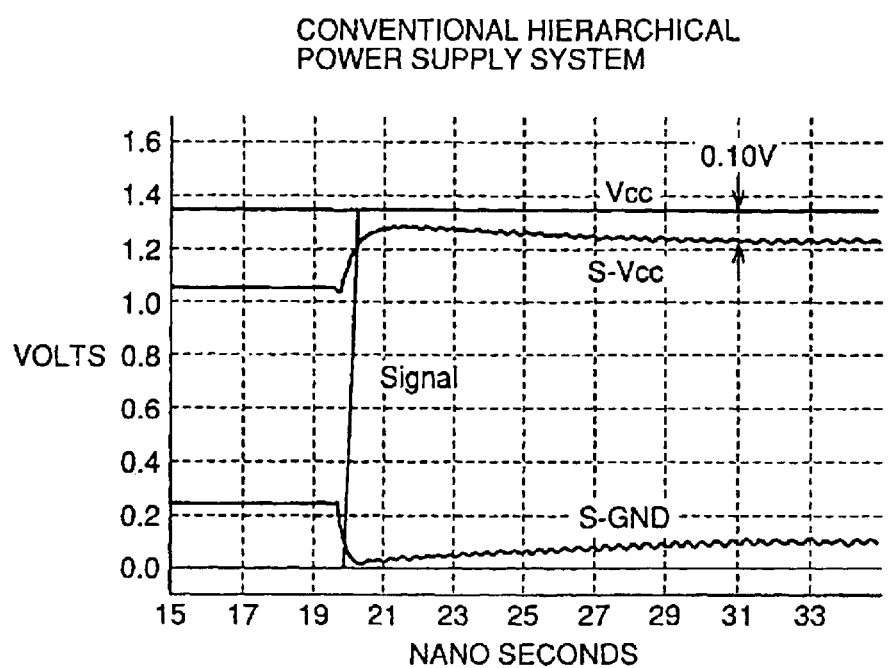
FIG. 24 graphically shows simulation waveforms of a conventional hierarchical power supply system.
Figure 25:
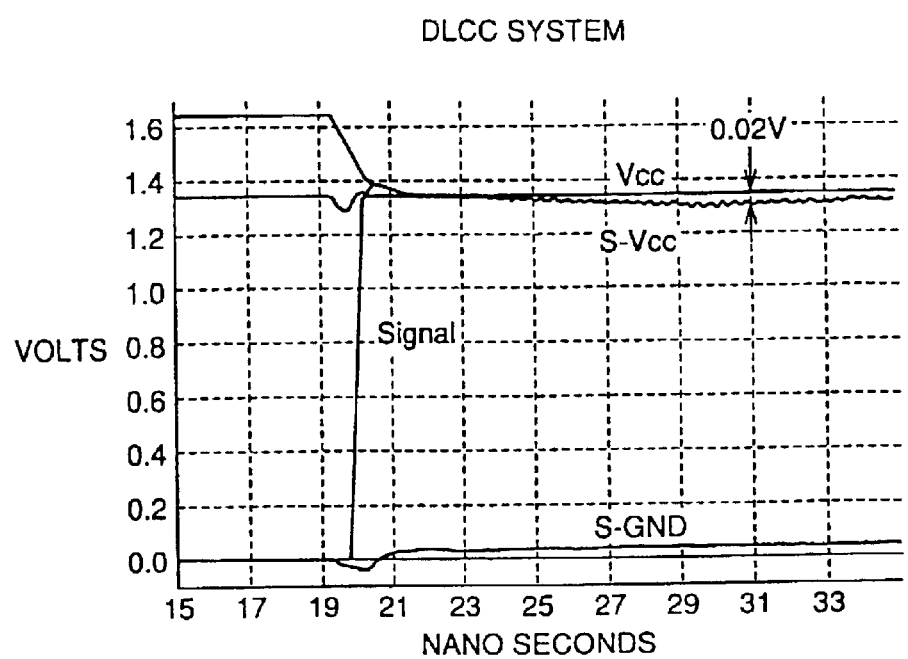
FIG. 25 graphically shows simulation waveforms of the DLCC system.

FIG. 24 graphically shows simulation waveforms of the conventional hierarchical power supply system, and FIG. 25 graphically shows simulation waveforms of DLCC system. In each graph, the ordinate represents volt, and the abscissa represents time (ns). In both simulation, a signal (Signal) is applied around 19–20 ns. In FIGS. 24 and 25, symbol Vcc represents the voltage of main supply line L1, symbol S-Vcc represents the voltage of sub-supply line L2, and the symbol S-GND represents the voltage of sub-ground line L4.

In the conventional hierarchical power supply system, as shown in FIG. 24, the voltage of sub-supply line L2 is decreased from 0.1V (voltage of main supply line L1) by about 1.35V. In DLCC system, as shown in FIG. 25, the decrease of voltage of sub-supply line L2 is approximately 0.02V.

Figure 26:
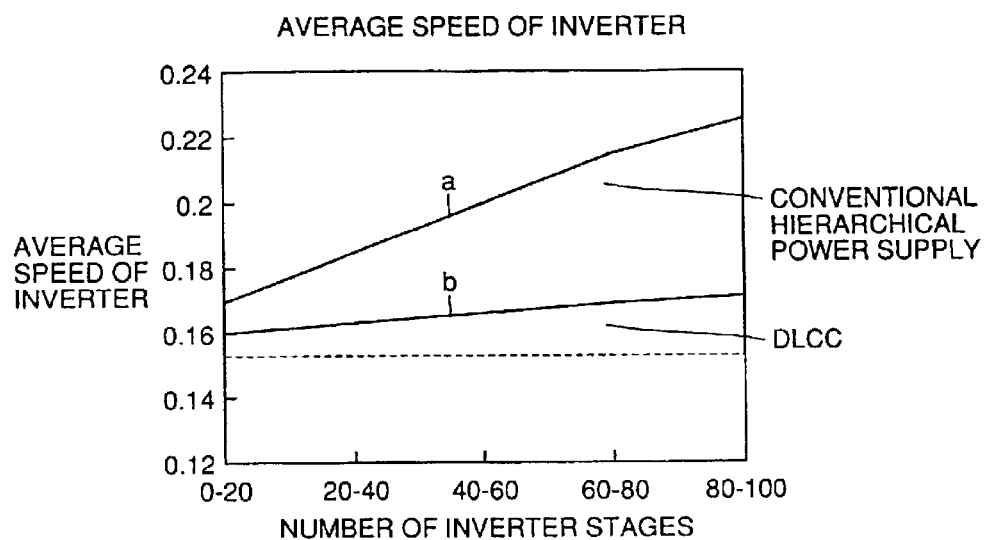
FIG. 26 graphically shows an inverter speed for comparison in the simulation according to the fifth embodiment of the invention.

In FIG. 26, the switching transistor is always set in ON state and the inverter speed is compared based on the number of stages of the inverters from the position of the switching transistor. In FIG. 26, the solid line a and the solid line b respectively correspond to the conventional hierarchical power supply system and DLCC system. For DLCC system, the number of inverters from the position of the dispersed voltage-down converter VDC6 corresponds to the abscissa.

As shown in FIG. 26, in DLCC system, the influence of the interconnection resistance reduces, and the processing speed is apparently improved irrespective of the number of stages of the inverters.

Concerning the average speed of the inverters formed of 100 stages, in DLCC system, increase of speed is accomplished by 32% compared with the case in which the threshold value approximately equal to the conventional one is used, and by 20% compared with the conventional hierarchical power supply system.

Figure 27:
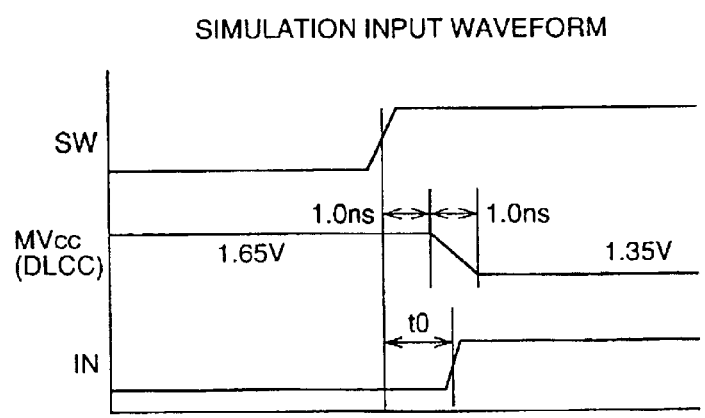
FIG. 27 shows conditions for measuring delay of the inverter chain in the DLCC system.
Figure 28:
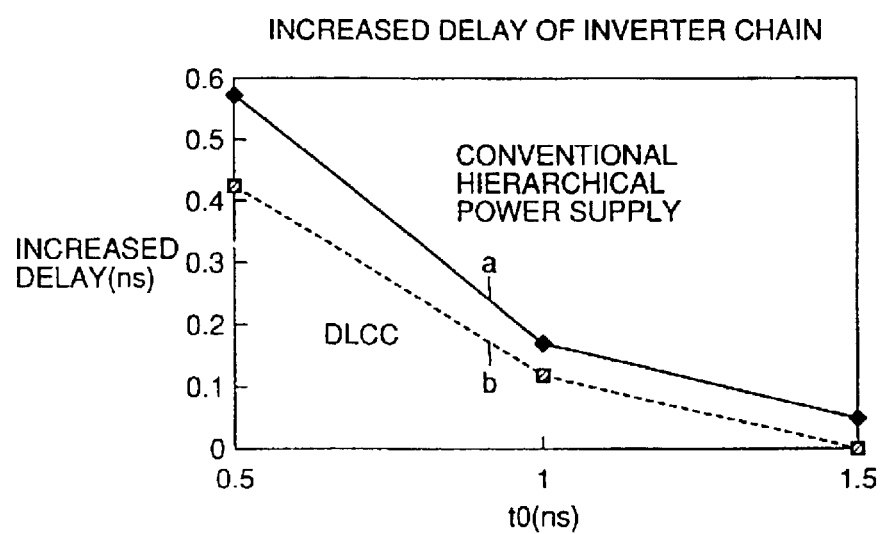
FIG. 28 graphically shows delay of the inverter chain generated when the voltage of the supply line recovers after it changed.

FIG. 28 illustrates the delay of the inverter chain under the conditions shown in FIG. 27. The result of measurement of the delay of the inverter chain occurred upon recovery from change of the voltage of the power supply line is shown in FIGS. 27 and 28.

Referring to FIG. 27, a signal to be input to the inverter is supplied to second after the ON timing of the switching transistor. FIG. 28 graphically shows the result of measurement of the increase in the delay of the inverter chain at this time. For DLCC system, the voltage of main supply line L1 (MVcc) is varied as shown in FIG. 27.

The solid line a of FIG. 28 shows the amount of increase in the delay in the conventional hierarchical power supply system, and the solid line b shows the amount of increase in the delay in DLCC system.

Referring to FIG. 28, in DLCC system, delay is improved by approximately 0.05 ns compared with the conventional hierarchical power supply system. If to is set to about 1.5 ns, the delay could be avoided.

As heretofore described, according to the fifth embodiment, the hierarchical power supply system (DLCC system) restricts decrease of voltage of sub-supply line L2 in the active cycle, and the average speed of the inverter can be improved. Further, it is possible to restrict the influence due to the recovery of the operation power supply to avoid the delay of the inverter chain.

In the structure of the present invention, the potential of the sub-supply line is applied from the external potential in operation only on the power supply side. As a result, decrease of the potential on the power supply side can be reduced. This method is apparently applicable to the power supply line on the ground potential side.

(Sixth Embodiment)

Description of a semiconductor integrated circuit device according to the sixth embodiment will be given below. The semiconductor integrated circuit device according to the sixth embodiment allows a test of the leakage current to be conducted for the hierarchical power supply system.

Figure 29:
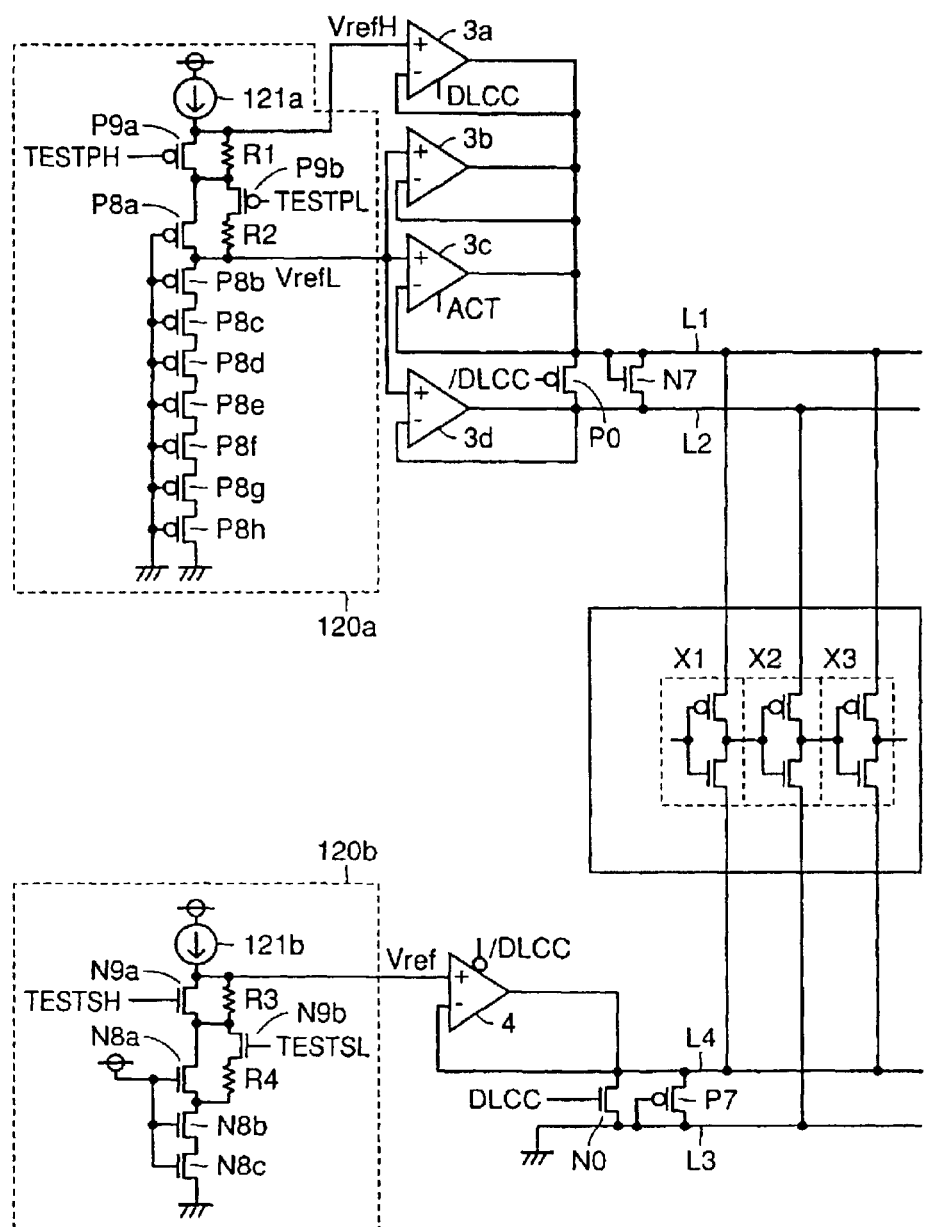
FIG. 29 shows a structure of a main portion of leakage current test circuits 120a and 120b according to the sixth embodiment of the invention.

Referring to FIG. 29, leakage current test circuits 120a and 120b according to the sixth embodiment are described.

For an internal circuit formed of inverters X1, X2 and X3, a main supply line L1, a sub-supply line L2, a main ground line L3 and a sub-ground line L4 are arranged. Between main supply line L1 and sub-supply line L2, a switching transistor P0 is connected. A switching transistor N0 is connected between main ground line L3 and sub-ground line L4.

Further, between main supply line L1 and sub-supply line L2, a diode-connected NMOS transistor N7 is provided in order to prevent the difference of the potential level from being increased to exceed a fixed potential difference. Between main ground line L3 and sub-ground line L4, a diode-connected PMOS transistor P7 is connected for preventing the potential difference from being increased to exceed a constant value.

Switching transistor P0 receives hierarchical power supply control signal /DLCC at its gate electrode. Switching transistor N0 receives hierarchical power supply control signal DLCC at its gate electrode.

For main supply line L1, differential amplifiers 3a, 3b and 3c are provided. For sub-supply line L2, a differential amplifier 3d is provided. Differential amplifier 3a attains the active state in response to control signal DLCC. Differential amplifier 3c attains the active state in response to act signal ACT.

A differential amplifier 4 is arranged for sub-ground line L4. Differential amplifier 4 attains the active state in response to control signal /DLCC.

For differential amplifiers 3a, 3b, 3c and 3d, leakage current test circuit 120a is arranged. For differential amplifier 4, leakage current test circuit 120b is arranged.

Leakage current test circuit 120a includes a constant current source 121a, resistors R1 and R2, and PMOS transistors P9a, P9b, P8a, P8b . . . P8a1. Between supply potential and ground potential, constant current source 121a, PMOS transistors P9a and P8a . . . P8h are connected in series. The gate electrode of PMOS transistor P9a receives test signal TESTPH. The gate electrodes of PMOS transistors P8a . . . P8h are connected to the ground potential.

Resistor R1, PMOS transistor P9b and resistor R2 are connected in series between constant current source 121a and the connection node of PMOS transistors P8a and P8b. The connection node of resistor R1 and PMOS transistor P9b is connected to the connection node of PMOS transistors P9a and P8a. The gate electrode of PMOS transistor P9b receives test signal TESTPL.

Leakage current test circuit 120b includes a constant current source 121b, NMOS transistors N9a, N9b, N8a . . .

N8c and resistors R3 and R4. Between the supply potential and the ground potential, constant current source 121b, NMOS transistor N9a, and NMOS transistors P8a . . . P8c are connected in series. The gate electrode of NMOS transistor N9a receives test signal TESTSH. The gate electrodes of NMOS transistors N8a . . . are connected to the supply potential.

Resistor R3, NMOS transistor N9b and resistor R4 are connected in series between constant current source 121b and the connection node of NMOS transistors N8a and N8b. The connection node of resistor R3 and NMOS transistor N9b is connected to the connection node of NMOS transistors N9a and N8a. The gate electrode of NMOS transistor N9b receives test signal TESTSL.

The voltage on the output node of constant current source 121a is referred to as reference voltage VrefH. The voltage on the connection node of NMOS transistors P8a and P8b is referred to as VrefL. The voltage on the output node of constant current source 121b is referred to as reference voltage Vref.

Differential amplifier 4 receives at its input reference voltage Vref and the voltage of sub-ground line L4. Differential amplifier 3a receives at its input reference voltage VrefH and the voltage of main supply line L1. Differential amplifier 3b receives at its input reference voltage VrefL and the voltage of main supply line L1. Differential amplifier 3c receives at its input reference voltage VrefL and the voltage of main supply line L1. Differential amplifier 3d receives reference voltage VrefL and voltage of sub-supply line L2 at its input.

The current flowing from constant current source 121a and the resistor element produce the reference potential to adjust the potential of main supply line L1 and sub-supply line L2. The reference potential is produced by the current flowing from constant current source 121b and the resistor element, and the potential of main ground line L3 and sub-ground line L4 is adjusted.

Leakage current test circuit 120a is now described. In a normal mode, test signal TESTPH is in the state of L level, and test signal TESTPL is in the state of H level.

In the standby cycle, there is a fixed potential difference generated by PMOS transistor P8a between reference voltage VrefH and reference voltage VrefL.

In the test mode, test signal TESTPH is set at H level. Accordingly, PMOS transistor P9a is set into OFF state. Reference voltage VrefH has a value higher than reference voltage VrefL by potential generated at resistor R1. Consequently, voltage Vcc of main supply line L1 in the standby cycle can be set higher than voltage SubVcc of sub-supply line L2.

When test signal TESTPL is set at L level, PMOS transistor P9b attains ON state. Accordingly, reference voltage VrefH changes to the voltage higher than reference voltage VrefL by potential generated at resistor R2.

Voltage Vcc of main supply line L1 in the standby cycle can be set lower than voltage SubVcc of sub-supply line L2 compared with the normal operation by setting reference voltage VrefH lower than the potential generated by the PMOS transistor. Leakage current test becomes possible since the leakage current thus increases.

Leakage current test circuit 120b is next described. In the normal mode, test signal TESTSH is in the state of H level and test signal TESTSL in the state of L level.

In the standby cycle, the voltage level of sub-ground line L4 is set higher than the ground potential, and accordingly a fixed potential difference is generated between reference voltage Vref and ground potential.

In the test mode, test signal TESTSH is set at L level. NMOS transistor N9a is accordingly set into OFF state. Reference voltage Vref changes to voltage higher than ground potential by potential generated at resistor R3. As a result, voltage SubVss of sub-ground line L4 in the standby cycle can be set higher than voltage Vss of main ground line L3.

When test signal TESTSL is set at H level, NMOS transistor N9b attains ON state. Consequently, reference voltage Vref changes to potential higher than ground potential Vss by potential generated by channel resistance of two NMOS transistors and resistor R4.

By setting the reference voltage Vref lower than the one generated by resistors R3 and R4, voltage SubVss of sub-ground line L4 in the standby cycle can be set lower than voltage Vss of main ground line L3 compared with the normal operation. As a result, the leakage current increases to allow the leakage current test to be performed.

(Seventh Embodiment)

A semiconductor integrated circuit device according to the seventh embodiment of the present invention will be described below. The semiconductor integrated circuit device according to the seventh embodiment makes it possible to externally monitor the leakage current test performed for the hierarchical power supply system.

Figure 30:
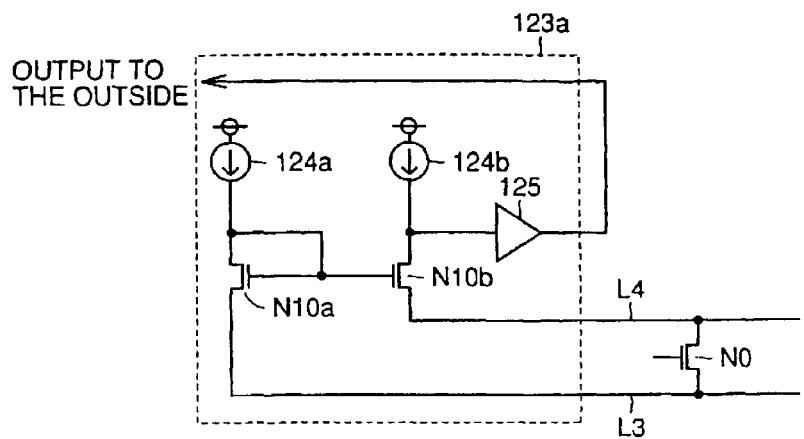
FIG. 30 shows a structure of a main portion of a leakage current test circuit according to the seventh embodiment of the invention.

A leakage current test circuit 123a of the seventh embodiment is described using FIG. 30.

Leakage current test circuit 123a shown in FIG. 30 includes constant current sources 124a and 124b, NMOS transistors N10a and N10b, and a buffer 125. NMOS transistor N10a is diode-connected.

NMOS transistors N10a and N10b connected as the current mirror are respectively connected to a main ground line L3 and a sub-ground line L4. A switching transistor N0 is connected to main ground line L3 and sub-ground line L4.

Reference current flows from constant current source 124a into NMOS transistor N10a. Reference current also flows from constant current source 124b into NMOS transistor N10b.

Buffer 125 is arranged at the connection node of constant current source 124b and NMOS transistor N10b. The output node of buffer 125 is connected to an external terminal.

If voltage Vss of main ground line L3 and voltage SubVss of sub-ground line L4 have the same level, negative bias is never applied to respective gate electrodes of NMOS transistors N10a and N10b. In this case, the amount of reference current flowing into the transistors is almost balanced.

If the leakage current decreases, voltage SubVss of sub-ground line L4 is higher relative to voltage Vss of main ground line L3. In this case, the amount of reference current flowing into NMOS transistor N10b connected to sub-ground line L4 is lower relative to the amount of reference current flowing into NMOS transistor N10a connected to main ground line L3. (The ratio of the amount of the reference current corresponds to the ratio of decrease of the leakage current.)

The current of constant current source 124b is accumulated at buffer 125. When the accumulated current exceeds a logical threshold value of buffer 125, a logical value is generated. The logical threshold value can be monitored at the external terminal.

Figure 31:
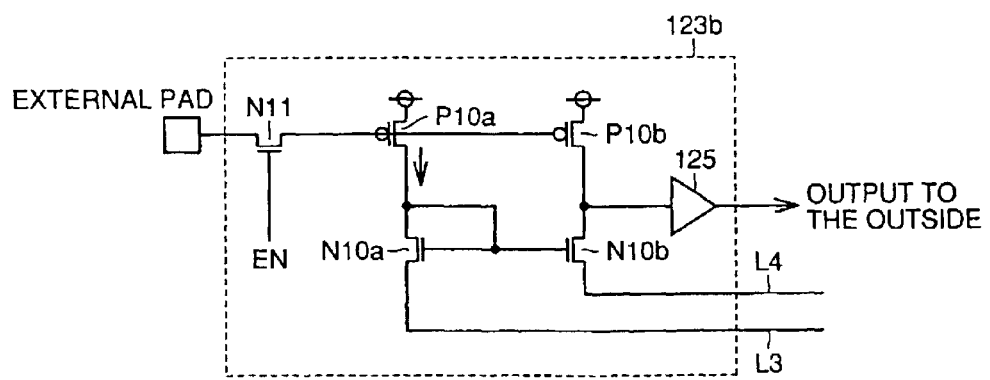
FIGS. 31 and 32 are circuit diagrams illustrating examples of the leakage current test circuit according to the seventh embodiment of the invention.

Another leakage current test circuit 123b according to the seventh embodiment is described using FIG. 31.

In the leakage current test circuit 123b shown in FIG. 31, a PMOS transistor P10a is provided instead of constant current source 124a shown in FIG. 30, and a PMOS transistor P10b is provided instead of constant current source 124b. One conduction terminal of an NMOS transistor N11 is connected to an external pad. One conduction terminal of each of PMOS transistors P10a and P10b is connected to supply potential.

The gate electrodes of PMOS transistors P10a and P10b are connected to the other conduction terminal of NMOS transistor N11. Receiving enable signal EN for test, NMOS transistor N11 attains ON state to allow the potential of the external pad to be supplied to the gate electrodes of PMOS transistors P10a and P10b. As a result, the amount of reference current flowing externally into NMOS transistors N10a and N10b can be changed externally.

Figure 32:
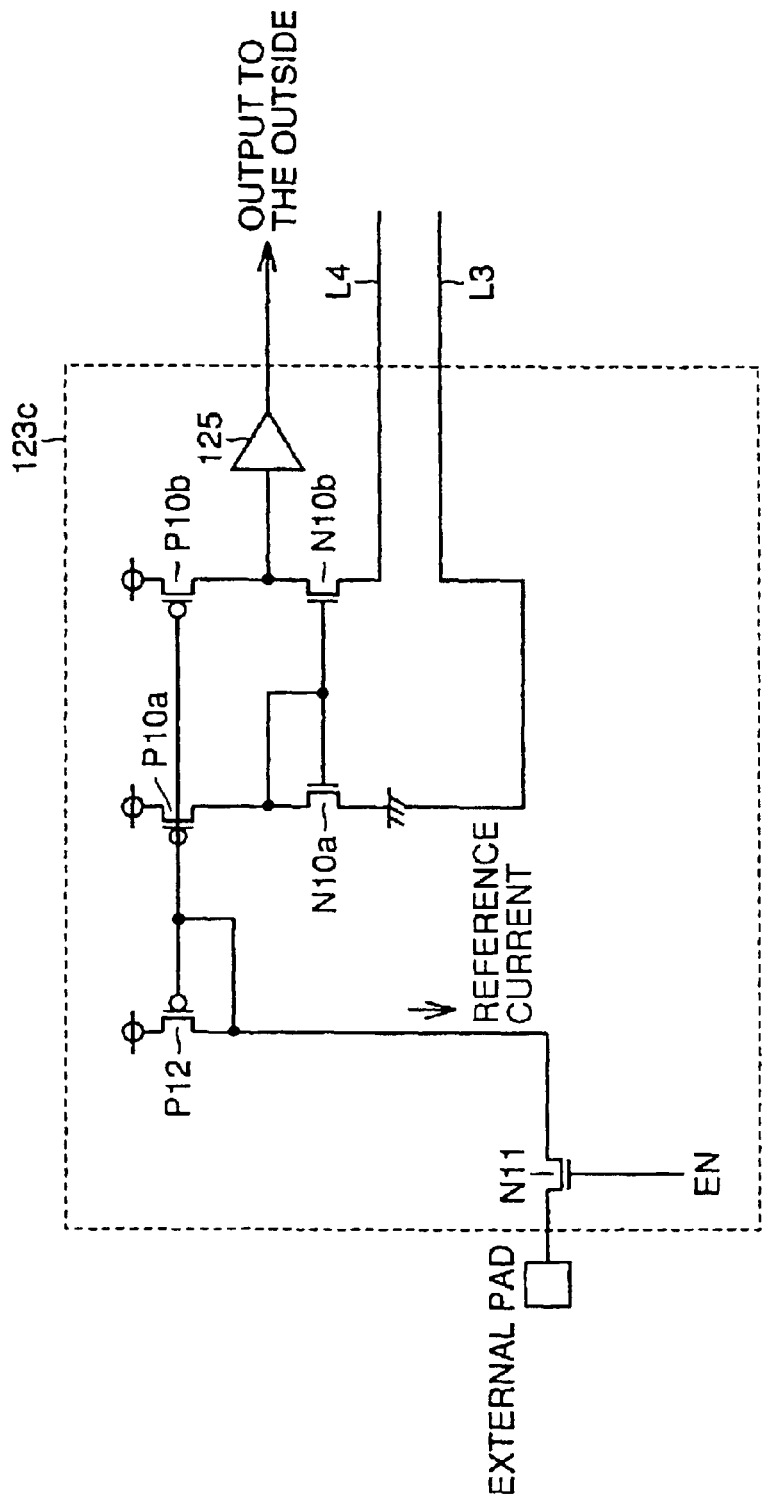

Using FIG. 32, still another leakage current test circuit 123c according to the seventh embodiment is described.

In leakage current test circuit 123c shown in FIG. 32, PMOS transistor P12 connected as the current mirror is provided between one conduction terminal of an NMOS transistor N11 and gate electrodes of PMOS transistors P10a and P10b. Receiving any input from the outside, current is generated at PMOS transistors P12 and P10a.

Configured in this manner, this embodiment allows the leakage current to be monitored externally.

(Eighth Embodiment)

A semiconductor integrated circuit device according to the eighth embodiment of the present invention is next described. In the semiconductor integrated circuit device of the eighth embodiment, the transition of the leakage current due to the switching transistor of the hierarchical power supply system is monitored to be changed.

A leakage current test circuit 126 according to the eighth embodiment will be described using FIG. 33. Those components similar to those of leakage current test circuit 123a have the same reference characters and description thereof is omitted.

Figure 33:
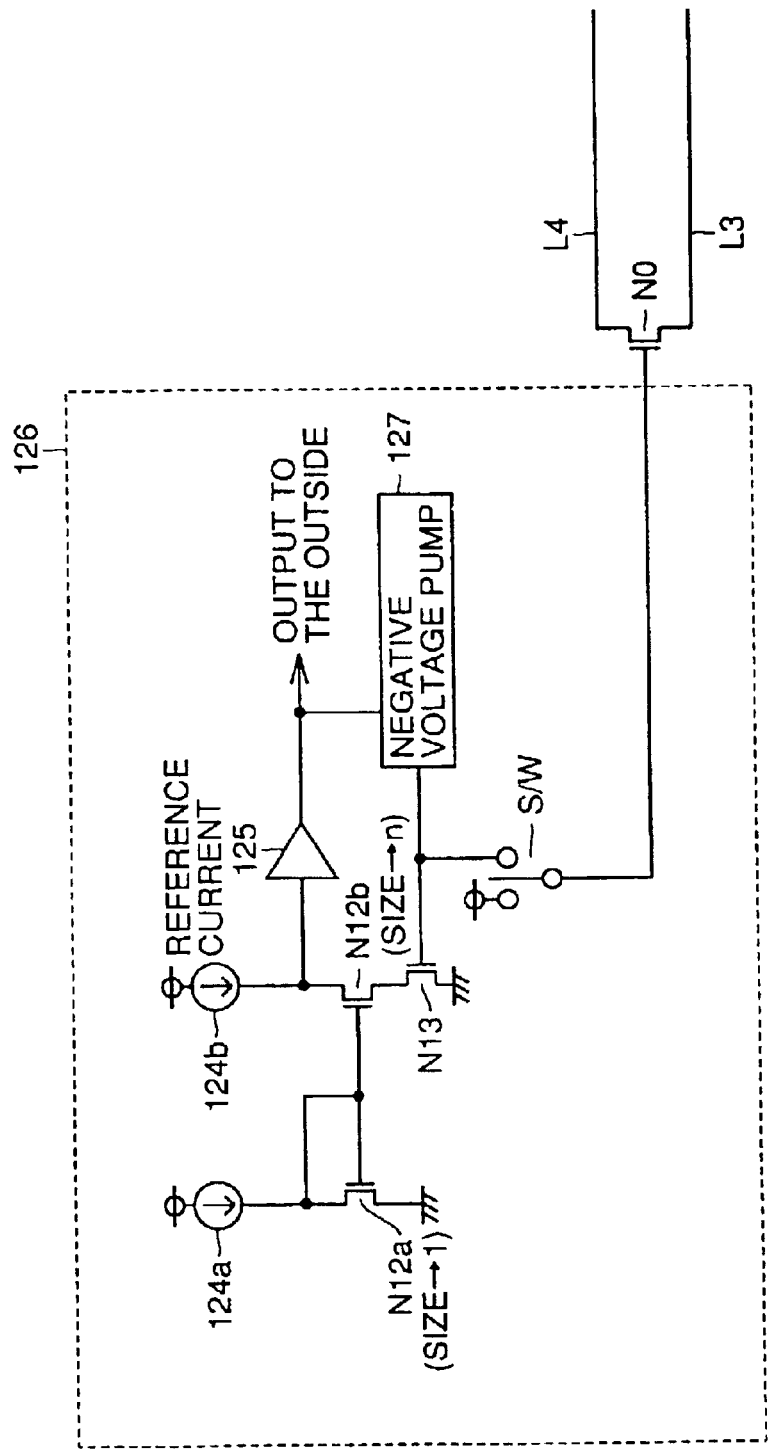
FIG. 33 illustrates a structure of a main portion of a leakage current test circuit 126 according to the eighth embodiment of the invention.

Leakage current test circuit 126 shown in FIG. 33 includes an NMOS transistor N12a and an NMOS transistor N12b. The size of the NMOS transistor N12b is n (>0) times larger than that of diode-connected NMOS transistor N12a. NMOS transistors N12a and N12b connected as the current mirror respectively receive reference current supplied from constant current sources 124a and 124b.

One conduction terminal of NMOS transistor N12a receives ground potential Vss. An NMOS transistor N13 is arranged between one conduction terminal of NMOS transistor N12b and ground potential Vss.

A buffer 125 is connected to the connection node of constant current source 124b and one conduction terminal of NMOS transistor N12b. The output node of buffer 125 is connected to a negative voltage pump 127. The output from negative voltage pump 127 is connected to the gate electrode of NMOS transistor N13.

The gate electrode of a switching transistor N0 that short-circuits a sub-ground line L4 and a main ground line L3 is connected to supply potential by a switch S/W in the active cycle. In the standby cycle, the gate electrode is connected to the gate electrode of NMOS transistor N13.

NMOS transistor N13 is a dummy transistor for switching transistor N0. A loop circuit is formed by NMOS transistor N12b, buffer 125, negative voltage pump 127, and NMOS transistor N13.

When an amount of reference current (leakage current) flowing into NMOS transistor N12b increases, negative voltage pump 127 outputs negative voltage. NMOS transistor N13 enters OFF state.

When an amount of reference current flowing into NMOS transistor N12b decreases, the operation of negative voltage pump 127 is stopped. Accordingly, NMOS transistor N13 attains ON state.

The amount of current flowing respectively to NMOS transistors N12a and N12b is equal to each other. However, since the ratio of the transistor size is 1:n, the actual ratio of decrease of the leakage current is 1/n relative to a logical value which is an output from buffer 125. Potential supplied to the gate electrode of NMOS transistor N13 is generated at negative voltage pump 127 in order to keep this state.

In the active cycle, switch S/W is connected to supply potential. Accordingly, switching transistor N0 attains ON state, and main ground line L3 and sub-ground line L4 are short-circuited.

In the standby cycle, the leakage current flowing through the switching transistor is reduced according to the level of the negative voltage output from negative voltage pump 127.

(Ninth Embodiment)

A semiconductor integrated circuit device according to the ninth embodiment of the invention is described. In the semiconductor integrated circuit device according to the ninth embodiment of the invention, the leakage current in the standby cycle is reduced by applying negative bias to a switching transistor in a hierarchical power supply system.

Figure 34:
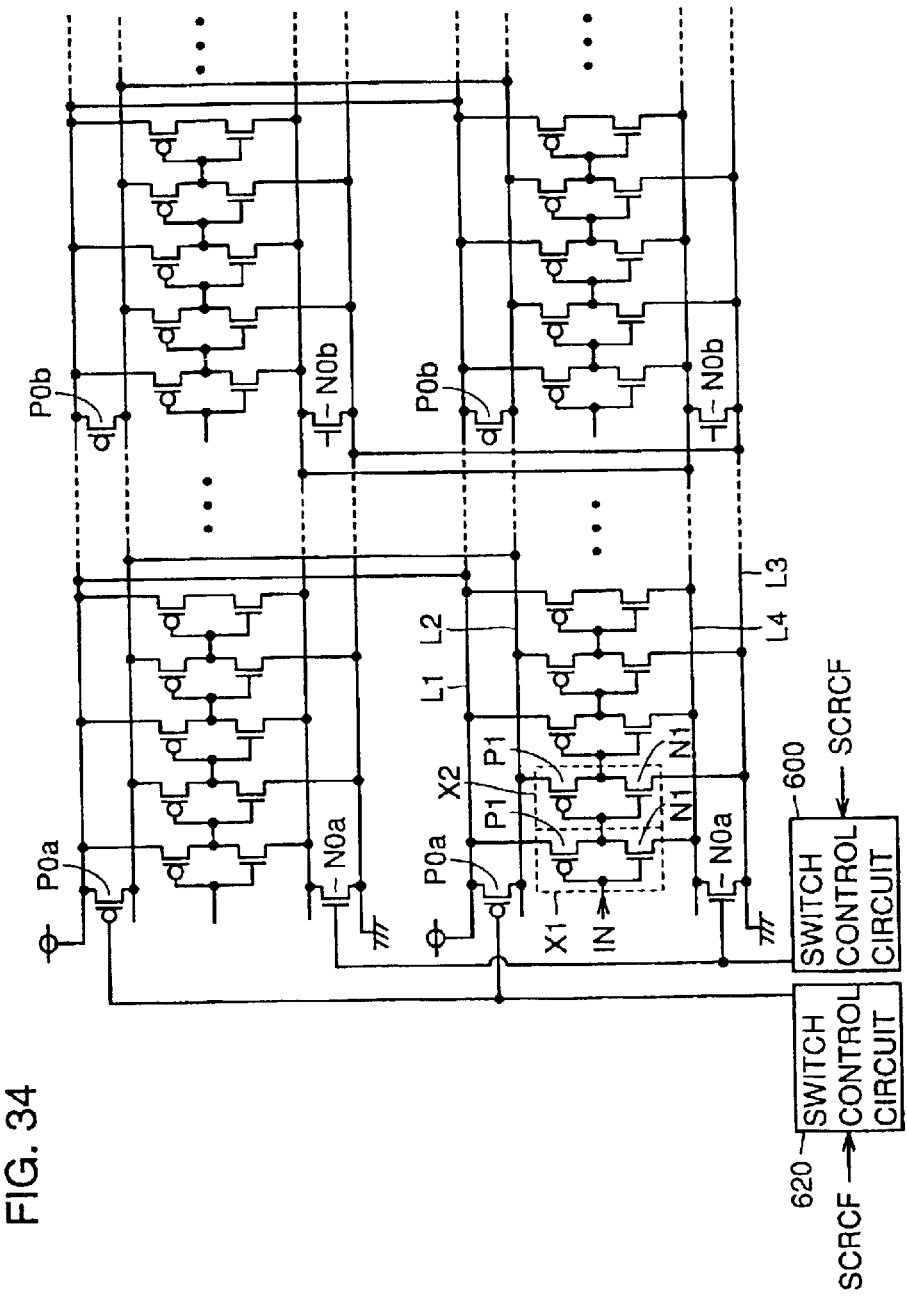
FIGS. 34 and 35 illustrate a structure of a hierarchical power supply system according to the ninth embodiment of the invention.
Figure 35:
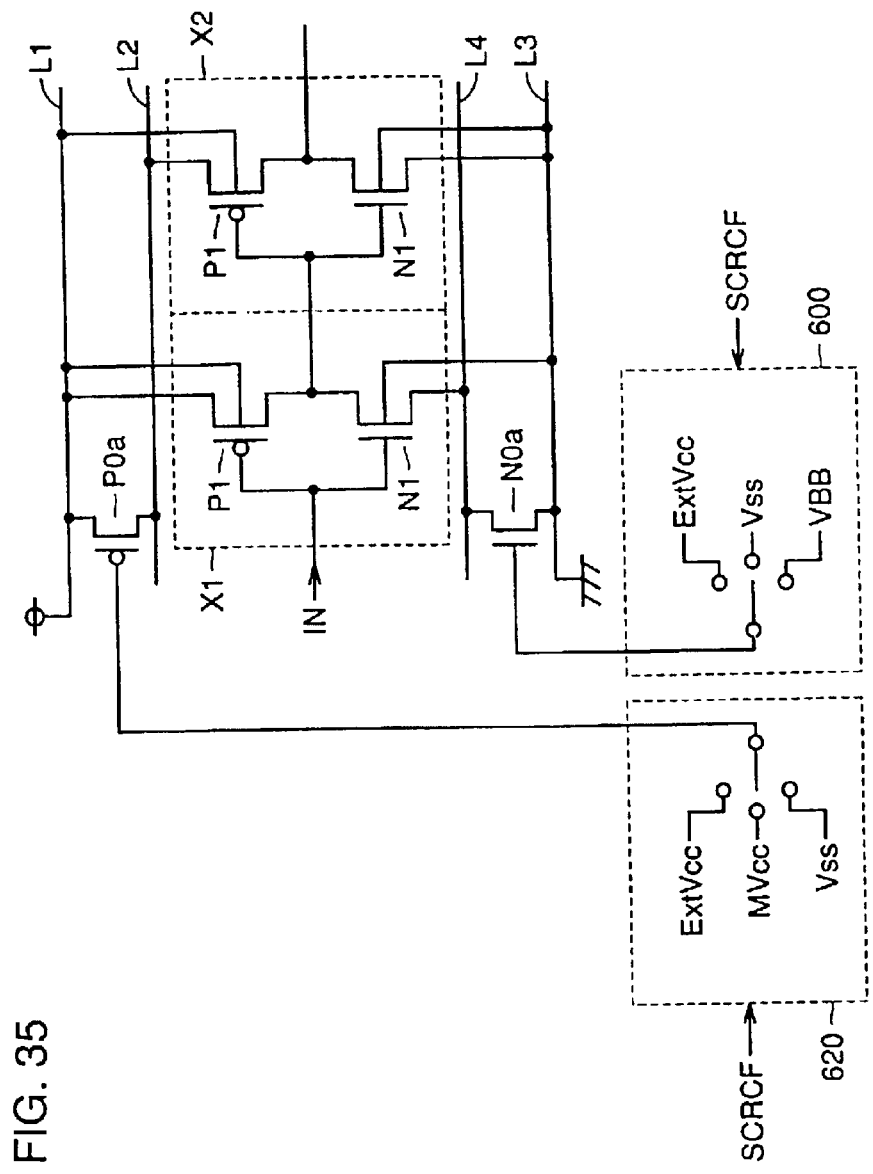

A structure of the hierarchical power supply system according to the ninth embodiment of the invention is hereinafter described using FIGS. 34 and 35. FIGS. 34 and 35 illustrate inverters X1, X2 . . . representatively as components of an internal circuit. Inverters X1 . . . each include a PMOS transistor P1 and an NMOS transistor N1 and thus have a configuration of a CMOS inverter. Transistors constituting inverters X1 . . . have a low threshold.

Referring to FIG. 34, switching transistors P0a, P0b . . . are arranged with a prescribed spacing therebetween, between a main power supply line L1 and a sub-power supply line L2. Between a main ground line L3 and a sub-ground line L4, switching transistors N0a, N0b . . . are arranged with a prescribed spacing therebetween.

A switch control circuit 620 is arranged for switch transistors P0a, P0b . . . . A switch control circuit 600 is arranged for switch transistors N0a, N0b . . . . Switch control circuits 600 and 620 control the gate voltage of corresponding switching transistors in response to a hierarchical power supply control signal SCRCF.

Switch control circuit 600 shown in FIG. 35 controls the gate voltage with three values. Specifically, switch control circuit 600 applies any of external power supply voltage ExtVcc, voltage Vss, and substrate voltage VBB at a prescribed timing to switching transistors N0a, . . . . Voltage Vss may be any of the voltage of main ground line L3, internally generated low power supply voltage, and external ground voltage.

Switch control circuit 620 illustrated in FIG. 35 controls the gate voltage with three values. Specifically, switch control circuit 620 applies any of voltage Vss, voltage MVcc, and external power supply voltage ExtVcc at a prescribed timing to switching transistors P0a, . . . . Voltage MVcc may be any of the voltage of main power supply line L1 and internally generated power supply voltage.

The substrates of switching transistors (P0a, P0b . . . ) that short-circuit main power supply line L1 and sub-power supply line L2 are connected to main power supply line L1. The substrates of switching transistors (N0a, N0b . . . ) that short-circuit main ground line L3 and sub-ground line L4 are connected to main ground line L3.

Figure 36:
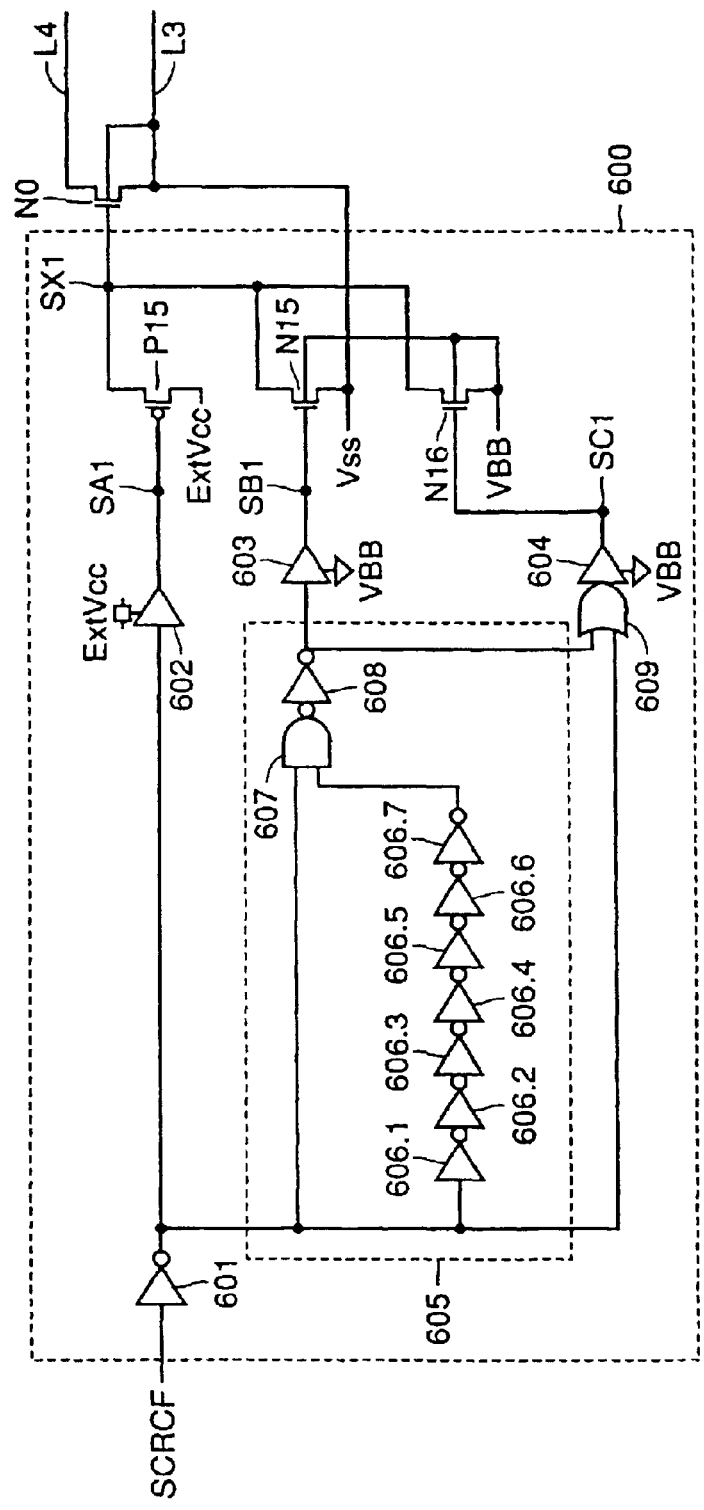
FIG. 36 is a circuit diagram illustrating a specific structure of a switch control circuit 600 according to the ninth embodiment of the invention.

One example of a structure of switch control circuit 600 illustrated in FIGS. 34 and 35 is specifically described using FIG. 36. Switch control circuit 600 shown in FIG. 36 includes an inverter 601, level conversion buffers 602, 603 and 604, a one-shot pulse generation circuit 605, an NOR circuit 609, a PMOS transistor P15, and NMOS transistors N15 and N16.

Inverter 601 inverts hierarchical power supply control signal SCRCF. Level conversion buffer 602 is connected between an output node of inverter 601 and a node SA1. Level conversion buffer 602 converts an output level of inverter 601 using external power supply voltage ExtVcc as an operation power supply. One conductive terminal of PMOS transistor P15 is connected to a node SX1, and the other conductive terminal receives external power supply voltage ExtVcc. The gate electrode of PMOS transistor P15 is connected to node SA1.

One-shot pulse generation circuit 605 outputs a one-shot pulse signal in response to an output from inverter 601. One-shot pulse generation circuit 605 includes inverters 606.1, 606.2, 606.3, 606.4, 606.5, 606.6 and 606.7, an NAND circuit 607, and an inverter 608. Inverters 606.1 . . . , 606.7 are connected in series. Inverter 606.1 receives an output from inverter 601. NAND circuit 607 receives outputs from inverter 601 and inverter 606.7. Inverter 608 inverts an output from NAND circuit 607.

Level conversion buffer 603 is connected between an output node of inverter 608 and a node SB1. Level conversion buffer 603 converts an output level of inverter 608 using substrate voltage VBB as the operation power supply. One conductive terminal of NMOS transistor N15 is connected to node SX1, and the other conductive terminal receives voltage Vss. The gate electrode of NMOS transistor N15 is connected to node SB1, and the substrate receives substrate voltage VBB.

NOR circuit 609 receives outputs from inverters 608 and 601. Level conversion buffer 604 is connected between an output node of NOR circuit 609 and a node SC1. Level conversion buffer 604 converts an output level of NOR circuit 609 using substrate voltage VBB as the operation power supply. One conductive terminal of NMOS transistor N16 is connected to node SX1, and the other conductive terminal receives substrate voltage VBB. The gate electrode of NMOS transistor N16 is connected to node SC1, and the substrate receives substrate voltage VBB. Node SX1 is connected to the gate electrode of a switching transistor (N0) coupling main ground line L3 with sub-ground line L4.

Figure 37:
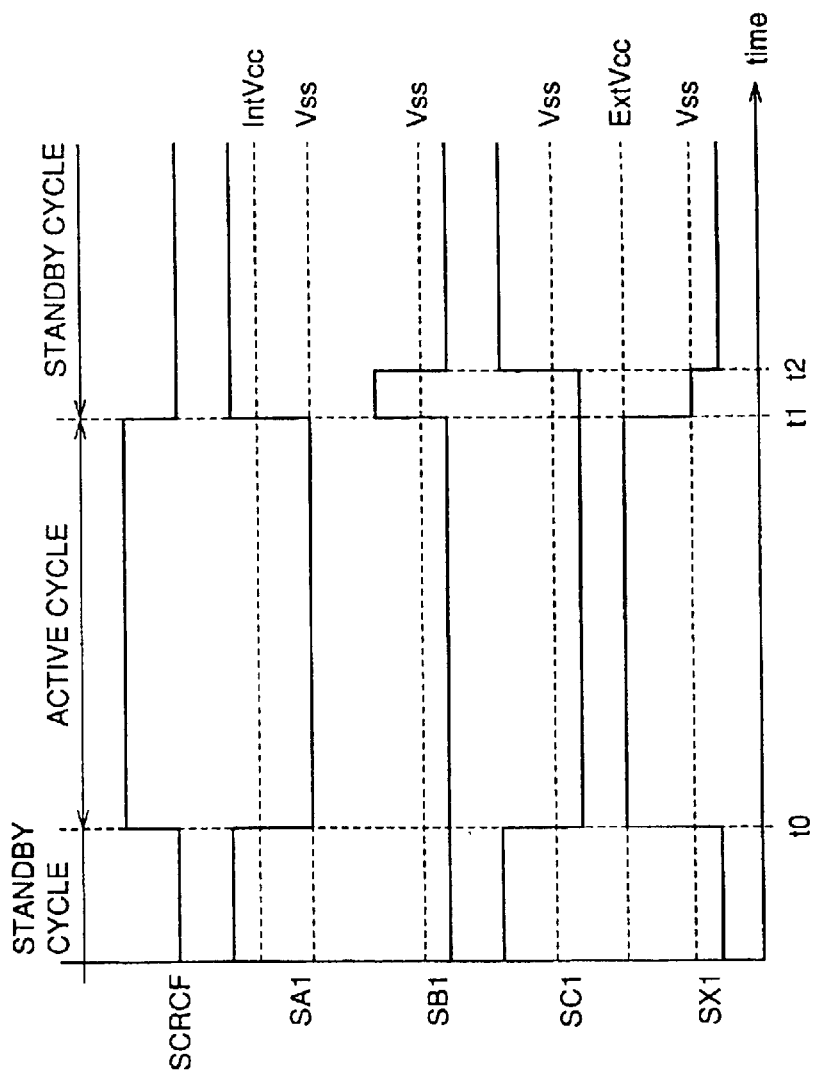
FIG. 37 is a timing chart provided for describing an operation of the switch control circuit shown in FIG. 36.

An operation of switch control circuit 600 illustrated in FIG. 36 is described using the timing chart of FIG. 37. The reference character intVcc in the chart represents an internal power supply voltage of a chip.

Referring to FIG. 37, an active cycle starts at time t0 when hierarchical power supply control signal SCRCF rises from L level to H level. Accordingly, node SA1 falls from H level (at least intVcc) to L level (Vss). Node SB1 maintains L level (Vss or less). Node SC1 falls from H level to L level (Vss or less). Node SX1 rises from L level (Vss or less) to H level (external power supply voltage ExtVcc). As a result, switching transistor N0 is rendered conductive.

At time t1, hierarchical power supply control signal SCRCF falls to L level to change the active cycle to a standby cycle. Accordingly, node SA1 rises from L level to H level. A one-shot pulse signal is generated at one-shot pulse generation circuit 605. According to the one-shot pulse signal, node SB1 rises to H level at time t1, and falls to L level at time t2. According to the one-shot pulse signal, node SC1 rises from L level to H level at time t2.

Node SX1 falls from H level to Vss level at time t1, and further falls to a lower voltage level at time t2.

The leakage current in the standby cycle can thus be decreased by applying negative bias to the gate electrode of switching transistor N0 in the standby cycle.

Figure 38:
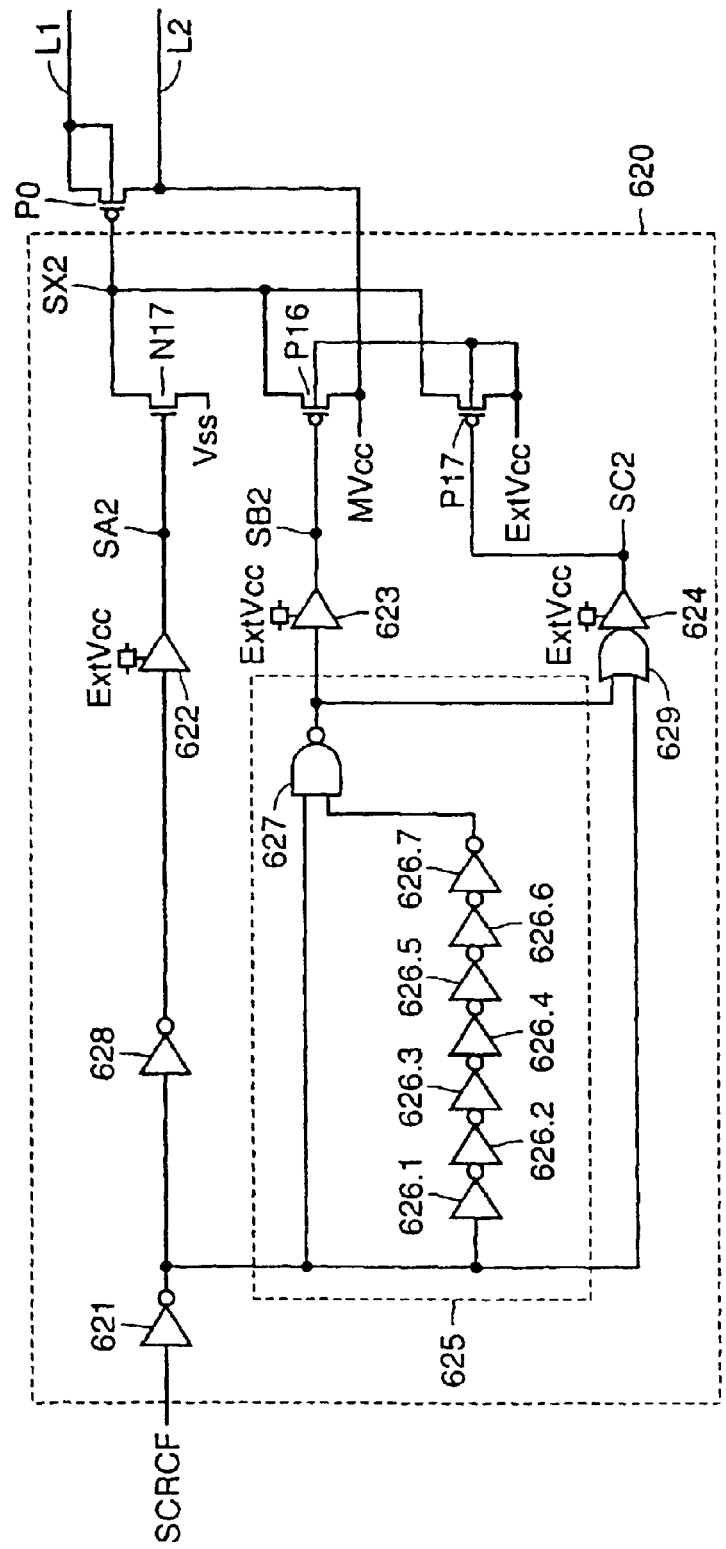
FIG. 38 is a circuit diagram illustrating a specific structure of a switch control circuit 620 according to the ninth embodiment of the invention.

One example of the structure of switch control circuit 620 according to the ninth embodiment of the invention is specifically described using FIG. 38. Switch control circuit 620 illustrated in FIG. 38 includes inverters 621 and 628, level conversion buffers 622, 623 and 624, an NOR circuit 629, a one-shot pulse generation circuit 625, an NMOS transistor N17 and PMOS transistors P16 and P17.

Inverter 621 inverts hierarchical power supply control signal SCRCF. Inverter 628 inverts an output of inverter 621. Level conversion buffer 622 is connected between an output node of inverter 628 and a node SA2. Level conversion buffer 622 converts an output level of inverter 628 using external power supply voltage ExtVcc as the operation power supply. One conductive terminal of NMOS transistor N17 is connected to a node SX2, and the other conductive terminal receives voltage Vss. The gate electrode of NMOS transistor N17 is connected to node SA2.

One-shot pulse generation circuit 625 outputs a one-shot pulse signal in response to an output from inverter 621. One-shot pulse generation circuit 625 includes inverters 626.1, 626.2, 626.3, 626.4, 626.5, 626.6 and 626.7, and an NAND circuit 627. Inverters 626.1, . . . , 626.7 are connected in series. Inverter 626.1 receives an output from inverter 621. NAND circuit 627 receives an output from inverter 621 and an output from inverter 626.7.

Level conversion buffer 623 is connected between an output node of NAND circuit 627 and a node SB2. Level conversion buffer 623 converts an output level of NAND circuit 627 using external power supply voltage ExtVcc as the operation power supply. One conductive terminal of PMOS transistor P16 is connected to node SX2, and the other conductive terminal receives voltage MVcc. The gate electrode of PMOS transistor P16 is connected to node SB2, and its substrate receives external power supply voltage ExtVcc.

NOR circuit 629 receives outputs from inverter 621 and NAND circuit 627. Level conversion buffer 624 is connected between an output node of NOR circuit 629 and a node SC2. Level conversion buffer 624 converts an output level of NOR circuit 629 using external power supply voltage ExtVcc as the operation power supply. One conductive terminal of PMOS transistor P17 is connected to node SX2, and the other conductive terminal receives external power supply voltage ExtVcc. The gate electrode of PMOS transistor P17 is connected to node SC2, and its substrate receives external power supply voltage ExtVcc. Node SX2 is connected to the gate electrode of a switching transistor (P0) connecting main power supply line L1 with sub-power supply line L2.

An operation of switch control circuit 620 illustrated in FIG. 38 is hereinafter described using the timing chart of FIG. 39.

Figure 39:
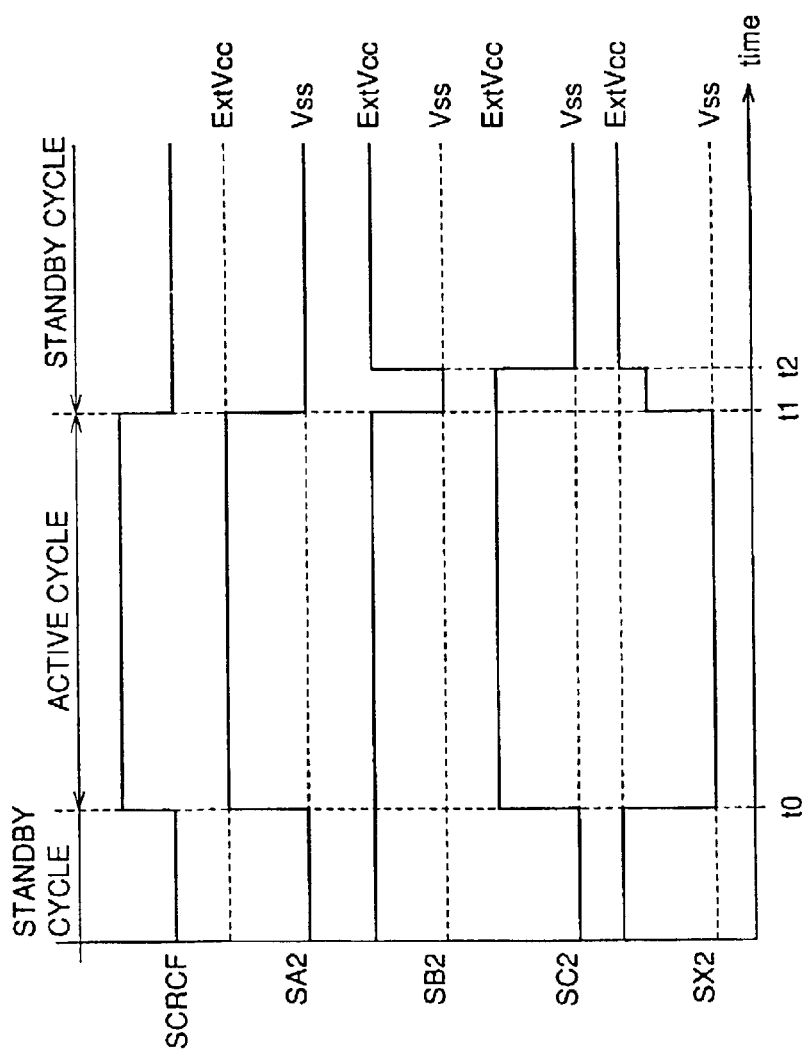
FIG. 39 is a timing chart provided for describing an operation of the switch control circuit shown in FIG. 38.

Referring to FIG. 39, the standby cycle changes to the active cycle at time t0 when hierarchical power supply control signal SCRCF rises from L level to H level. Node SA2 rises from L level (Vss) to H level (external power supply voltage ExtVcc). Node SB2 maintains H level (external power supply voltage ExtVcc). Node SC2 rises from L level (Vss) to H level (external power supply voltage ExtVcc). Node SX2 falls from H level (external power supply voltage ExtVcc) to L level (Vss).

At time t1, the active cycle changes to the standby cycle when hierarchical power supply control signal SCRCF falls to L level. Node SA2 falls from H level to L level. A one-shot pulse signal is generated at one-shot pulse generation circuit 625. According to the one-shot pulse signal, node SB2 falls to L level at time t1, and rises to H level at time t2. According to the one-shot pulse signal, node SC2 falls to L level at time t2.

At time t1, node SX2 rises from L level to an intermediate voltage level, and further rises to a higher voltage level at time t2.

The leakage current in the standby cycle can thus be reduced by applying negative bias to the gate electrode of switching transistor P0 in the standby cycle.

In the transition from the active cycle to the standby cycle, switch control circuits 600 and 620 change the voltage applied to the gate electrode stepwise. If external power supply voltage ExtVcc is directly applied to switching transistor P0 and substrate voltage VBB is directly applied to switching transistor N0 in the transition from the active cycle to the standby cycle (control with two values), the substrate voltage is raised in the charging and discharging of the gate electrode, and the operable range of the memory cell deteriorates.

According to the ninth embodiment of the invention, the voltage is changed stepwise and applied to enable reduce the degree of the raise of the substrate voltage observed when the gate electrode is charged or discharged of the switching transistor, to expand the operable range of the chip.

Although a structure for controlling ON/OFF of the switching transistor with three different voltages is described, the switching transistor can be controlled with four steps of different voltages. For example, instead of external power supply voltage ExtVcc, voltage Vss and substrate voltage VBB, boosted power supply voltage VPP, external power supply voltage ExtVcc, voltage Vss and substrate voltage VBB can be used to control switching transistor N0 in order to reduce the impedance of the switching transistor in the active cycle.

Figure 40:
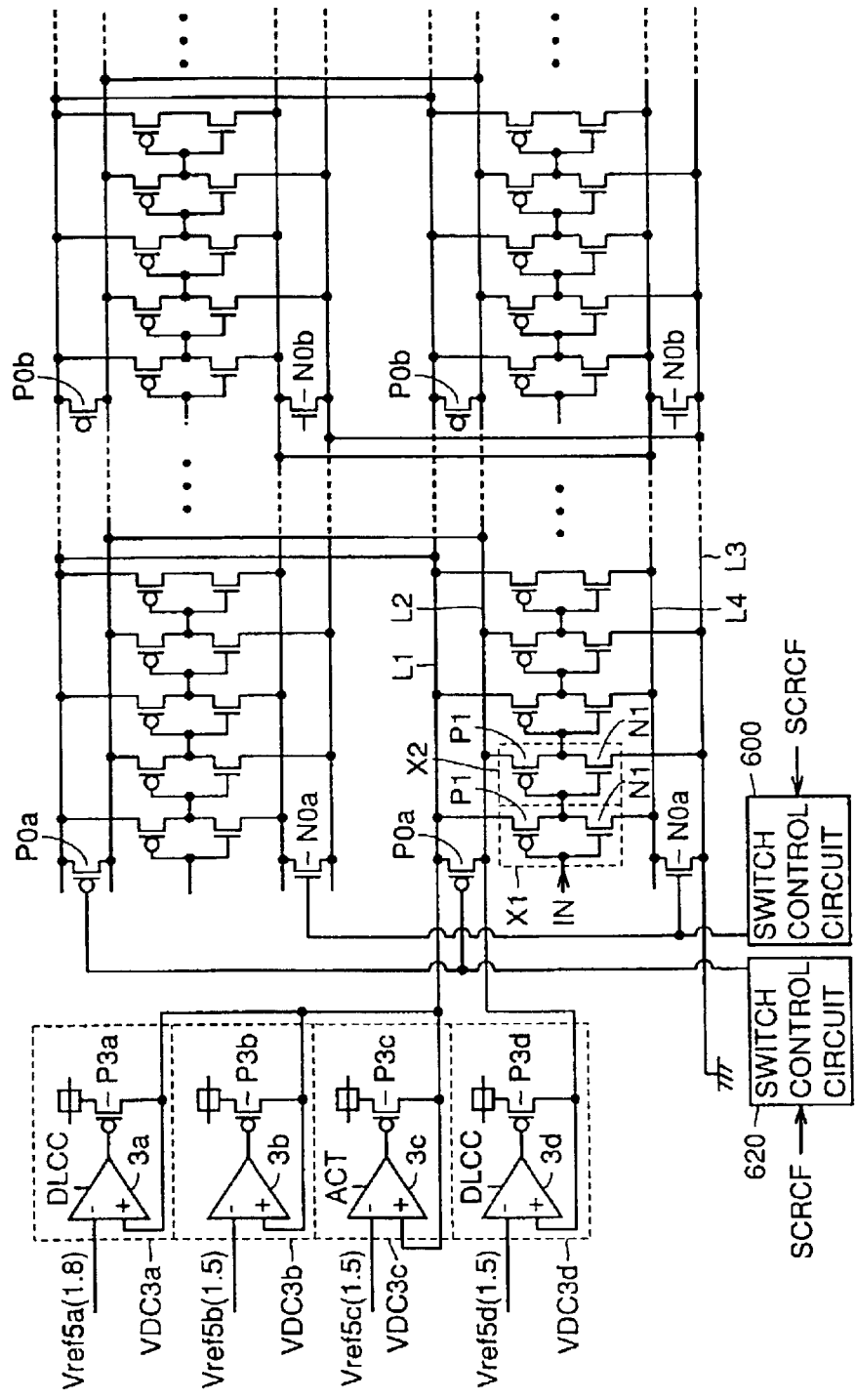
FIG. 40 illustrates another structure of the hierarchical power supply system according to the ninth embodiment of the invention.

Another structure of the hierarchical power supply system according to the ninth embodiment is described using FIG. 40. Referring to FIG. 40, in addition to switch control circuits 600 and 620, internal power supply voltage-down converters VDC3a, VDC3b and VDC3c may be arranged for main power supply line L1, and an internal power supply voltage-down converter may be arranged for sub-power supply line L2.

As described in conjunction with the second embodiment, internal power supply voltage-down converter VDC3a reduces the leakage current in the internal circuit. Internal power supply voltage-down converter VDC3a operates in response to a signal DLCC. Internal power supply voltage-down converter VDC3b sets the voltage of main power supply line L1 at a prescribed level (1.5V) in the standby cycle. Internal power supply voltage-down converter VDC3c is activated when the chip becomes active and supplies a relatively high current required for operation of the chip. Internal power supply voltage-down converter VDC3d sets the voltage of sub-power supply line L2 at a prescribed level (1.5V) in response to activation of internal power supply voltage-down converter VDC3a. Signal DLCC is a control signal for controlling the circuit operation and may be the same as hierarchical power supply control signal SCRCF.

Combination of switch control circuits 600 and 620 and internal power supply voltage-down converters VDC3a, VDC3b, VDC3c and VDC3d thus reduces the leakage current in the standby cycle and enables a high-speed and high-precision operation to be secured.

(Tenth Embodiment)

A semiconductor integrated circuit device according to the tenth embodiment of the invention is described. In the semiconductor integrated circuit device according to the tenth embodiment, drop in power supply that occurs with the circuit operation is decreased by dispersing power supply line capacitors.

Figure 41:
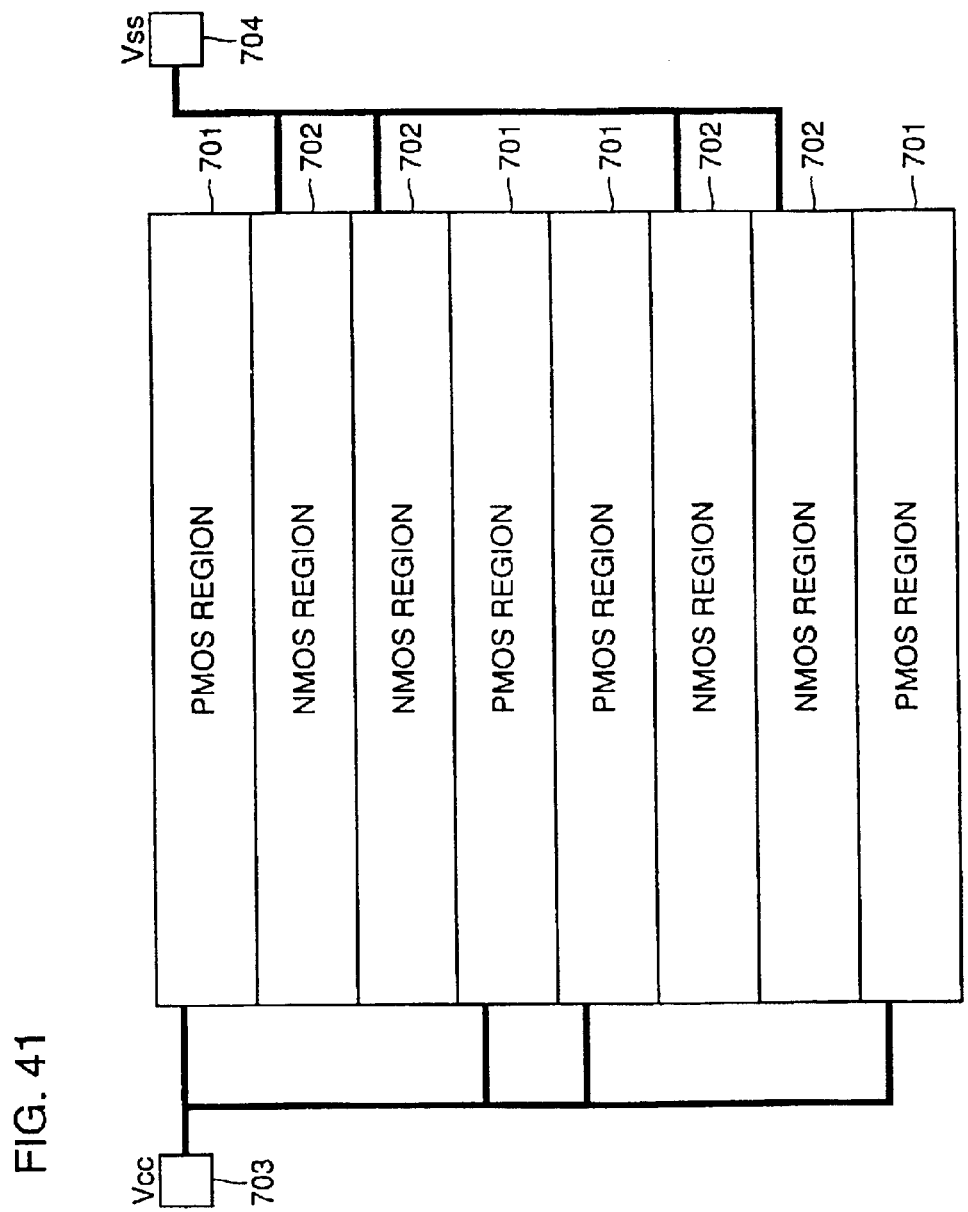
FIG. 41 illustrates a functional block.

When the circuits described above are combined to constitute a functional block illustrated in FIG. 41, the layout including the main power supply line and the sub-power supply line becomes important. In FIG. 41, the functional block is constituted of a PMOS region 701 connected to Vcc 703, and an NMOS region 702 connected to Vss 704.

In order to simplify the description, the layout described below illustrates inverters connected in series with different sizes.

Figure 42:
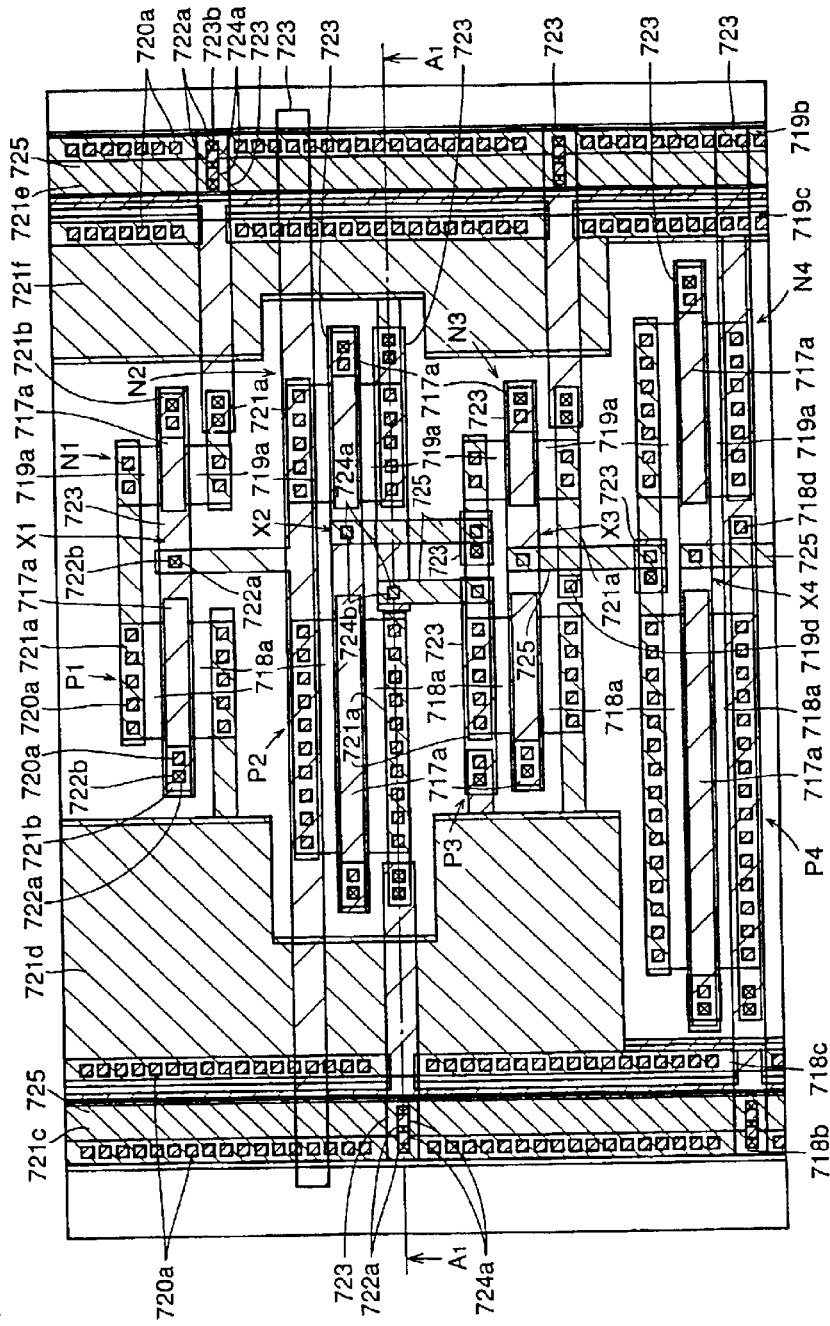
FIG. 42 is a schematic plan view illustrating a structure of a semiconductor integrated circuit device according to the tenth embodiment of the invention.
Figure 43:
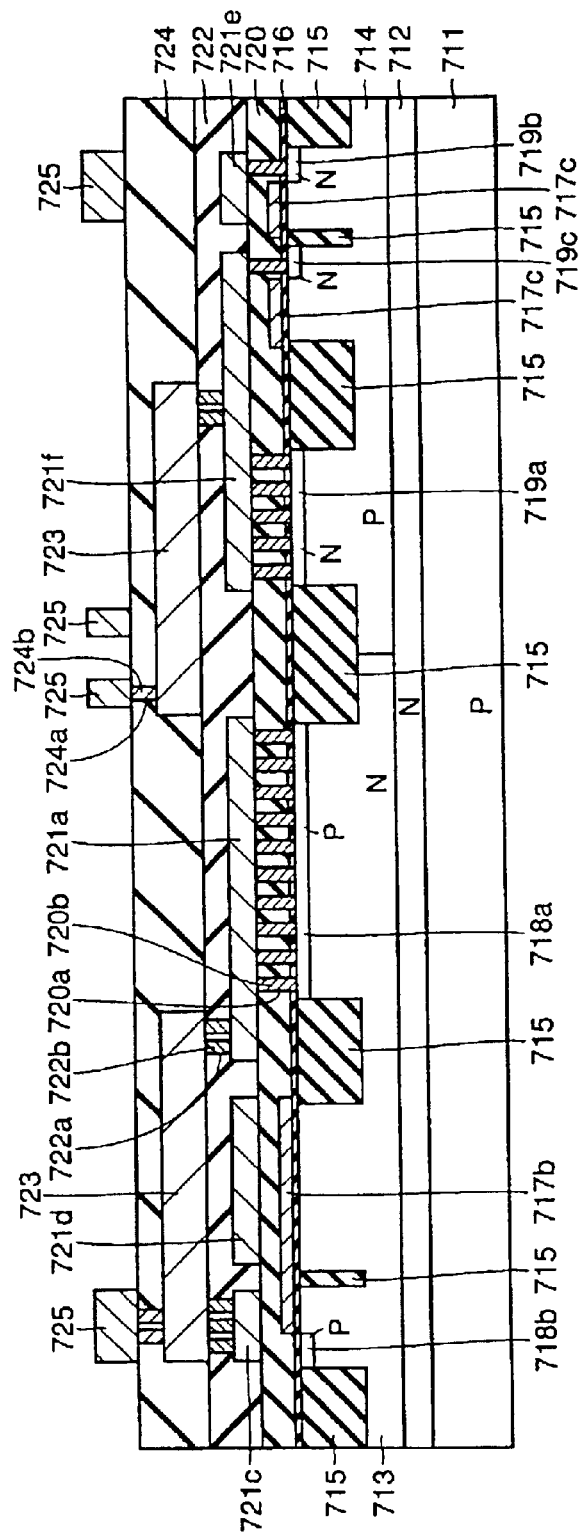
FIG. 43 is a schematic cross-sectional view along line $A_1$—$A_1$ of FIG. 42.

The overall structure of this hierarchical power supply system is described using FIGS. 42 and 43. Referring to FIGS. 42 and 43, inverters X1, X2, X3, X4, . . . forming an internal circuit are provided. Inverters X1 . . . each include a PMOS transistor P1 and an NMOS transistor N1 to form a structure of a CMOS inverter.

A conductive layer 72 id to which sub-Vcc potential is applied and a conductive layer 72 if to which sub-Vss potential is applied are arranged such that they are located on both sides of a region where inverters X1 . . . are formed. On the outside of conductive layer 721d, a conductive layer 721c to which main Vcc potential is applied is arranged, and a conductive layer 721e to which main Vss potential is applied is arranged on the outside of conductive layer 721f.

Conductive layer 721d to which sub-Vcc is applied is electrically connected to source regions 728a of respective PMOS transistors P1, P3 . . . , and conductive layer 721f to which sub-Vss is applied is electrically connected to source regions 719a of respective NMOS transistors N2, N4 . . . , Conductive layer 721c receiving main Vcc is electrically connected to source regions 718a of respective PMOS transistors P2, P4 . . . , and conductive layer 721e receiving main Vss is electrically connected to source regions 719a of respective NMOS transistors N1, N3 . . . .

Respective drain regions 718a of PMOS transistors P1, P3 . . . are electrically connected to drain regions 719a of respective NMOS transistors N1, N3 . . . . Drain regions 718a of respective PMOS transistors P2, P4, . . . are electrically connected to drain regions 719a of respective NMOS transistors N2, N4, . . . .

Drain regions 718a and 719a of both PMOS transistor Pn (n is a natural number) and an NMOS transistor Nn are electrically connected to gate electrodes 717a of respective PMOS transistor Pn+1 and NMOS transistor Nn+1.

It should be especially noted that a dummy gate 717b fixed at sub-Vss and a dummy gate 717c fixed at sub-Vcc are provided, and conductive layers 721c, 721b, 721e and 721f are respectively connected electrically to P-type layers 718b and 718c or N-type layers 719b and 719c formed at the surface of the substrate.

Such dummies are effective for enhancing stability of processing to shape layers used for transistors or other elements. If the dummies are not used, the relation of distance between the shaped elements is not uniform and the finished elements have increased or decreased dimensions, resulting in unstable shapes. In particular, if the finished gate length is not uniform, gate delay cannot be controlled and an erroneous operation could be caused. The dummies can stabilize the shapes of finished elements by providing a relatively constant distance between respective elements. The dummies are further effective for preventing non-uniformly finished flat portion on the chip in the planarizing step by CMP (Chemical Mechanical Polishing) often used in recent years. The CMP process may be applied to formation of various layers. Therefore, the dummies could be arranged at various layers. An active region and the gate are herein used for convenience of description. However, the dummies may be arranged at other layers.

This layout is described in detail with a method of manufacturing thereof in conjunction with respective layers.

Figure 44:
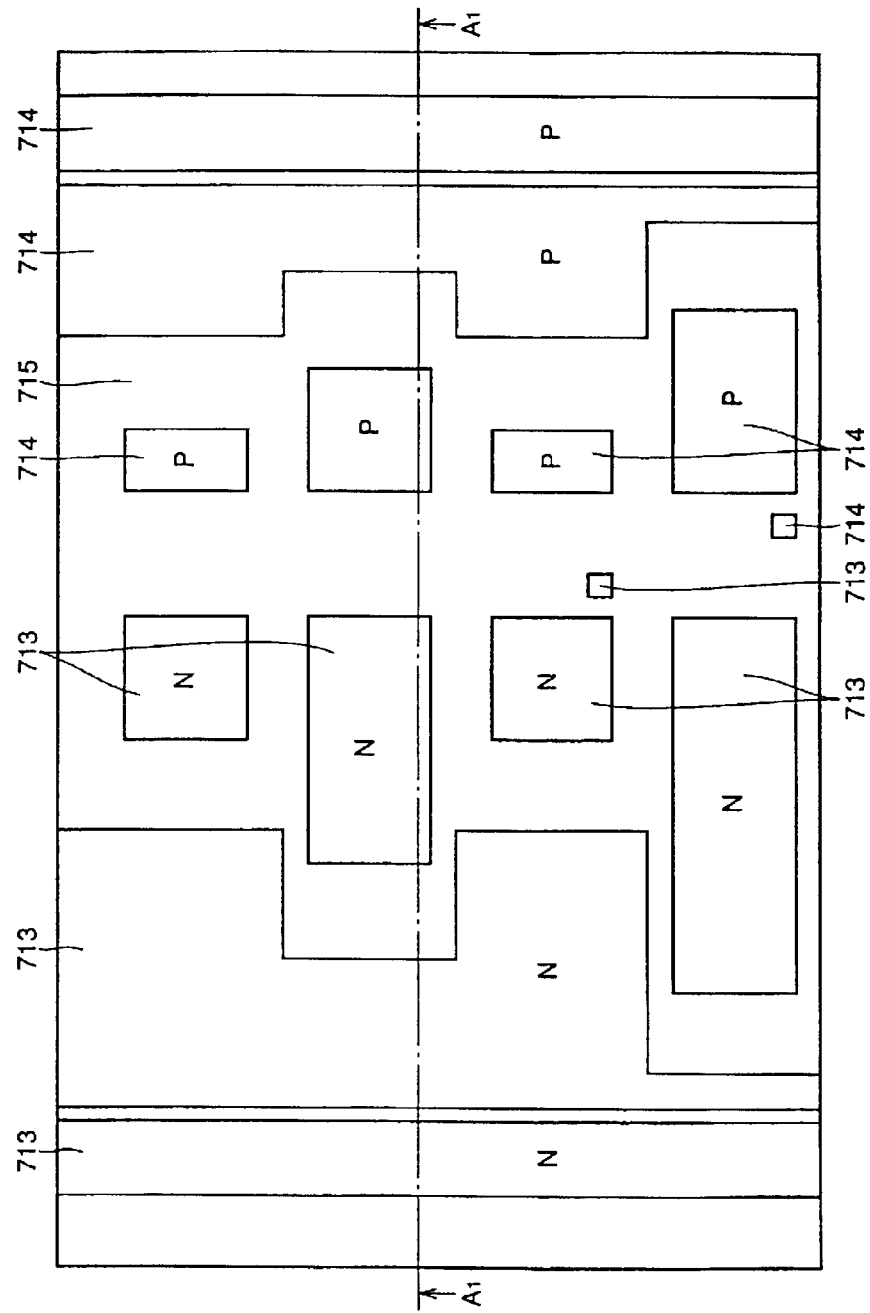
FIGS. 44 to 51 are plan views respectively illustrating the structure shown in FIG. 42 from the lowest layer successively.
Figure 52:
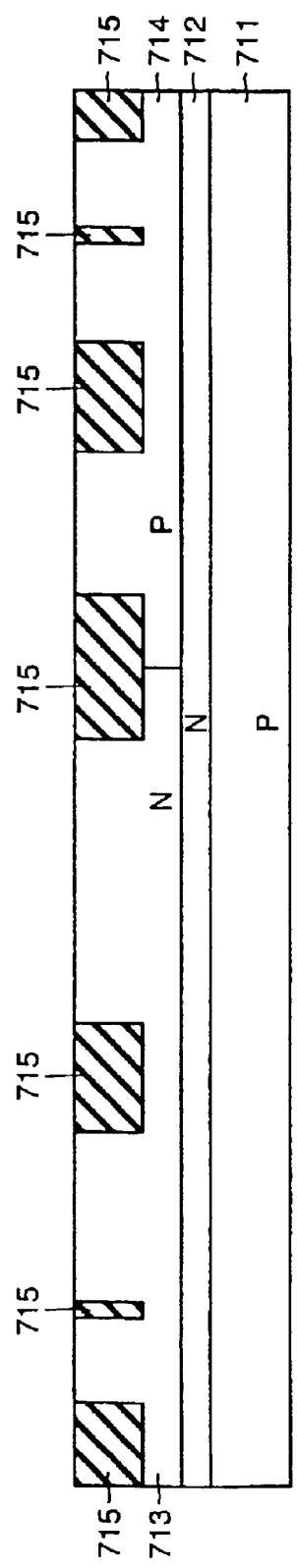
FIGS. 52 to 59 are cross-sectional views respectively illustrating the structure shown in FIG. 43 from the lowest layer successively.

Referring to FIGS. 44 and 52, a semiconductor substrate is formed by arranging an N-type well 713 and a P-type well 714 adjacent to each other via an N-type bottom layer 712 on a P-type substrate region 711. Trench isolation is formed by burying an insulating layer 715 in a trench, and accordingly active regions are electrically separated from each other.

Figure 45:
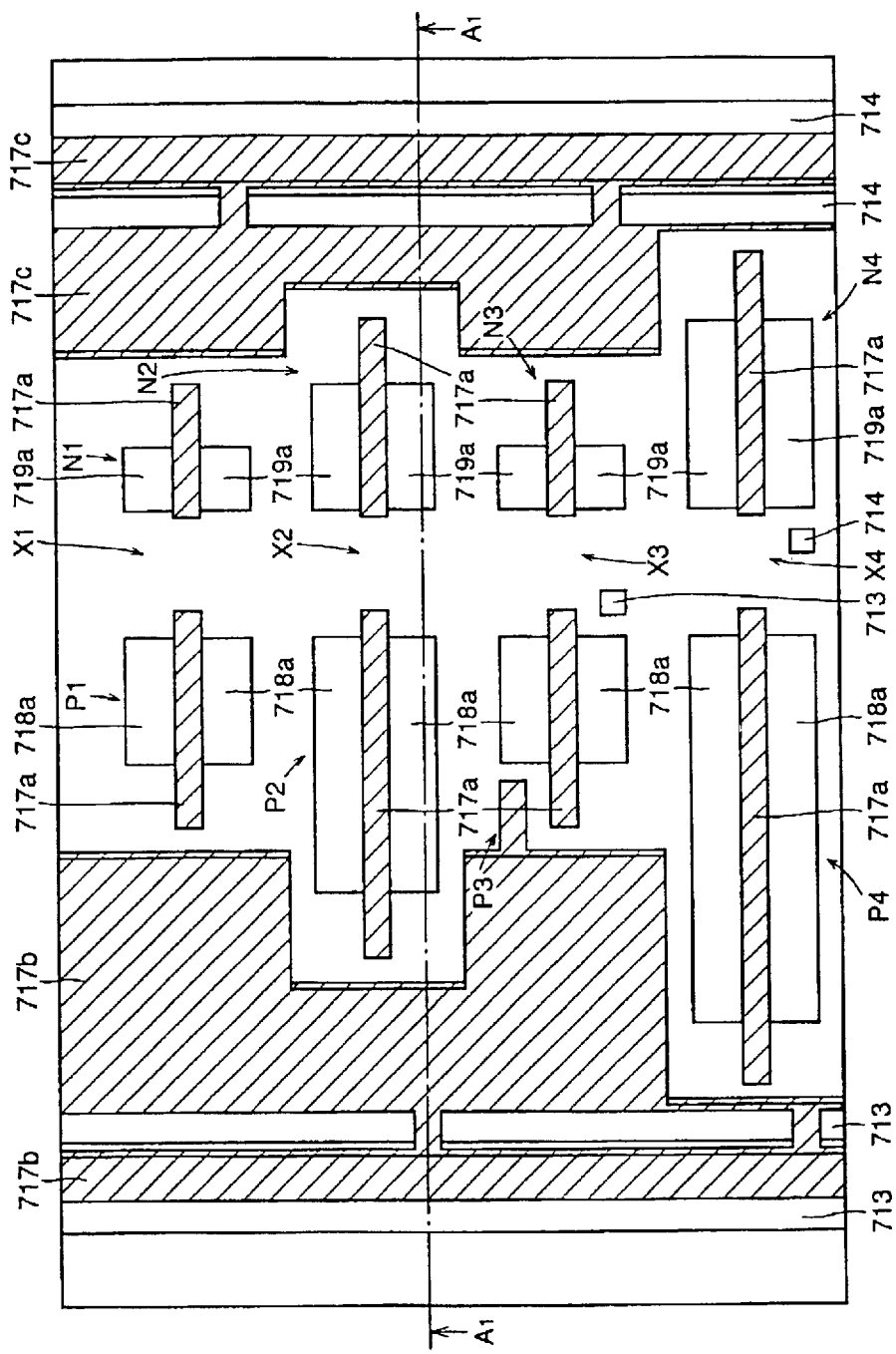
Figure 53:
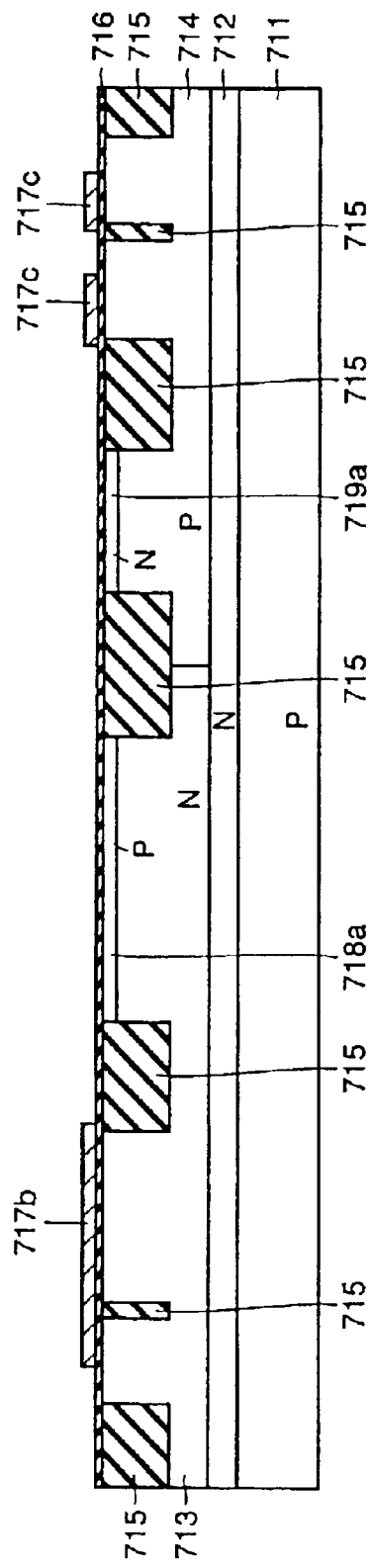

Referring to FIGS. 45 and 53, gate electrode layer 717a, dummy gates 717b and 717c are formed from the same layer via an insulating layer (eg. silicon oxide film) on the substrate such that they are separated from each other. Ion implantation using gate electrode layer 717a or the like as a mask forms a pair of P-type source/drain regions 718a in an active region of a PMOS transistor portion. In an active region of an NMOS transistor portion, a pair of N-type source/drain regions 719a is formed. PMOS transistors P1 . . . and NMOS transistors N1 . . . are thus formed.

Figure 46:
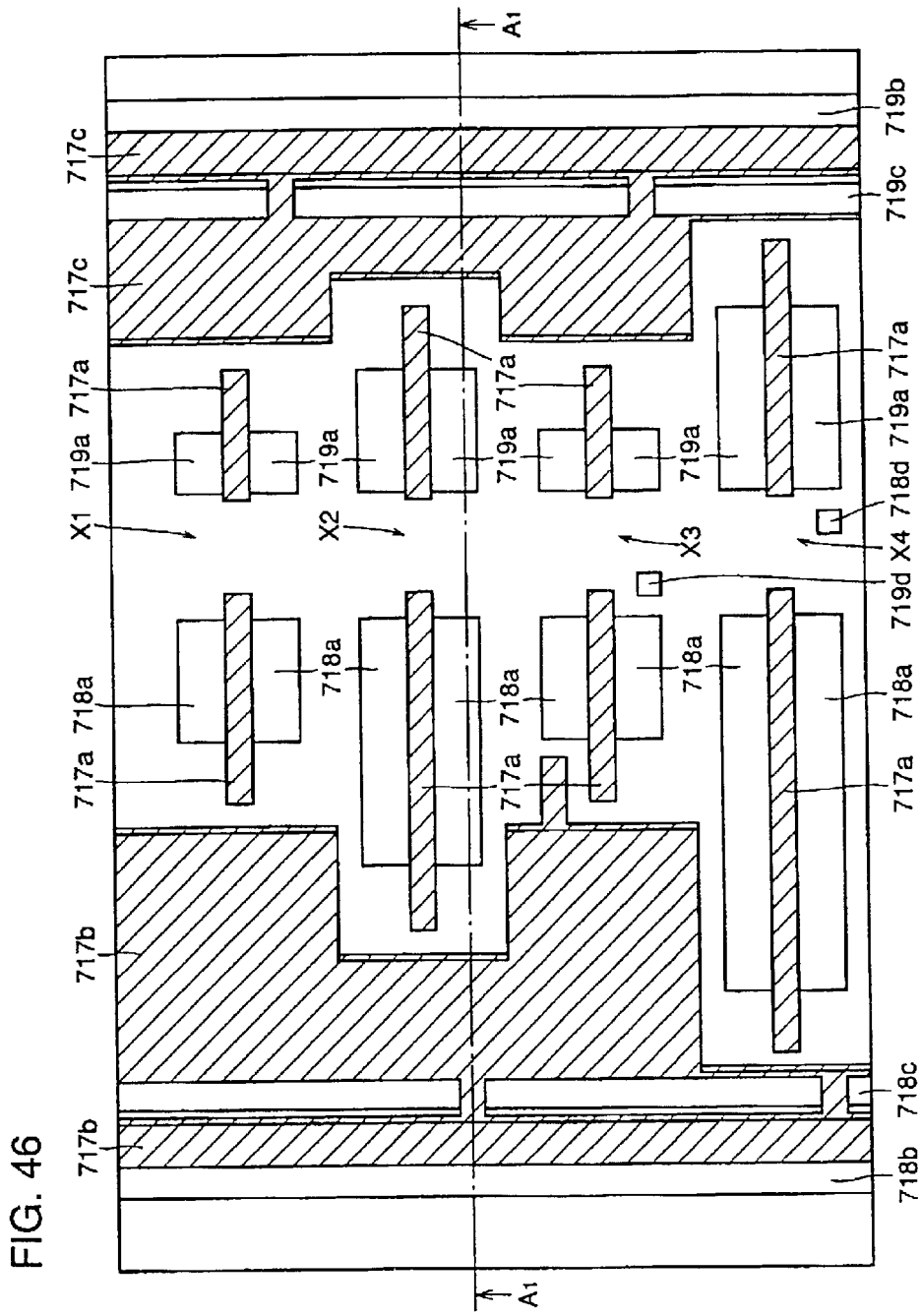
Figure 54:
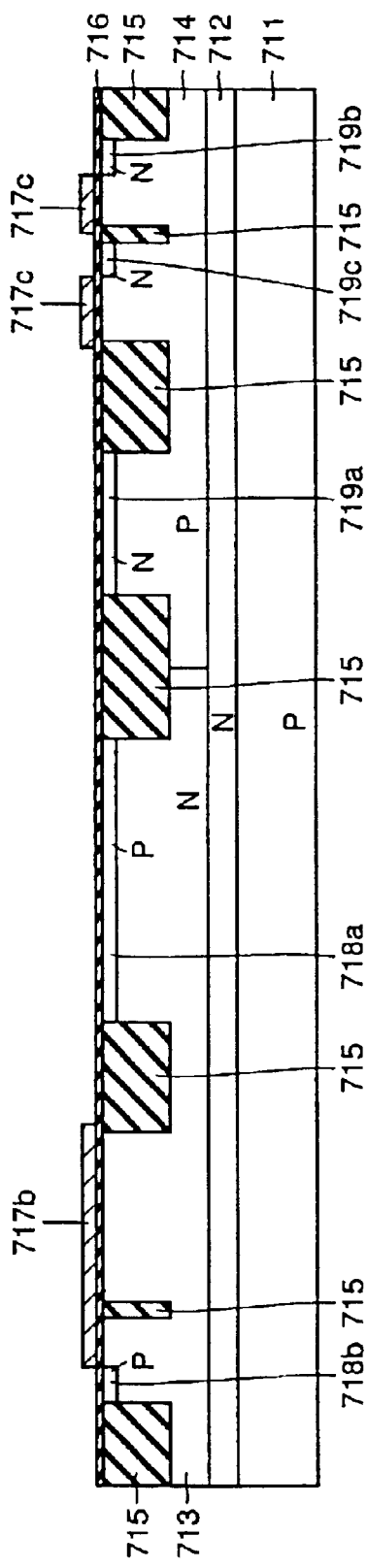

Referring to FIGS. 46 and 54, ion implantation using dummy gate layer 717b or the like as a mask forms P-type layers 718b and 718c, and ion implantation using dummy gate layer 717c or the like as a mask forms N-type layers 719b and 719c.

In a small rectangular region 719d shown at the middle of the lower section of FIG. 46, N-type active region 719d for fixing the well potential to N-type well 713 is formed and a P-type active region 718d for fixing the well potential to P-type well 714 is formed in the small rectangular region 718d.

Figure 47:
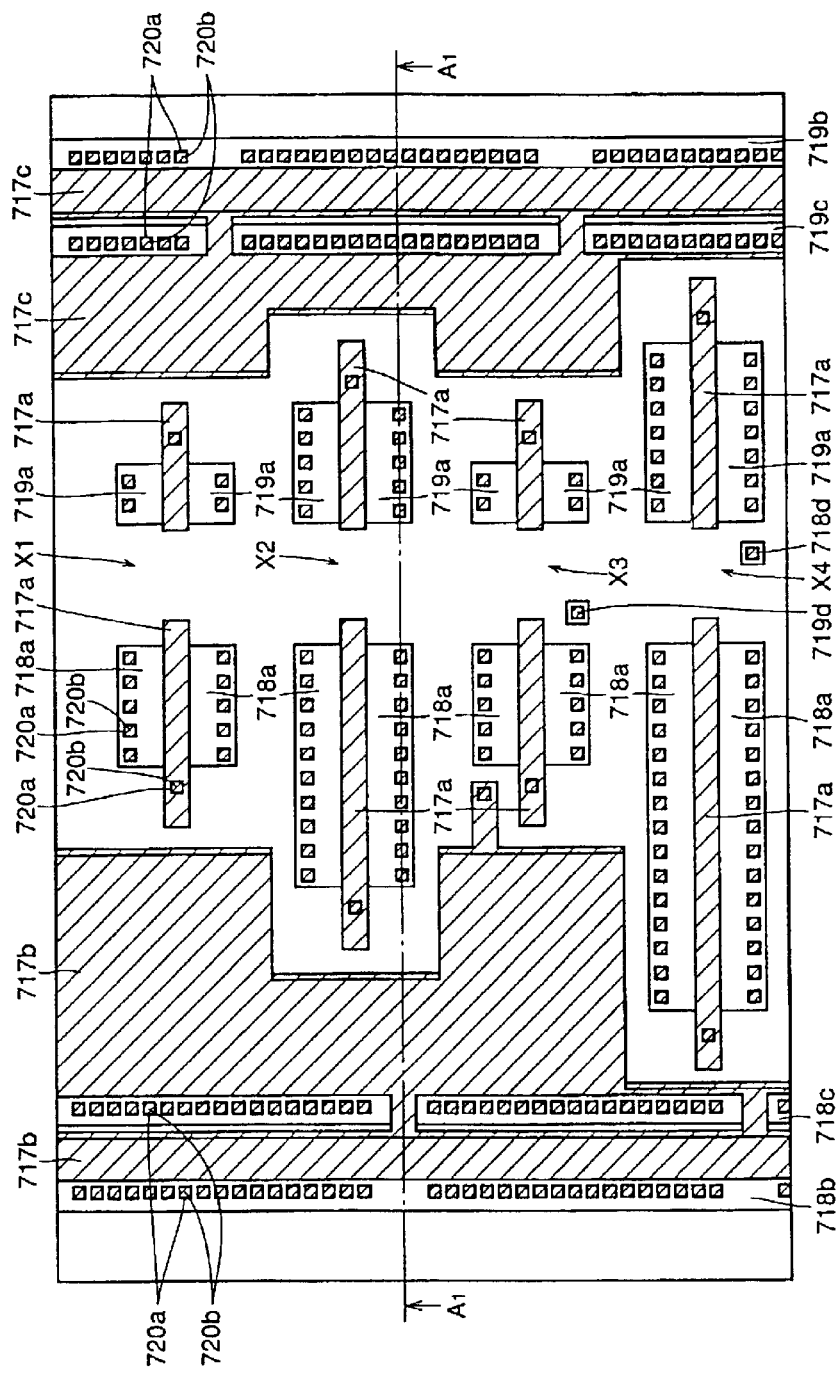
Figure 55:
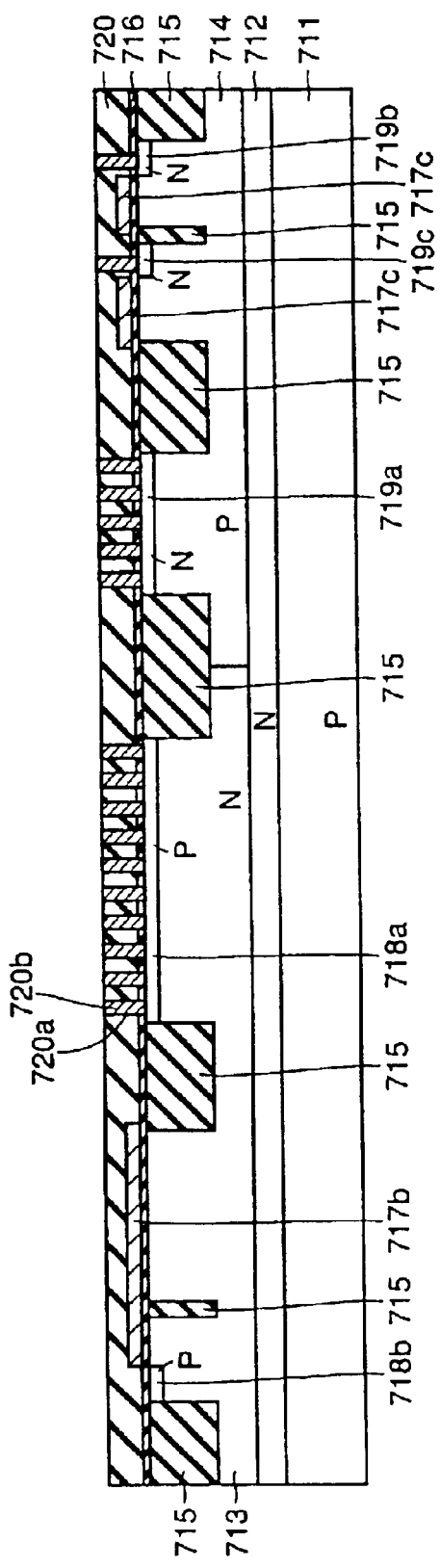

Referring to FIGS. 47 and 55, an interlayer insulating layer 720 formed of a silicon oxide film, for example, is formed to cover the entire surface of the substrate. A plurality of contact holes 720a at which source/drain regions 718a and 719a, P-type layers 718b and 718c, N-type layers 719b and 719c, and gate electrode layer 717a are formed at interlayer insulating layer 720. The plurality of contact holes 720a are each filled with conductive layer 720b.

Figure 48:
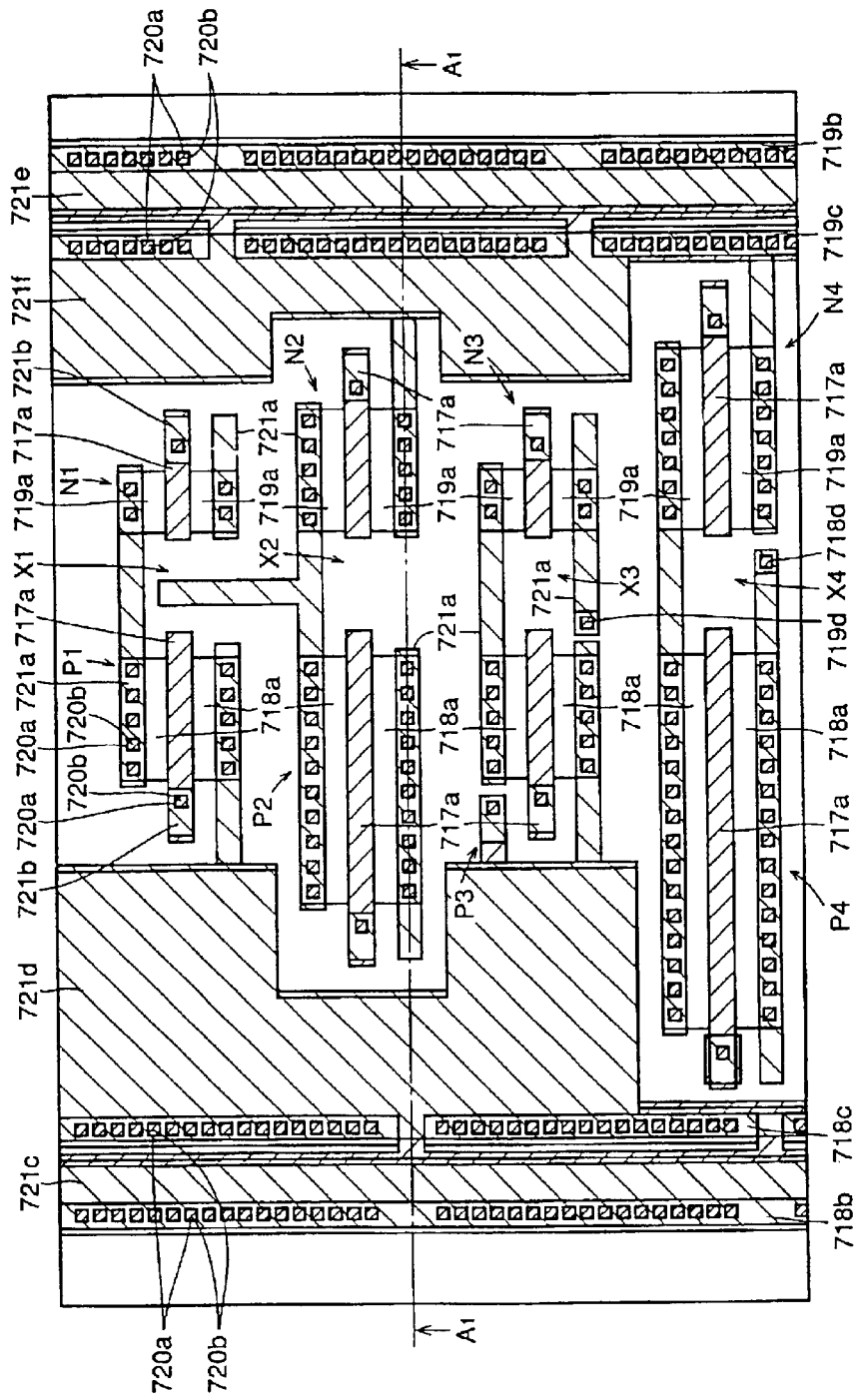
Figure 56:
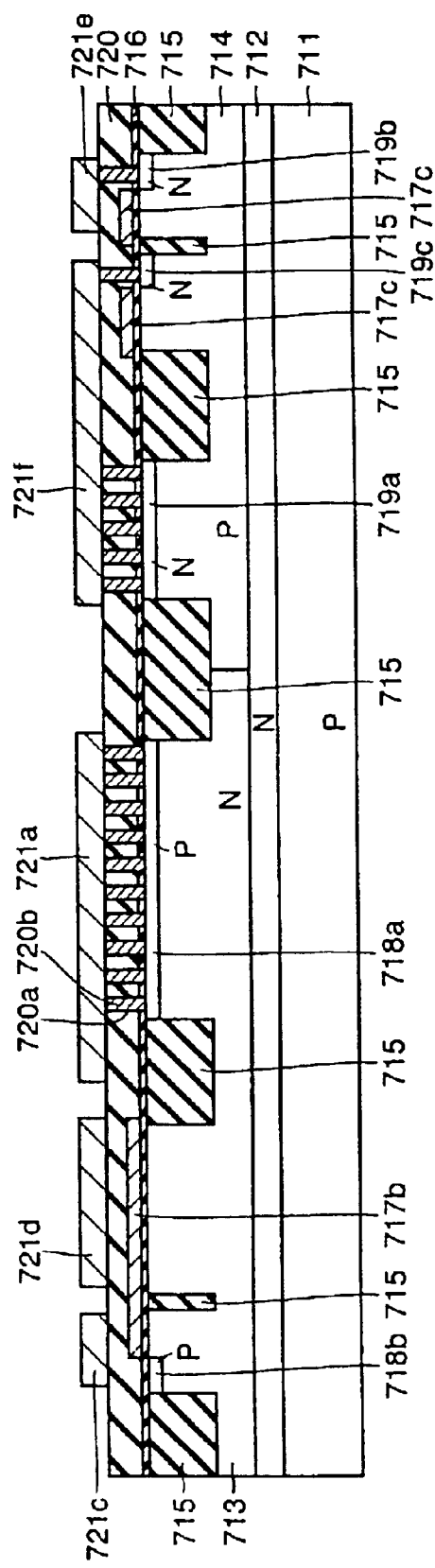

Referring to FIGS. 48 and 56, after a conductive layer is formed on the entire surface of interlayer insulating layer 720, the normal photolithography and etching are applied for patterning. As a result, conductive layers 721a, 721b, 721c, 721d, 721e and 721f are formed that are separated from each other.

Conductive layer 721d is electrically connected to source regions 721a of PMOS transistors P1, P3, . . . and P-type layer 718c. Conductive layer 72 if is electrically connected to source regions 719a of NMOS transistors N2, N4, . . . and N-type layer 719c. Conductive layer 721c is electrically connected to P-type layer 718b, and conductive layer 721e is electrically connected to N-type layer 719b.

Conductive layer 721a electrically connects the PMOS transistor and the NMOS transistor in one inverter. Conductive layer 721b is electrically connected to each gate electrode layer 717a.

Figure 49:
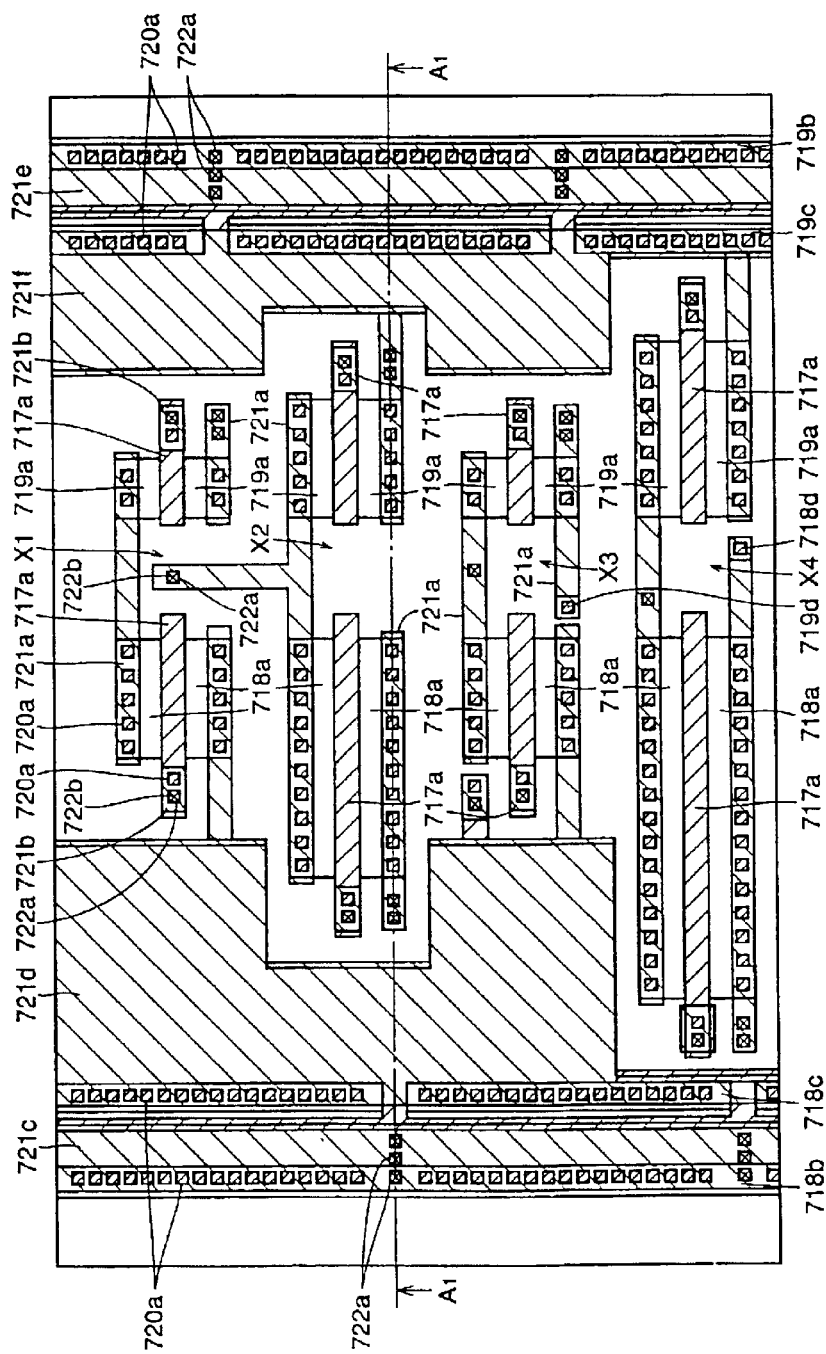
Figure 57:
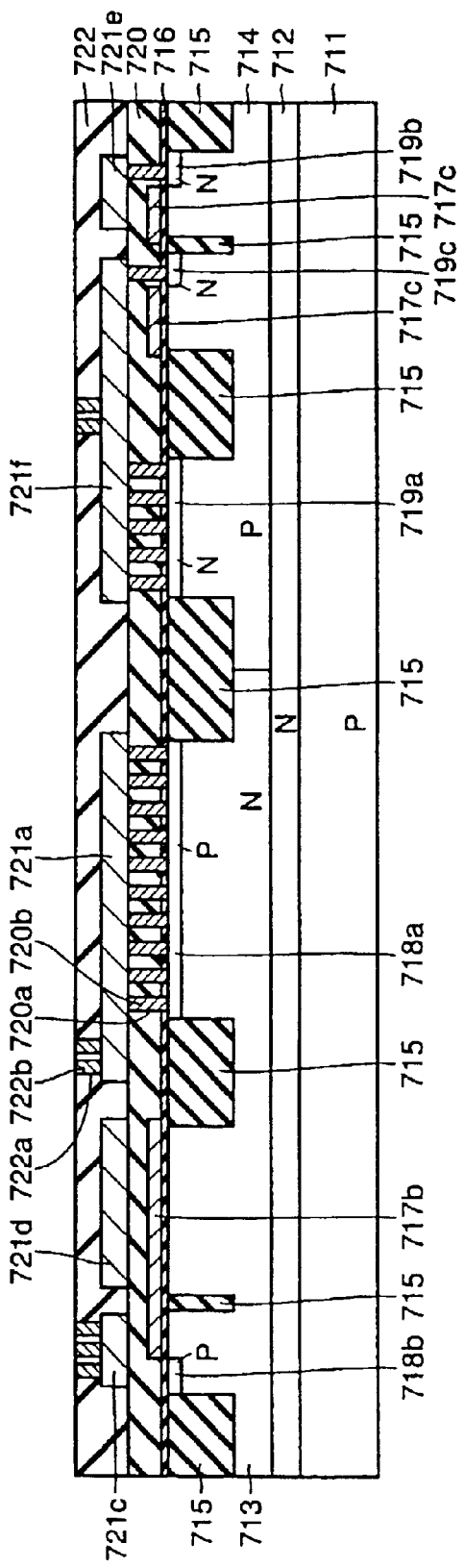

Referring to FIGS. 49 and 57, an interlayer insulating layer 722 formed of, for example, a silicon oxide film is formed to cover conductive layers 721a, 721b, 721c, 721d, 721e and 721f. A plurality of contact holes 722a that reach surfaces of respective conductive layers 721a, 721b, 721c and 721e are formed at interlayer insulating layer 722. Conductive layer 722b fills a plurality of contact holes 722a.

Figure 50:
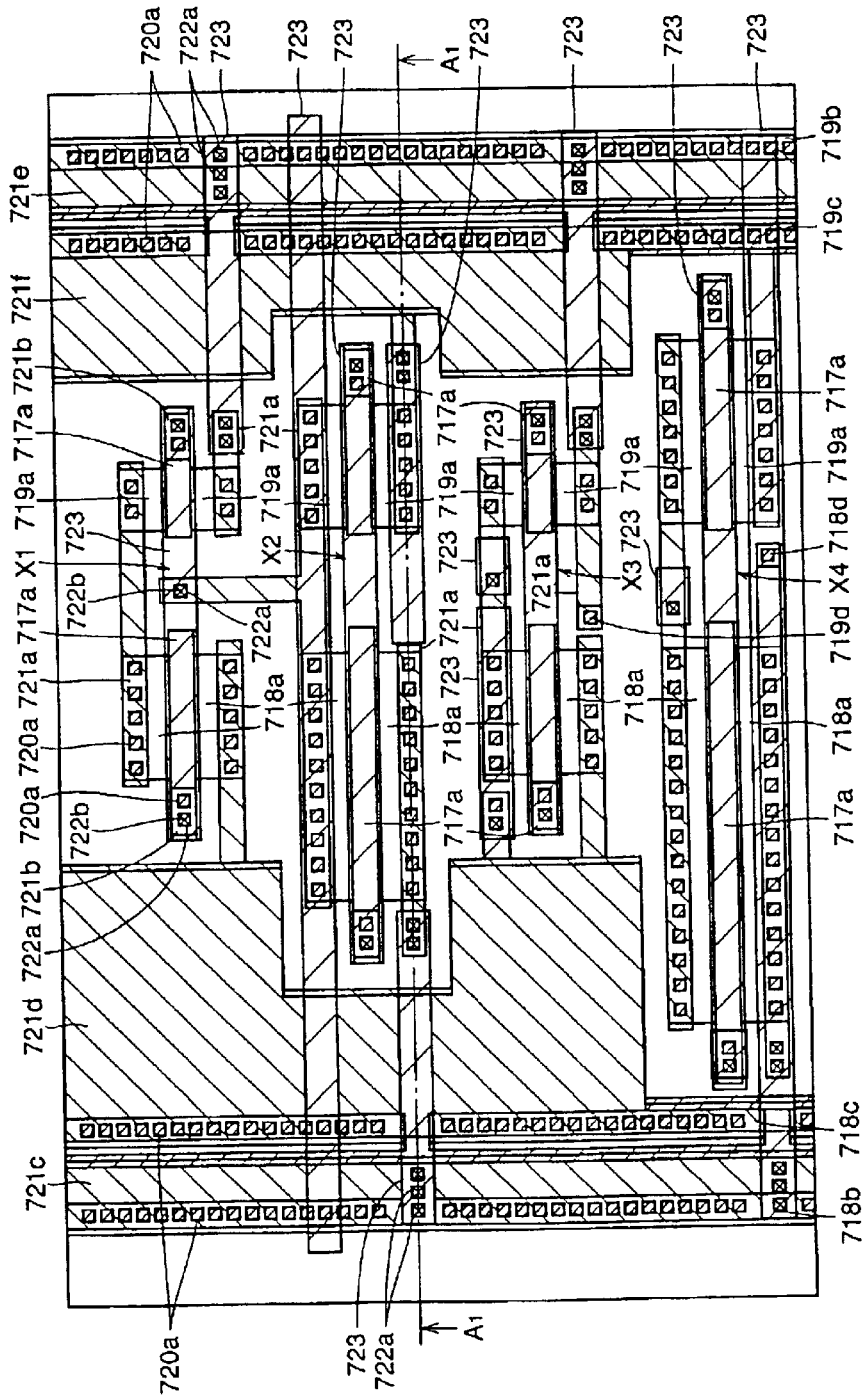
Figure 58:
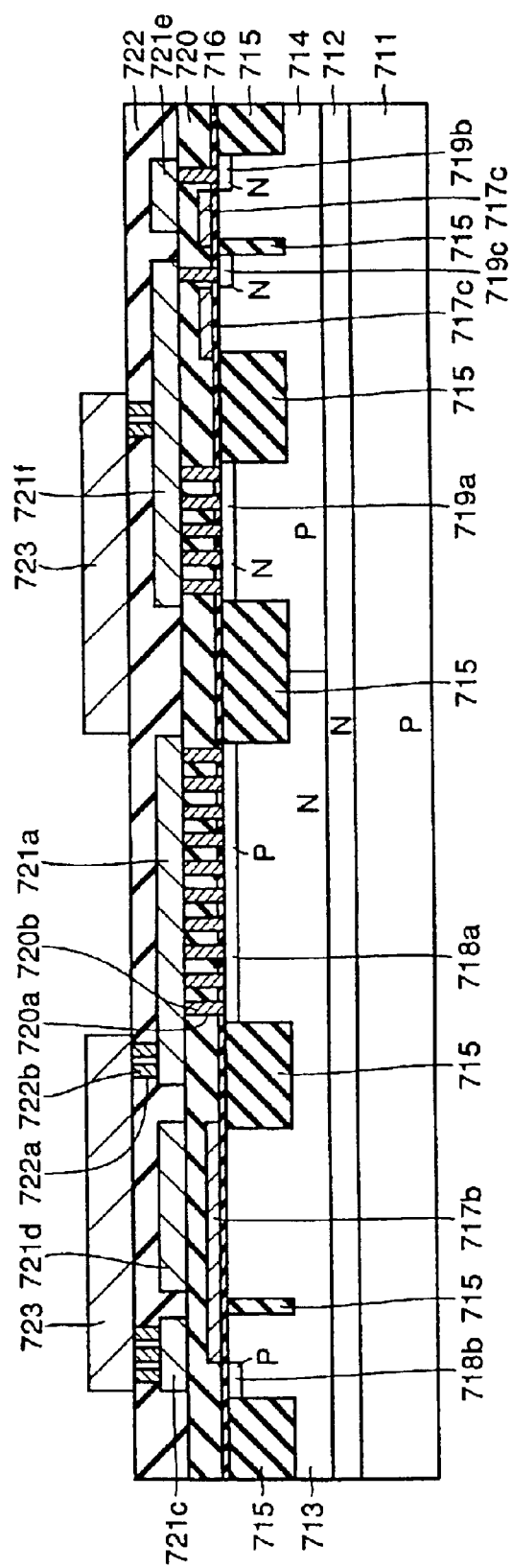

Referring to FIGS. 50 and 58, a conductive layer 723 is formed on the entire surface of interlayer insulating layer 722, and the normal photolithography and etching are applied for patterning. The patterned conductive layer 723 allows conductive layers 721a and 721e electrically connected to source regions of NMOS transistors N1, N3, . . . to be electrically connected, gate electrode layers 717a of the PMOS and NMOS transistors in the one inverter to be electrically connected, and conductive layers 721b and 721c electrically connected to source regions of PMOS transistors P2, P4 . . . to be electrically connected.

Figure 51:
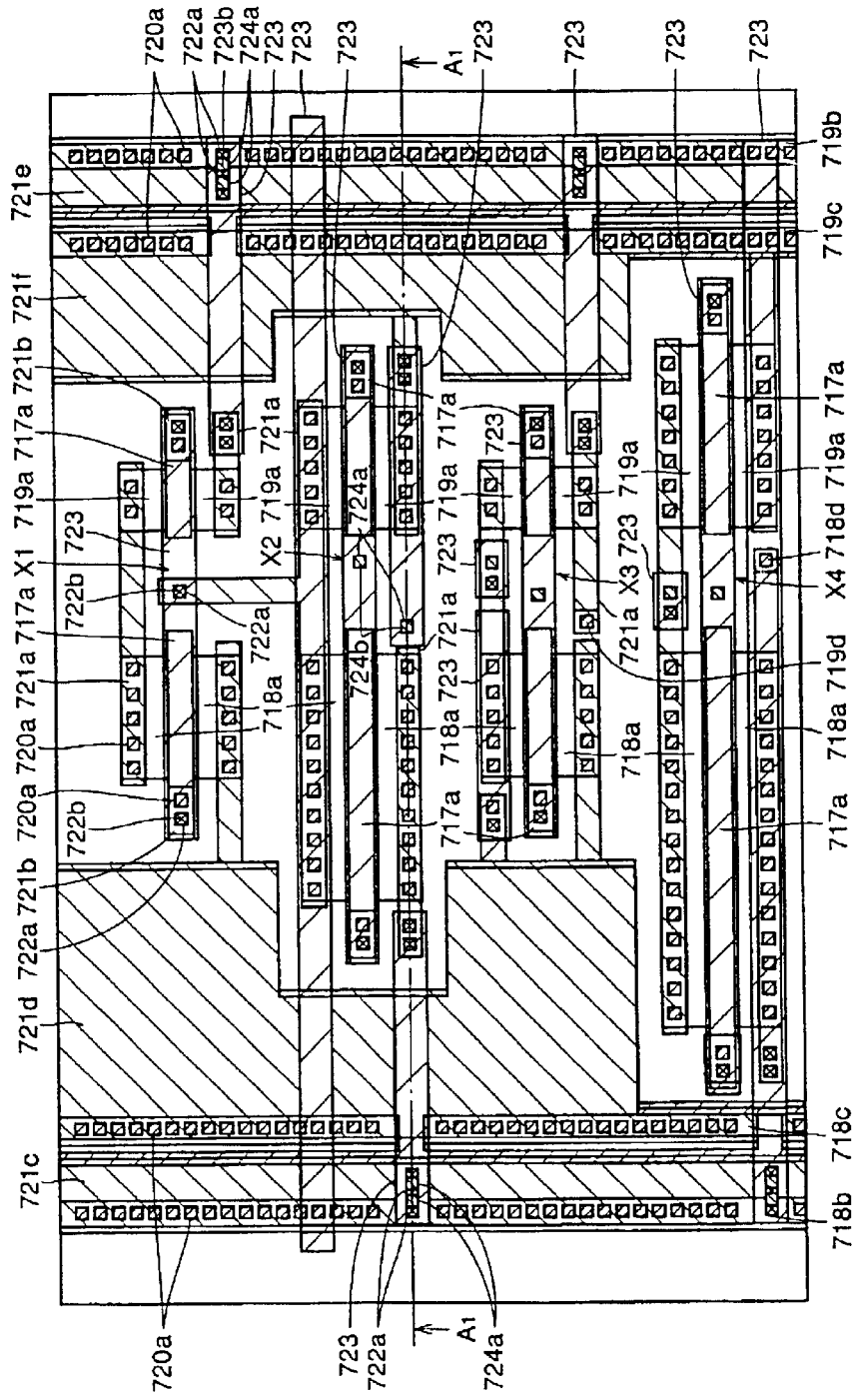
Figure 59:
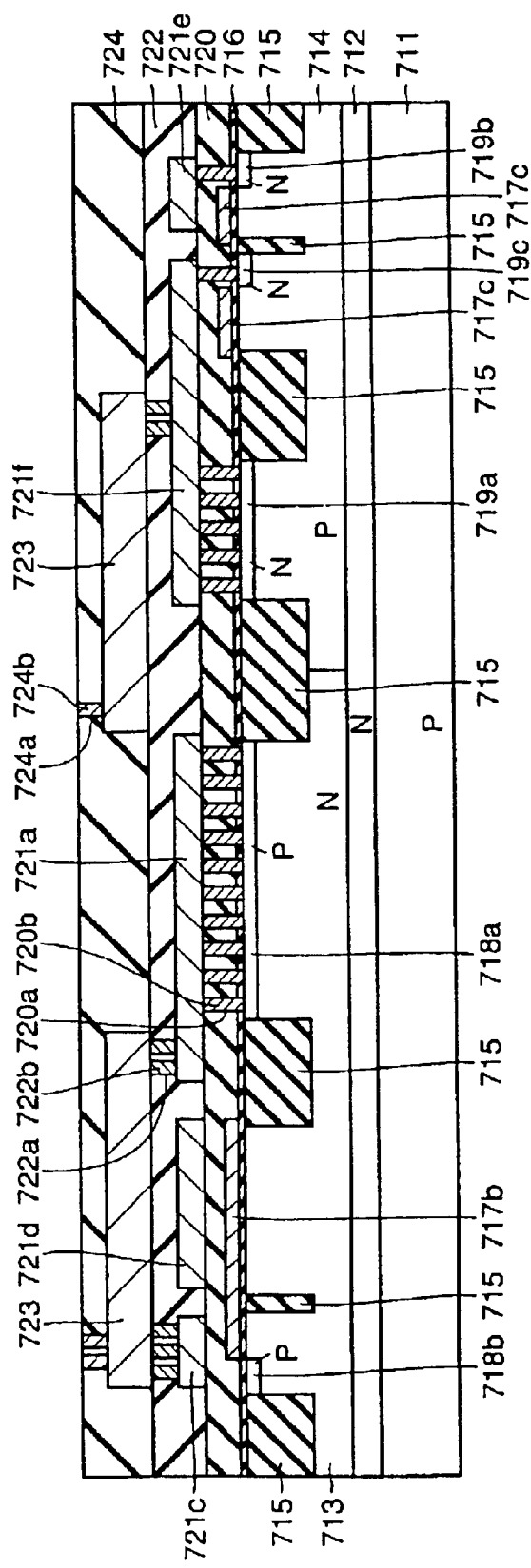

Referring to FIGS. 51 and 59, an interlayer insulating layer 724 formed of, for example, a silicon oxide film is formed to cover conductive layer 723. A plurality of contact holes 724a reaching the surface of conductive layer 723 are formed at interlayer insulating layer 724, and conductive layer 724b fills the plurality of contact holes 724a.

Referring to FIGS. 42 and 43, a conductive layer 725 is formed on the entire surface of interlayer insulating layer 724, and patterned by the normal photolithography and etching. As a result, conductive layer 725 electrically connected to source regions of PMOS transistors P2, P4, conductive layer 725 electrically connected to source regions of NMOS transistors N1, N3, . . . , and conductive layer 725 electrically connecting gate electrode layers 717a of PMOS transistor Pn and NMOS transistor Nn, and drain regions of PMOS transistor Pn+1 and NMOS transistor Nn+1 are formed.

The layout of the hierarchical power supply system of this embodiment is accordingly completed.

The layout of a basic cell is next described using FIGS. 60–63.

Figure 60:
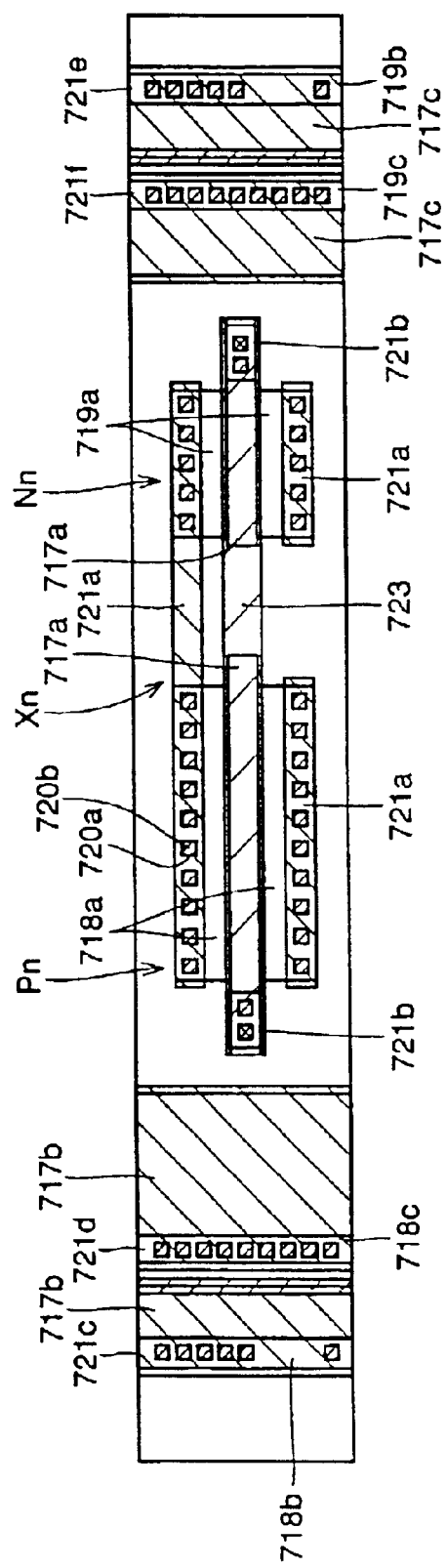
FIG. 60 is a plan view illustrating a structure of an inverter.

An inverter is formed of two transistors that are a PMOS transistor and an NMOS transistor, and two transistors Pn and Nn shown in FIG. 60 are arranged to form the inverter.

Figure 61:
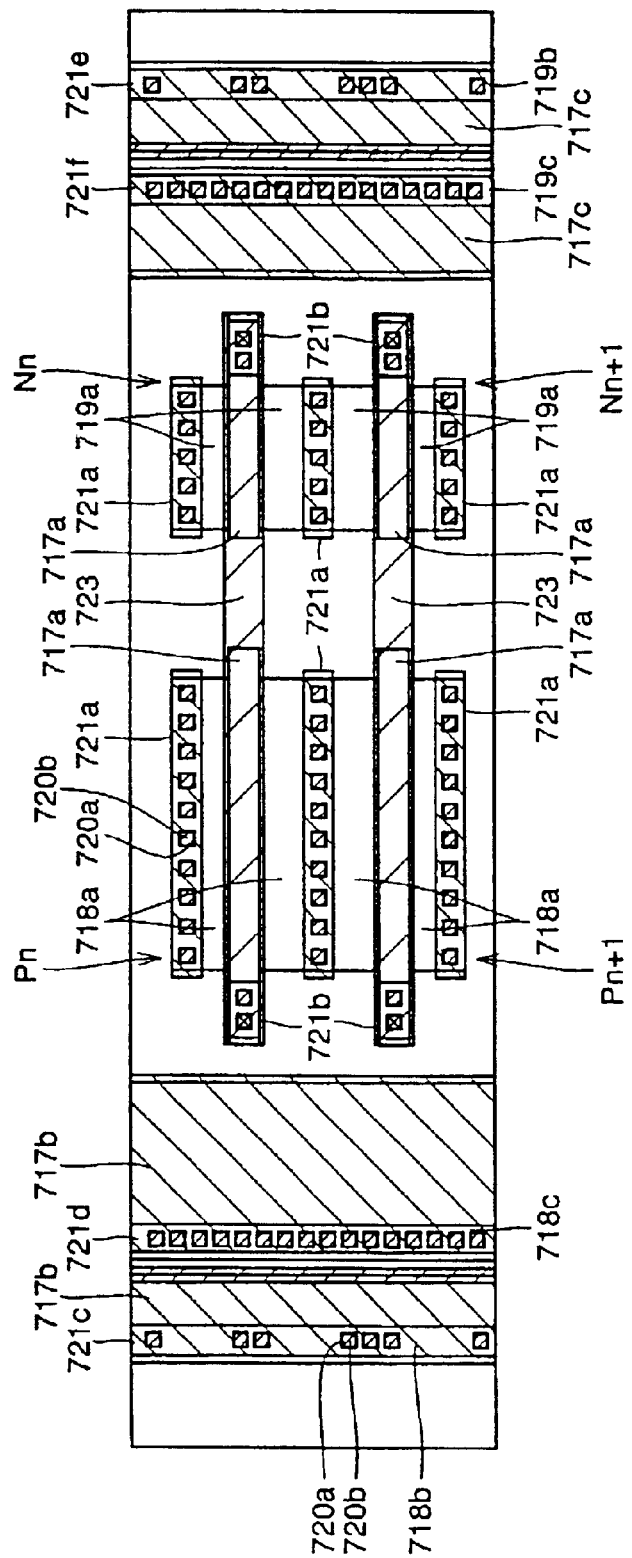
FIG. 61 is a plan view illustrating a structure of an NAND circuit or an NOR circuit.

Both of the NAND circuit and the NOR circuit can be constituted of four transistors that are two PMOS transistors and two NAND transistors. As shown in FIG. 61, four transistors Pn, Pn+1, Nn, Nn+1 are arranged.

Those components of FIGS. 60 and 61 that are identical to or corresponding to components illustrated in FIGS. 42–59 have the same reference characters as those of the components of FIGS. 42–59.

Figure 62:
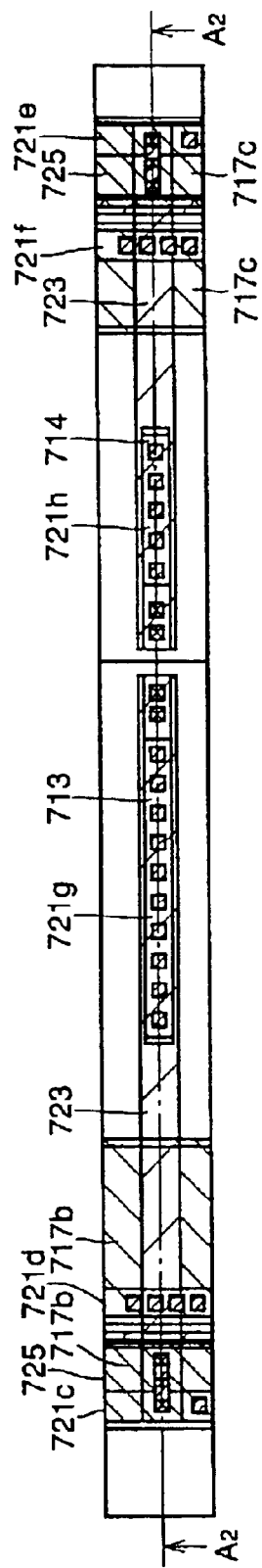
FIG. 62 is a plan view illustrating a structure of a well-fixed cell.
Figure 63:
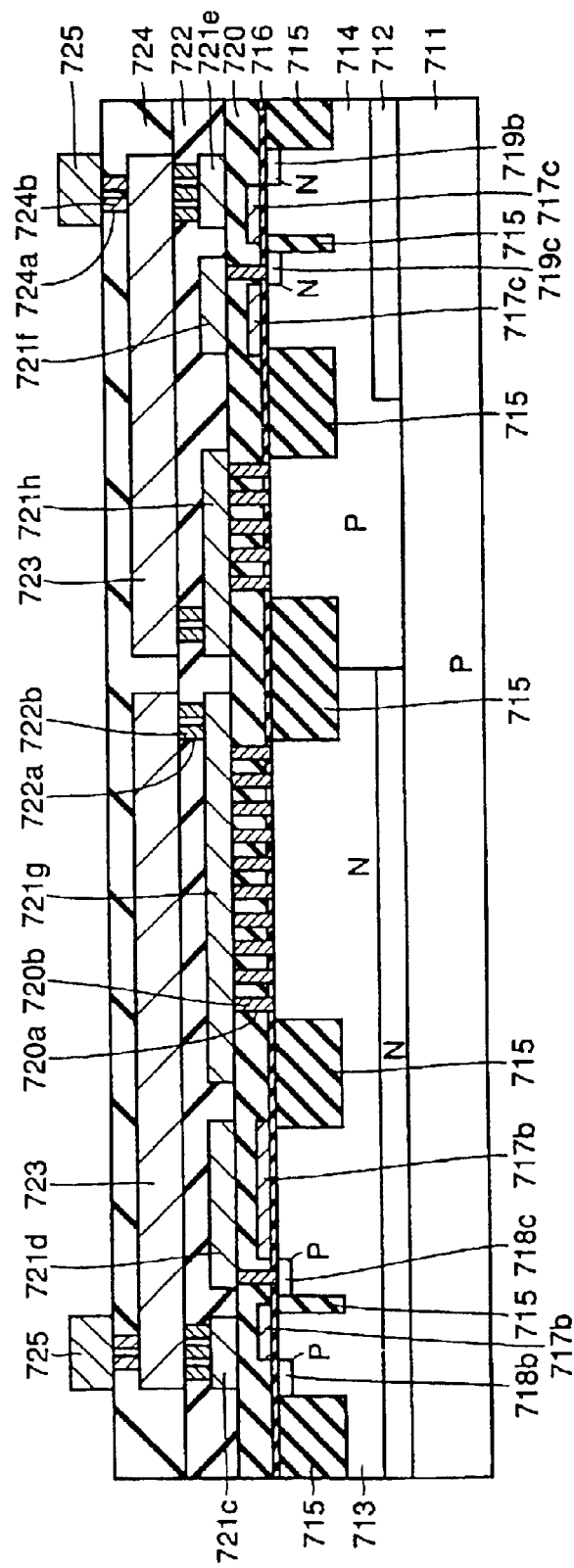
FIG. 63 is a schematic cross-sectional view along line $A_2$—$A_2$ of FIG. 62.

Referring to FIGS. 62 and 63, well-fixed cells are arranged with appropriate spaces in the inverters shown in FIGS. 42–59. In the well-fixed cell, P-type well 714 is fixed at Vss potential by electrically connecting it to conductive layers 721h, 723, 721e and the like. N-type well region 713 is fixed at Vcc potential by electrically connecting it to conductive layers 721g, 723, 721c and the like.

N-type bottom layer 712 is partially removed to allow P-type well 714 to be indirect contact with P-type substrate region 711. The potential of P-type substrate region 711 is also fixed at Vss potential. It is noted that those of the components illustrated in FIGS. 62 and 63 that are identical or corresponding to those illustrated in FIGS. 42–59 have the same reference characters as those of the components in FIGS. 42–59.

Figure 64:
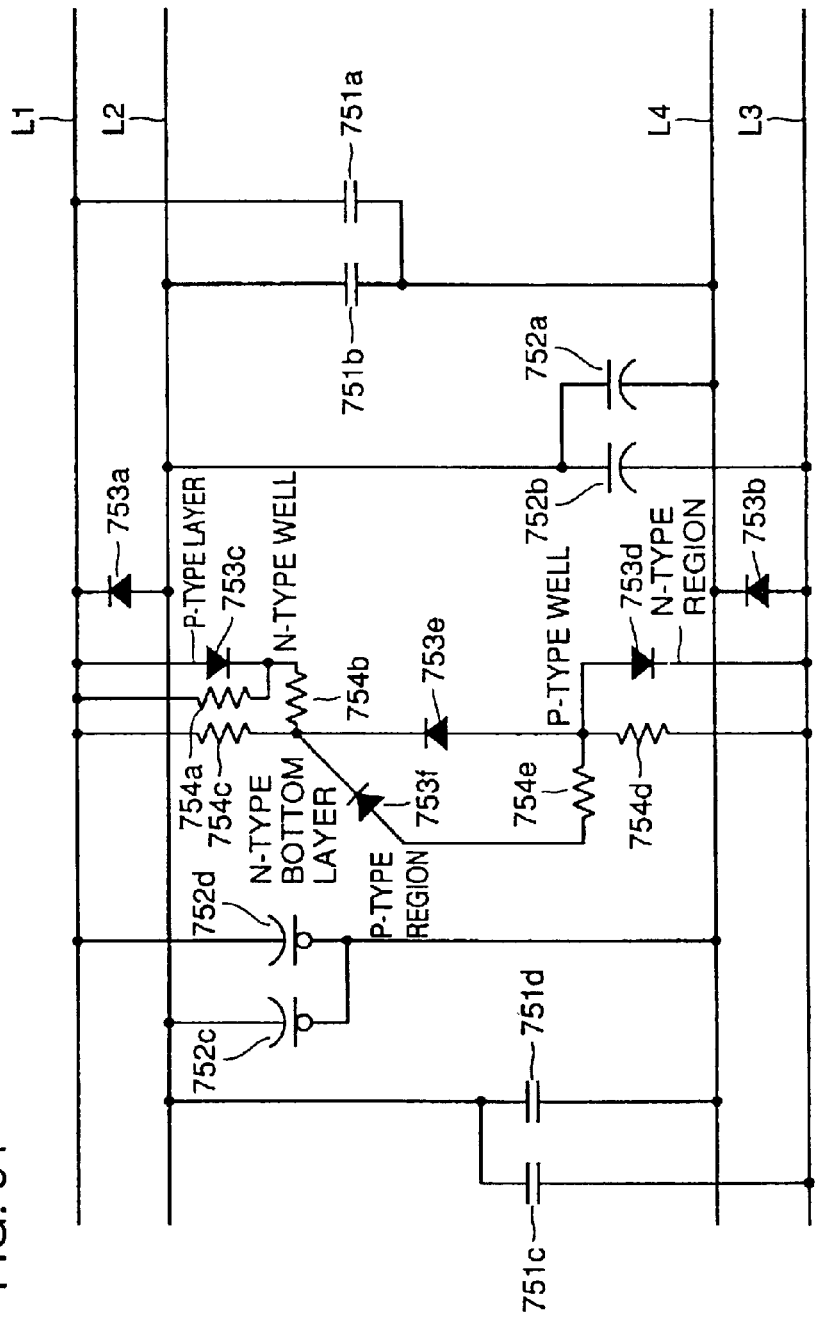
FIG. 64 illustrates the structure shown in FIGS. 42 and 43 with capacitor components.

The relation between the structure of FIGS. 42 and 43 and the structure of FIG. 64 is described below.

Referring to FIGS. 42, 43 and 64, a capacitor 751a is formed between dummy gate 717b and conductive layer 721c, and a capacitor 751b is formed between dummy gate 717b and conductive layer 721d. A capacitor 751c is formed between dummy gate 717c and conductive layer 721e, and a capacitor 751d is formed between dummy gate 717c and conductive layer 721f.

An MOS capacitor 752a is formed by a parasitic MOS transistor constituted of N-type layer 719c, N-type source/drain region 719a and dummy gate 717c. An MOS capacitor 752b is formed by a parasitic MOS transistor constituted of N-type layers 719b and 719c, and dummy gate 717c. An MOS capacitor 752c is formed by a parasitic MOS transistor constituted of P-type layer 718c, P-type source/drain region 718a and dummy gate 721d. An MOS capacitor 752d is formed by a parasitic MOS transistor constituted of P-type layers 718b and 718c, and dummy gate 717b.

A diode 753a is formed since N-type well 713 has main Vcc when P-type source region 718a of the PMOS transistor has sub-Vcc. A diode 753b is formed since P-type well 714 has main Vss when N-type source region 719a of the NMOS transistor has sub-Vss. A diode 753c is formed between P-type layer 718b and N-type well 713. A diode 753d is formed between N-type layer 719b and P-type well 714. Diode 753e is formed between N-type well 713 and P-type well 714. A diode 753f is formed between N-type bottom region 712 and P-type substrate region 711.

Resistors 754a–754e represent contact resistors.

As clearly seen by FIG. 64, main Vss is supplied to P-type substrate region 711, P-type well 714 and N-type layer 719b, and sub-Vss is supplied to N-type source region 719a and N-type layer 719c in FIG. 43. Main Vcc is supplied to N-type bottom layer 712, N-type well 713 and P-type layer 718b, and sub-Vcc is supplied to P-type source region 718a and P-type layer 718c.

According to this embodiment, conductive layer 721c receiving main Vcc, conductive layer 721d receiving sub-Vcc, conductive layer 721e receiving main Vss, and conductive layer 72 if receiving sub-Vss are respectively connected to P-type layers 718b and 718c, and N-type layers 719b and 719c electrically (see FIG. 48). Conductive layer 721c receiving main Vcc is electrically connected to N-type well 713, and conductive layer 721e receiving main Vss is electrically connected to P-type well 714 (see FIG. 62).

Accordingly, a number of junction capacitances (capacitances at diodes 753a–753f) are formed between power supply lines L1 and L2 and ground lines L3 and L4 as illustrated in FIG. 64, and decoupling capacitors of respective power supply lines are thus formed. A plurality of capacitors of the power supply lines thus distributed enables the power supply drop generated with circuit operation to be reduced.

According to this embodiment, a plurality of gate capacitors 751a–751d, 752a–752d are formed between power supply lines L1, L2 and ground lines L3, L4 as illustrated in FIG. 64 to constitute decoupling capacitors of respective power supply lines. A plurality of capacitors of power supply lines thus distributed enables the power supply drop generated with the circuit operation to be reduced.

The main power supply line, together with the sub-power supply line, forms the junction capacitance. The main power supply and the sub-power supply function as a decoupling capacitor since the components of interconnection resistance of main and sub-power supply lines are different from each other and accordingly the phases relative to the noise are different. When the capacitor is formed by the same potential, the maximum capacitance is obtained.

According to this embodiment, the relation of the junction capacitance may be the one between Vss and Vcc.

(1) The necessity of dummy active layers (P-type layers 718b, 718c, N-type layers 719b, 719c), (2) the necessity of dummy gates 717b and 717c, and (3) N-type bottom layer 712 in this embodiment are hereinafter described in detail.

(1) Necessity of Dummy Active Layer

The trench isolation is formed by forming a deep trench on the substrate and burying an insulating film in the trench. When the insulating film is to be buried, the film is deposited on the entire surface of the substrate and cut in the CMP (Chemical Mechanical Polishing) process according to the height of the trench from the upper surface such that the film remains only in the trench portion. In this process, any portion other than the active region is recognized as the trench. Therefore, if there is no active region except for the active region of the transistor, a large trench exists in the region without the transistor. In this case, if the insulating film deposited at the portion of this trench is cut by the CMP, a relatively large portion is cut compared with the normal trench portion, so that the thickness of the insulating film becomes smaller and the isolation characteristic of the trench deteriorates. The trench is desirably divided with an appropriate space or less, and desirably the trench isolation region does not continue with a dimension of 100 μm or more. The dummy active layer is accordingly necessary.

Reference is made here to the circuit portion of the hierarchical power supply. However, considering the entire chip, the dummy active layer is arranged at any portion other than the circuit portion.

(2) Necessity of Dummy Gate

As the gate is further miniaturized, the characteristic of exposure causes diffraction of light, and the finished gate has different dimensions (width, length) depending on a variety of layouts such as the arrangement (two dimensional) of gate interconnection lines, bending portion, constricted portion, and the like. If the gate of transistors are finished with different gate lengths and gate widths, the performance of the transistors becomes different, leading to inconsistency with the result of simulation.

In order to uniformly finish the gate of the transistor, gates adjacent to each other appropriately are arranged. For example, preferably there is no space of 3 μm or more from the gate of the transistor In order to accomplish this, the dummy gate is necessary.

In FIG. 42, the gates of the transistors are surrounded by the dummy gates. Considering the entire chip, there is a number of regions where the dummy gates cannot be arranged (such as redundancy programming region of laser blow). However, if the transistor region is surrounded by the dummy gate, a buffering region is produced and the stability of the finished gate of the transistor improves. Of course if the number of dummy gate region is doubled or tripled, the stability further improves.

(3) N-Type Bottom Layer 712

N-type bottom layer 712 extends not only below N-type well 713 but below P-type well 714. Under N-type well 713, a junction capacitance relative to P-type substrate region 711 is provided. The junction capacitance per unit area can be increased by burying N-type bottom layer 712 having a higher concentration.

It is not necessary to separate P-type well 714 from P-type substrate region 712 by N-type bottom layer 712 since they have the same potential. If N-type bottom layer 712 is intentionally arranged, a junction capacitance is formed between N-type bottom layer 712 and P-type region (P-type substrate region 711 and P-type well 714).

In order to reduce the resistance of N-type bottom layer 712 to make it function as a capacitor of the power supply, shunts are provided relative to the power supply line at several points. Further, in order to decrease resistance between P-type well 714 and P-type substrate region 711, portions where no N-type bottom layer 712 is present are provided at several portions to shunt P-type well 714 and P-type substrate region 711.

Figure 65:
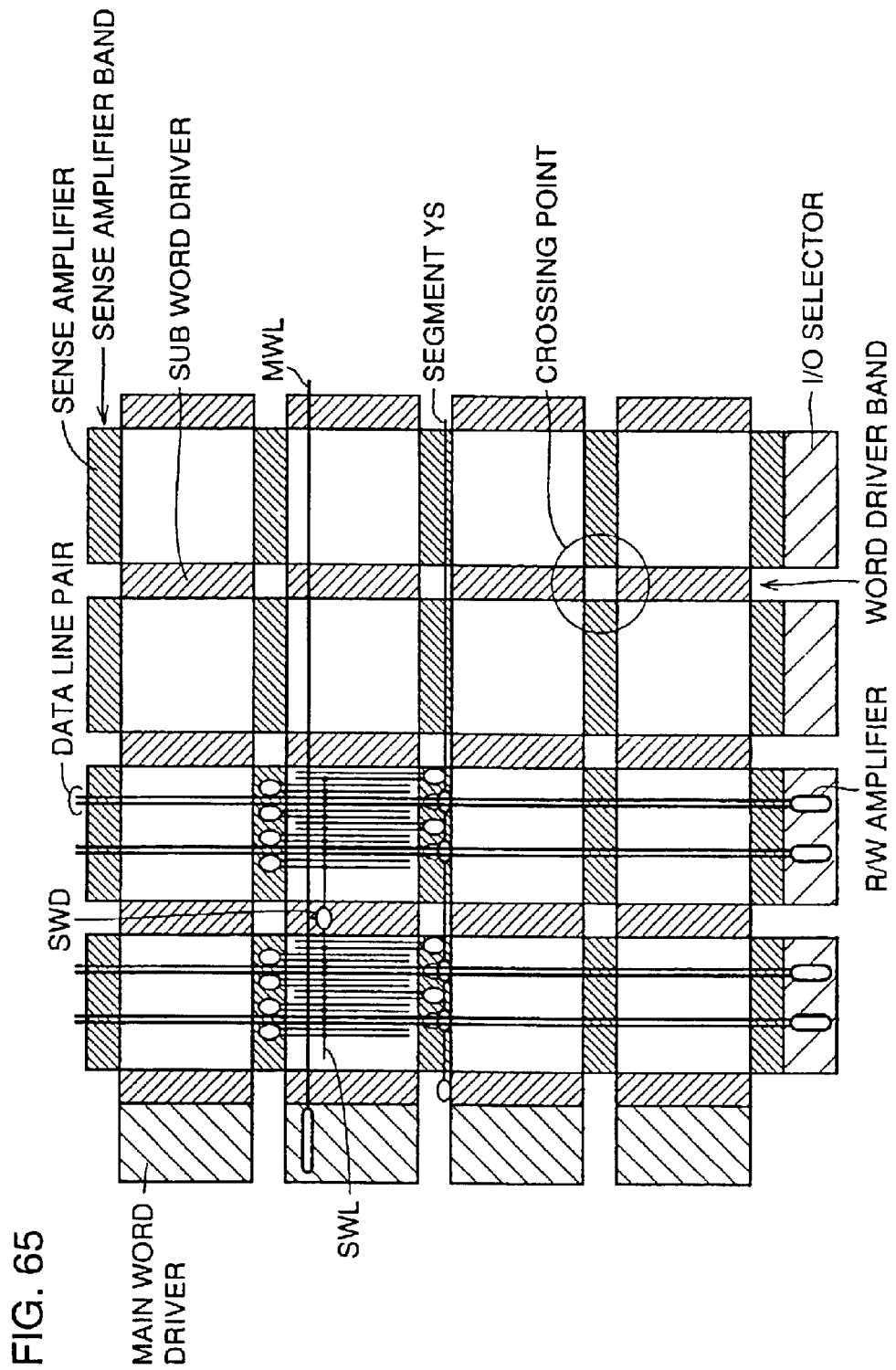
FIG. 65 illustrates a typical array structure.

In an array of a DRAM (Dynamic Random Access Memory) illustrated in FIG. 65, the structure identical to that of FIGS. 42 and 43 is employed at a crossing point of a sense amplifier band and a word driver band to increase the decoupling capacitor. Accordingly, the power supply drop can be reduced even if a large amount of current is consumed in the sense operation.

The array of the typical DRAM is described below.

Referring to FIG. 65, a memory cell array is finely divided into memory cell array units surrounded by the sense amplifier band and the word diver band.

A main word line MWL is arranged across memory cell array units and activates a sub-word driver SWD which should be activated. In response to activation of sub-word driver SWD, a corresponding sub-word line SWL is activated. Sense amplifiers are alternately arranged with the memory cell array units therebetween. A sense amplifier located in a region where a selected line of a region (bank) to be activated and a sense selection line are crossed is activated.

A segment YS line is arranged to cross the sense amplifier band in the word line direction of the memory cell array units.

In order to read data from the memory cell array units, segment YS is activated and the region where segment YS and the bank selection line of the region to be activated crosses is activated. A piece of data per four sense amplifiers is read from the activated region (bank).

The read data are transmitted to a read/write amplifier (hereinafter referred to as R/W amplifier) through a data line pair running in a direction orthogonal to the word line on the memory cell array. The data are transmitted to a data output portion over peripheral circuitry via a data bus region. If memory and logic are mixed on the chip, the data are transmitted to the logic portion via the data bus region.

Figure 66:
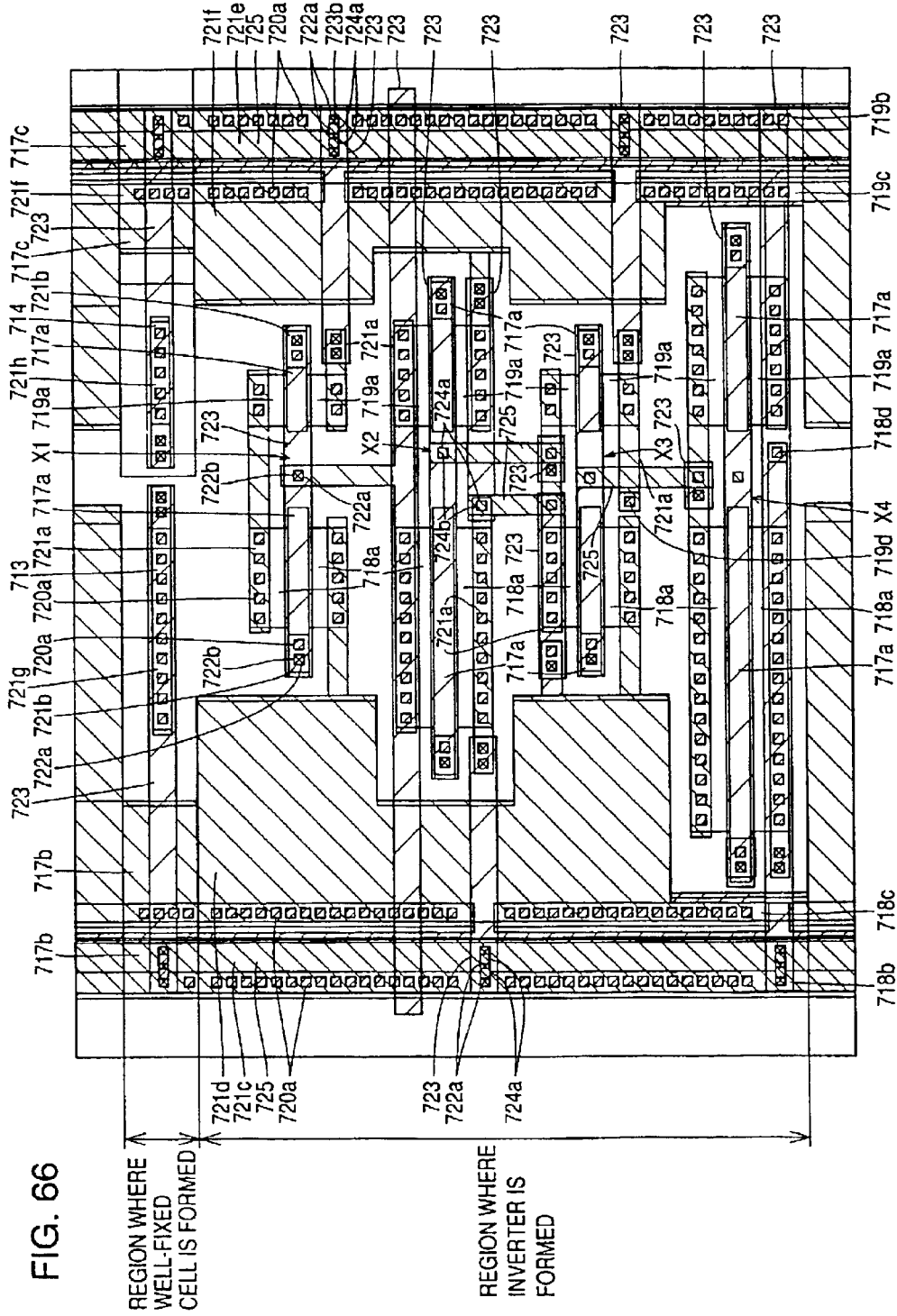
FIG. 66 is a plan view illustrating a structure where dummy gates cover the periphery of the circuit.
Figure 67:
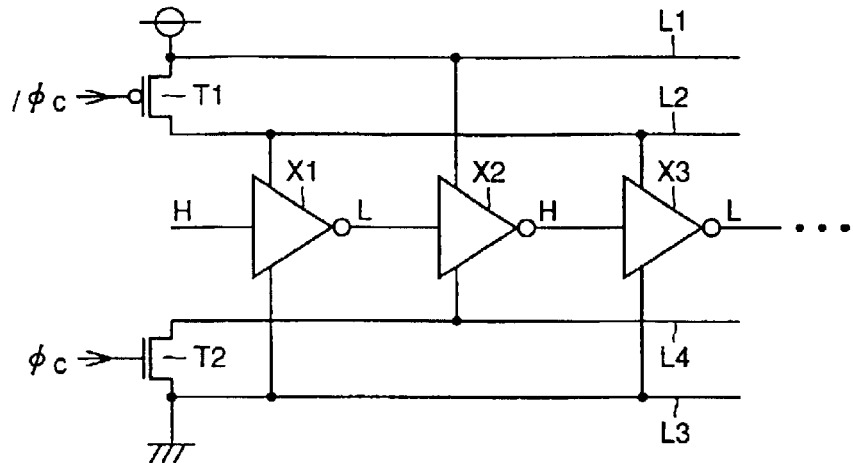
FIG. 67 illustrates a structure of a conventional hierarchical power supply system.
Figure 68:
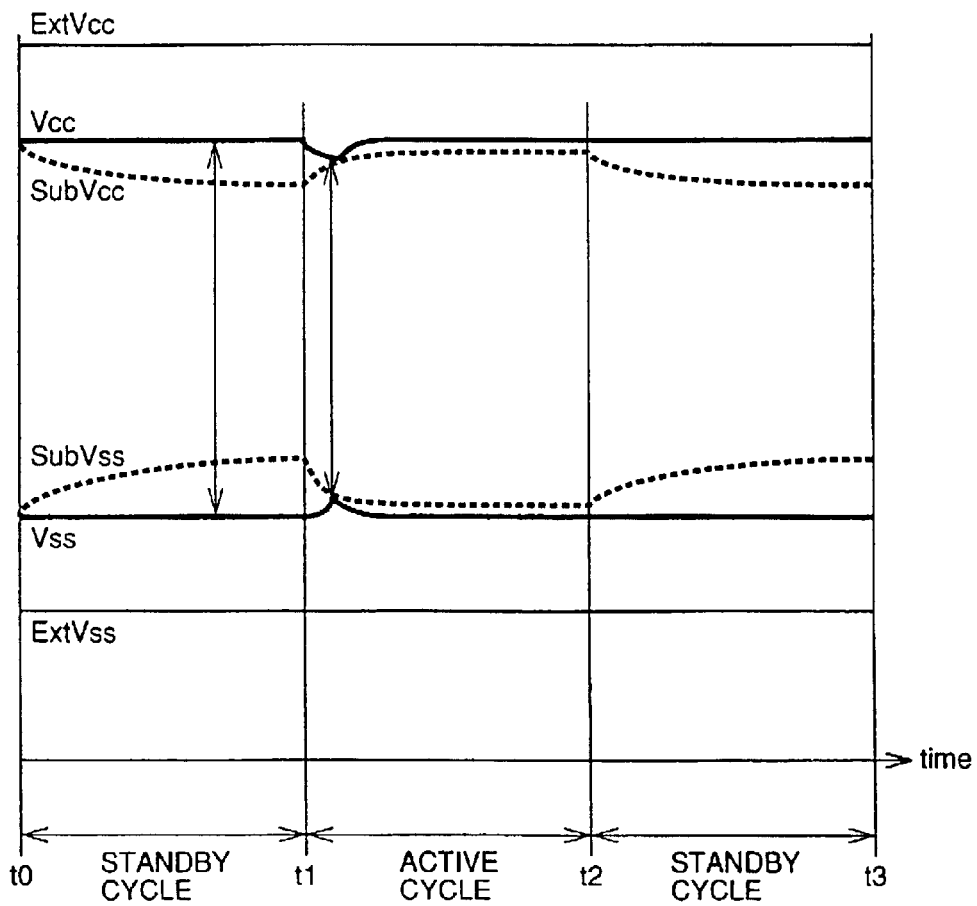
FIG. 68 is a timing chart showing change of the power supply potential in the conventional hierarchical power supply system shown in FIG. 67.
Figure 69:
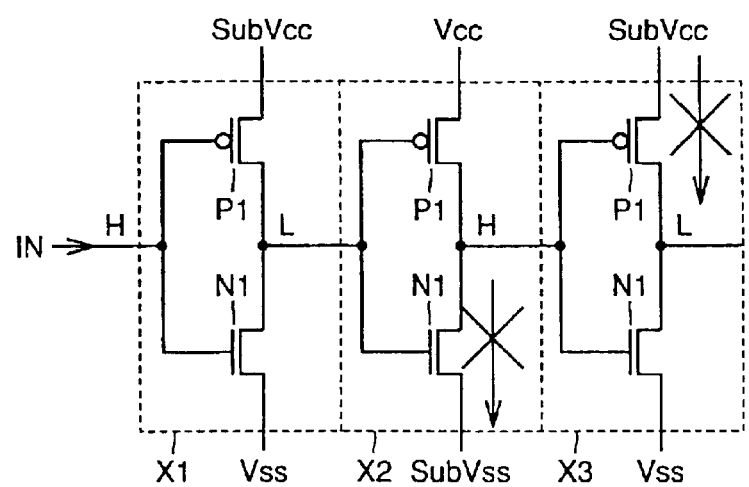
FIG. 69 illustrates a standby cycle in the conventional hierarchical power supply system shown in FIG. 67.

One example of the layout at the crossing point of FIG. 65 is illustrated in FIG. 66.

Referring to FIG. 66, in the example of the layout at the crossing point, dummy active layers 718c and 719c and dummy gates 717b and 717c are formed to surround an inverter formation region and a well-fixed cell formation region.

The portion other than that described above is nearly identical to the structures of FIGS. 42, 43, 62 and 63, and the same component have the same reference character and description thereof is omitted.

In the structure illustrated in FIG. 66, N-type bottom layer 712 is partially removed in the well-fixed cell portion, and P-type well 714 and P-type substrate region 711 are directly connected. The decoupling capacitor becomes more effective by fixing the potential from P-type substrate region 711.

Although description is given by using the capacitor related to the junction portion and the gate capacitor according to this embodiment, a capacitor between interconnection lines of polycrystal silicon and metal interconnection lines such as aluminum and copper may be utilized to employ as the power supply interconnection capacitor of this embodiment.

Although the dummy provided for the active region and the gate interconnection is employed in this embodiment, a similar dummy may be arranged for other interconnection lines. In this case, potential may be supplied to the dummy to be utilized as a capacitor between other interconnection lines.

Although the region of the dummy is utilized as the capacitor in this embodiment, the region may be utilized as shield by supplying potential to it. Supply of potential to the dummy region is important in the embodiment, the layer supplied with the potential may be utilized as the capacitor or as the shield.

Although the inverter is employed for convenience of description in this embodiment, what is utilized as a circuit is not limited to the inverter and any circuit element may be employed.

Figure 70:
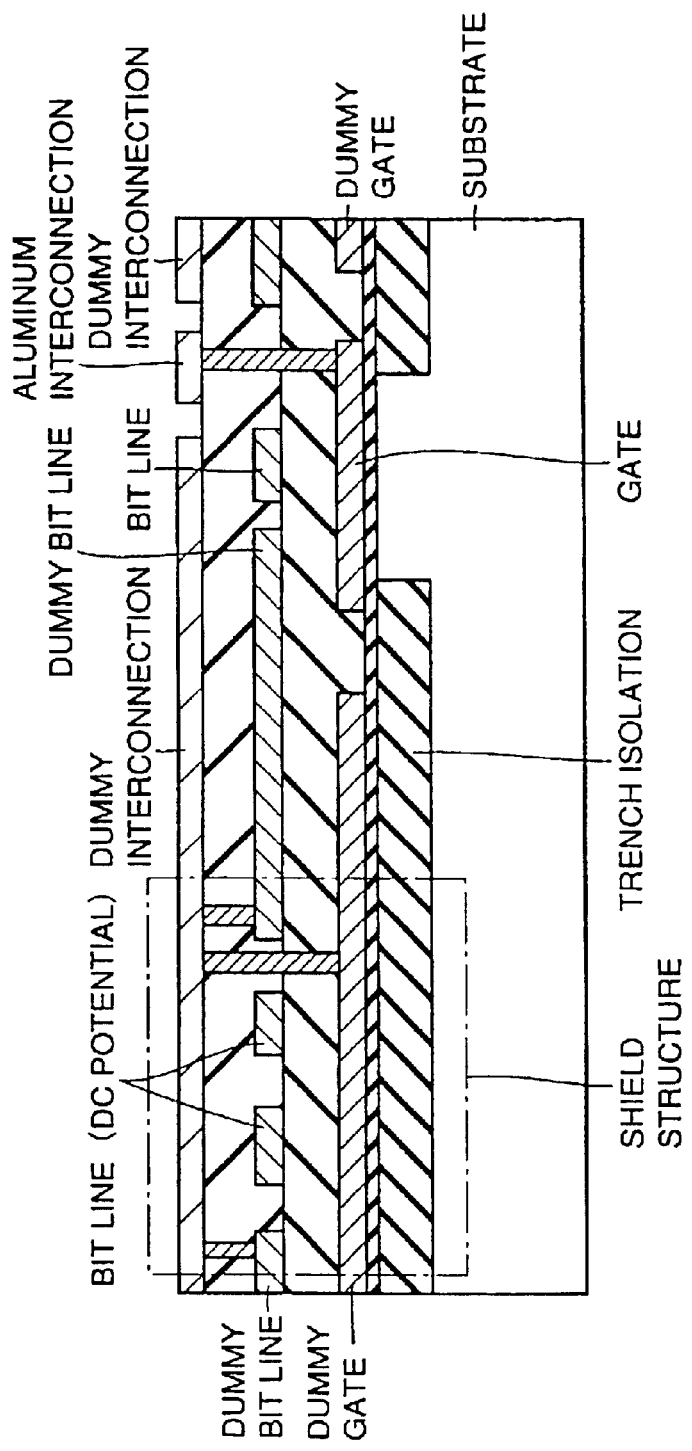
FIG. 70 is a cross-sectional view illustrating dummy components arranged around bit lines of a DRAM.

Further, the dummy may be applied to the structure shown in FIG. 70.

Referring to FIG. 70, if a layer of a bit line of a DRAM is utilized as interconnection, especially as interconnection for supplying high-precision DC potential, the influence of noises on the circuit elements is a problem. In this case, shield may be provided by arranging a dummy bit line around a bit line interconnection and a bit line used for the circuit portion, and covering the bit line interconnection with a dummy of a gate interconnection layer at a lower layer of the bit line and a dummy of an aluminum interconnection layer at a higher layer of the bit line.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device having a logic gate, comprising:

a semiconductor substrate;

a plurality of first active regions formed on said semiconductor substrate, each constituting a source/drain of a transistor forming said logic gate;

a second active region formed on said semiconductor substrate to be located at either side of a periphery of said plurality of first active regions; and an insulating region formed on said semiconductor resistance insulating respective ones of said plurality of first active regions and said second active region from one another; wherein at least any of said plurality of first active regions has a difference in length in the longitudinal direction perpendicular to the side of said second active region, and said second active region has a portion opposing any of said plurality of first active regions having a shorter length in the longitudinal direction, said portion projecting to be in a close proximity to said first active region having the shorter length.

2. The semiconductor integrated circuit device according to claim 1, wherein
said projecting portion of said second active region extending into a region between ones of said plurality of first active regions each having a longer length in the longitudinal direction.

3. The semiconductor integrated circuit device according to claim 1, further comprising:
a gate insulating film formed on at least a portion of said second active region; and
a gate electrode formed on said gate insulating film.

4. The semiconductor integrated circuit device according to claim 3, wherein
said second active region, said gate insulating film formed on said second active film, and said gate electrode formed on said gate insulating film constitute an MOS configuration.

5. The semiconductor integrated circuit device according to claim 4, wherein
said gate electrode and said second active region constituting said MOS configuration are electrically connected to a first power supply and a second power supply, respectively.

6. The semiconductor integrated circuit device according to claim 5, wherein
said gate electrode and said second active region functioning decoupling capacitance of a power supply.

7. The semiconductor integrated circuit device according to claim 6, further comprising a memory array, wherein
said decoupling capacitance is formed in a circuit arrangement in said memory array.

8. The semiconductor integrated circuit device according to claim 6, further comprising a circuit portion constituting a hierarchical power supply line, wherein
said decoupling capacitance is formed in a logic gate portion of said circuit portion.

9. A semiconductor integrated circuit device having a logic gate comprising:
a semiconductor substrate;
a plurality of first active regions formed on said semiconductor substrate each constituting a source/drain of a transistor farming said logic gate;
a second active region formed on said semiconductor substrate to be located at either side of a periphery of said plurality of first active regions; and
an insulating region formed on said semiconductor substrate insulating respective ones of said plurality of first active regions and said second active region from one another;
a gate insulating film formed on said first and second active regions and said insulating region;
a plurality of first gate wirings formed on said gate insulating film to correspond to said plurality of first active regions, each constituting a gate of said transistor; and
a second gate wiring formed on said gate insulating film to correspond to said second active region, wherein
at least any of said plurality of first gate wirings has a difference in length in the longitudinal direction perpendicular to the side of said second gate wiring, and said second gate wiring has a portion opposing any of said plurality of first gate wirings having a shorter length in the longitudinal direction, said portion projecting to be in close proximity to said first gate wiring having at the shorter length.

10. The semiconductor integrated circuit device according to claim 9, wherein
said projecting portion of said second gate wiring extending into a region between ones of said plurality of first gate wirings each having a longer length in the longitudinal direction.

11. The semiconductor integrated circuit device according to claim 9, wherein
said second gate wiring and said second active region are electrically connected to a first power supply and a second power supply, respectively.

12. The semiconductor integrated circuit device according to claim 9, further comprising a power supply line formed at an upper layer on said second gate wiring, said power supply line being from a power supply different from said first power supply, wherein
said second gate wiring and said power supply line constitute a parallel plate capacitor.

13. A semiconductor integrated circuit device having a logic gate, comprising:
a semiconductor substrate;
a plurality of active regions formed on said semiconductor substrate, each constituting a source/drain of a transistor forming said logic gate, said plurality of active regions including an active region of a first conductivity type and an active region of a second conductivity type; and
an insulating region formed on said semiconductor substrate insulating respective ones of said plurality of active regions from one another, wherein
a well of said first conductivity type is formed in the portion under said active region of said second conductivity type.

* * * * *